(12) United States Patent
Lee et al.

(10) Patent No.: US 12,456,719 B2
(45) Date of Patent: Oct. 28, 2025

(54) DISPLAY APPARATUS

(71) Applicant: Samsung Display Co., Ltd, Yongin-si (KR)

(72) Inventors: Sunhwa Lee, Yongin-si (KR); Heejean Park, Yongin-si (KR); Mukyung Jeon, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 18/922,707

(22) Filed: Oct. 22, 2024

(65) Prior Publication Data

US 2025/0132298 A1 Apr. 24, 2025

(30) Foreign Application Priority Data

Oct. 23, 2023 (KR) .................. 10-2023-0142432

(51) Int. Cl.
*G09G 3/00* (2006.01)
*H01L 25/16* (2023.01)
(Continued)

(52) U.S. Cl.
CPC ........... *H01L 25/167* (2013.01); *G09G 3/035* (2020.08); *H10D 86/441* (2025.01); *H10D 86/60* (2025.01);
(Continued)

(58) Field of Classification Search
CPC .. A43B 17/00; A43B 3/34; A43B 3/44; A43B 3/48; A61B 2560/0214; A61B 5/01;
(Continued)

(56) References Cited

U.S. PATENT DOCUMENTS 11,108,005 B2  8/2021  Sun et al.
11,751,459 B2  9/2023  Kim et al.
(Continued)

FOREIGN PATENT DOCUMENTS

CN    112669739 A    4/2021
CN    114664245 B    11/2022
(Continued)

OTHER PUBLICATIONS

International Search Report mailed Jan. 20, 2025 in PCT/KR2024/016013, 9 pages.

*Primary Examiner* — Insa Sadio
(74) *Attorney, Agent, or Firm* — CANTOR COLBURN LLP

(57) ABSTRACT

A display apparatus includes a substrate including a driver island portion, a wiring island portion, and a bridge portion. The driver island portion and the wiring island portion are spaced apart from each other in a first direction, and the bridge portion connects the driver island portion to the wiring island portion, a gate driving circuit disposed in the driver island portion, an electrostatic discharge prevention circuit disposed in the driver island portion, and a plurality of first input lines arranged in the wiring island portion and extending in a second direction crossing the first direction. The plurality of first input lines includes a start signal line, and the start signal line is electrically connected to the electrostatic discharge prevention circuit.

22 Claims, 32 Drawing Sheets

(51) Int. Cl.
  *H10D 86/40*  (2025.01)
  *H10D 86/60*  (2025.01)
  *H10K 59/131*  (2023.01)
  *H10K 59/88*  (2023.01)
  *H10K 77/10*  (2023.01)
  *G09G 3/32*  (2016.01)
  *G09G 3/3233*  (2016.01)
  *H10K 102/00*  (2023.01)

(52) U.S. Cl.
  CPC ........... *H10K 59/131* (2023.02); *H10K 59/88* (2023.02); *H10K 77/111* (2023.02); *G09G 3/32* (2013.01); *G09G 3/3233* (2013.01); *G09G 2300/0426* (2013.01); *G09G 2300/0819* (2013.01); *G09G 2330/04* (2013.01); *G09G 2380/08* (2013.01); *G09G 2380/10* (2013.01); *H10K 2102/311* (2023.02)

(58) Field of Classification Search
  CPC ... A61B 5/0205; A61B 5/1038; A61B 5/1118; A61B 5/112; A61B 5/318; A61B 5/389; A61B 5/6807; A61B 5/6829; H01R 13/6205; H02J 2310/23; H02J 50/005; H02J 50/05; H02J 50/10; H02J 50/12; H02J 50/80; H02J 50/90
  See application file for complete search history.

(56) References Cited

U.S. PATENT DOCUMENTS

| | | | |
|---|---|---|---|
| 2018/0085069 A1* | 3/2018 | Murali | A61B 5/0205 |
| 2019/0206565 A1* | 7/2019 | Shelton, IV | A61B 90/90 |
| 2021/0057659 A1 | 2/2021 | Sun et al. | |
| 2023/0187451 A1 | 6/2023 | Ham et al. | |
| 2023/0232678 A1 | 7/2023 | Cho et al. | |
| 2023/0247879 A1 | 8/2023 | Cho et al. | |
| 2023/0386392 A1 | 11/2023 | Li et al. | |

FOREIGN PATENT DOCUMENTS

| | | |
|---|---|---|
| CN | 112582382 B | 5/2023 |
| KR | 1020190024117 A | 3/2019 |
| KR | 1020210074627 A | 6/2021 |
| KR | 1020230089962 A | 6/2023 |
| KR | 1020230111703 A | 7/2023 |
| KR | 1020230117011 A | 8/2023 |

* cited by examiner

DISPLAY APPARATUS

This application is based on and claims priority under 35 U.S.C. § 119 to Korean Patent Application No. 10-2023-0142432, filed on Oct. 23, 2023, and all the benefits accruing therefrom under 35 U.S.C. § 119, the content of which in its entirety is herein incorporated by reference.

BACKGROUND

1. Field

Embodiments relate to a display apparatus, e.g., a flexible display apparatus.

2. Description of the Related Art

Along with the development of display apparatus that visually displays various electrical signals, various display apparatuses having excellent characteristics such as thinness, light weight, low power consumption, and the like, are being introduced. As an example, flexible display apparatuses that are foldable or rollable in a roll shape are being developed. Recently, research and development into stretchable display apparatuses that may change into various shapes are actively in progress.

SUMMARY

Embodiments include a display apparatus capable of displaying excellent quality images by efficiently utilizing a space in a non-display area while having improved stretchability. However, such a technical feature is just an example, and the disclosure is not limited thereto.

Additional features will be set forth in part in the description which follows and, in part, will be apparent from the description, or may be learned by practice of the presented embodiments of the disclosure.

In an embodiment of the disclosure, a display apparatus includes a substrate including a driver island portion, a wiring island portion, and a bridge portion, where the driver island portion and the wiring island portion are spaced apart from each other in a first direction, and the bridge portion connects the driver island portion to the wiring island portion, a gate driving circuit disposed in the driver island portion, an electrostatic discharge prevention circuit disposed in the driver island portion, and a plurality of first input lines arranged in the wiring island portion and extending in a second direction crossing the first direction, where the plurality of first input lines includes a start signal line, and the start signal line is electrically connected to the electrostatic discharge prevention circuit.

In an embodiment, the driver island portion and the wiring island portion may be alternately arranged in the first direction, and each of the driver island portion and the wiring island portion may be successively arranged in the second direction.

In an embodiment, the driver island portion may be provided in plural, driver island portions may include a first driver island portion, and the electrostatic discharge prevention circuit may be disposed in the first driver island portion disposed at a forefront end in the second direction among the driver island portions successively arranged in the second direction.

In an embodiment, the gate driving circuit may include a plurality of stages, where a first stage disposed at a forefront end among the plurality of stages may be disposed in the first driver island portion.

In an embodiment, the start signal line may be electrically connected to the first stage.

In an embodiment, the gate driving circuit may include at least one of an emission control driving circuit, a bypass driving circuit, an initialization driving circuit, and a data-write driving circuit.

In an embodiment, the plurality of first input lines may further include a gate-high voltage line and a gate-low voltage line.

In an embodiment, the display apparatus may further include a high-voltage connection line disposed in the bridge portion and connected to the gate-high voltage line, and a low-voltage connection line disposed in the bridge portion and connected to the gate-low voltage line, where the high-voltage connection line may be connected to each of the electrostatic discharge prevention circuit and the gate driving circuit, and the low-voltage connection line may be connected to each of the electrostatic discharge prevention circuit and the gate driving circuit.

In an embodiment, the display apparatus may further include a plurality of second input lines arranged in the driver island portion, where the plurality of second input lines may include at least one of a clock line, a carry line, and a reset signal line.

In an embodiment, the display apparatus may further include, in the second direction, a first dummy island portion disposed at a front end of the driver island portion, and a second dummy island portion disposed at a front end of the wiring island portion.

In an embodiment, the gate-high voltage line and the gate-low voltage line may extend along the second direction in the wiring island portion and the second dummy island portion.

In an embodiment, the start signal line may extend from the wiring island portion to the driver island portion through the second dummy island portion and the first dummy island portion.

In an embodiment, the start signal line disposed in the second dummy island portion may be bent from a portion extending in the second direction to extend toward the first dummy island portion in the first direction, and the start signal line disposed in the first dummy island portion may be bent from a portion extending in the first direction to extend toward the driver island portion in the second direction.

In an embodiment, the display apparatus may further include a first dummy bridge portion connecting the first dummy island portion to the second dummy island portion, a second dummy bridge portion connecting the driver island portion to the first dummy island portion, and a third dummy bridge portion connecting the wiring island portion to the second dummy island portion.

In an embodiment, the bridge portion, the first dummy bridge portion, the second dummy bridge portion, and the third dummy bridge portion may have a serpentine shape.

In an embodiment, the start signal line may be disposed in the first dummy bridge portion, the second dummy bridge portion, and the third dummy bridge portion.

In an embodiment, the display apparatus may further include a first bridge electrode disposed in the second dummy island portion and having two opposite ends connected to the gate-high voltage line, and a second bridge electrode disposed in the second dummy island portion and having two opposite ends connected to the gate-low voltage line, where each of the first bridge electrode and the second bridge electrode may cross the start signal line and be disposed in a layer different from a layer in which the start signal line is disposed.

In an embodiment, the display apparatus may further include a start signal connection line electrically connecting the start signal line to the electrostatic discharge prevention circuit, where the start signal connection line may extend through the bridge portion.

In an embodiment, the start signal connection line may include a first portion disposed in the wiring island portion and crossing the gate-high voltage line and the gate-low voltage line, and a second portion disposed in the bridge portion.

In an embodiment, the start signal line and the first portion may be disposed in different layers from each other, and the start signal line and the second portion may be disposed on substantially a same layer.

In an embodiment, the start signal line may be electrically connected to the first portion through a first contact hole, and the first portion may be electrically connected to the second portion through a second contact hole.

In an embodiment, the display apparatus may further include an output line disposed in the bridge portion and connected to the gate driving circuit, where the output line and the start signal connection line may be disposed on substantially a same layer in the bridge portion.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
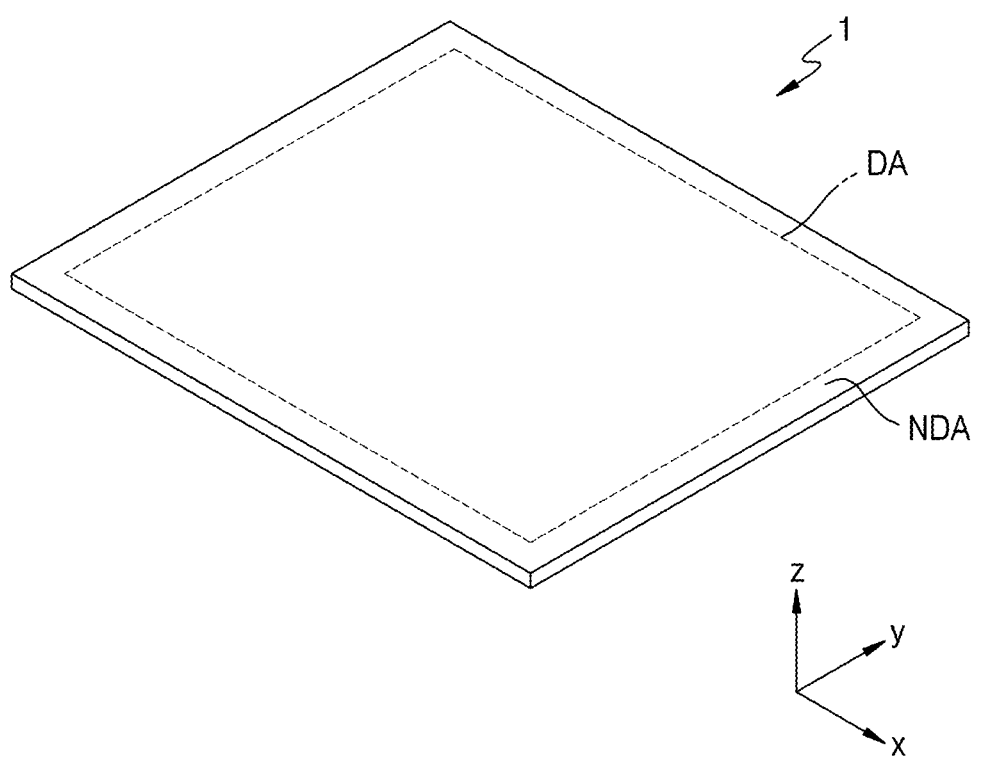
FIG. 1 is a schematic perspective view of an embodiment of a display apparatus.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, illustrative embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where an illustrative embodiment may be implemented differently, a specific process order may be performed in the order different from the described order. As an example, two processes successively described may be simultaneously performed substantially and performed in the opposite order.

In the specification, "A and/or B" means A or B, or A and B. In the specification, "at least one of A and B" means A or B, or A and B.

It will be understood that when a layer, region, or element is referred to as being "connected" to another layer, region, or element, it may be "directly connected" to the other layer, region, or element or may be "indirectly connected" to the other layer, region, or element with another layer, region, or element located therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different orientations that are not perpendicular to one another.

Figure 2A:
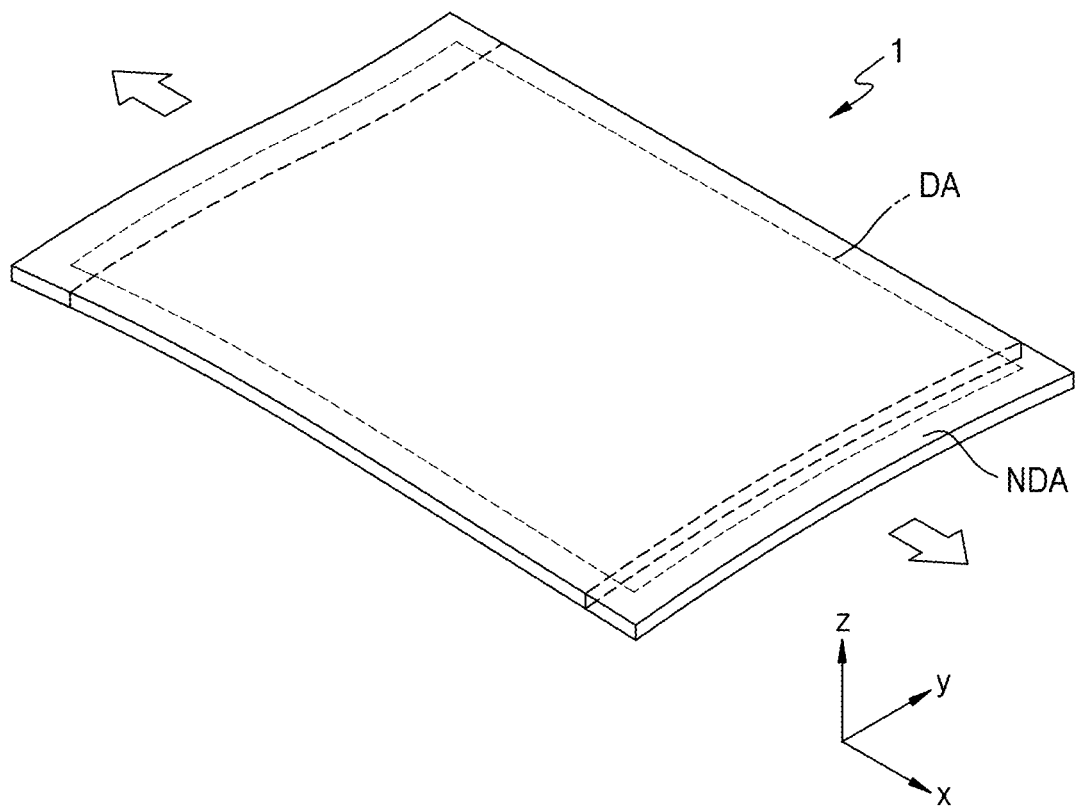
FIGS. 2A and 2B are perspective views of the display apparatus of FIG. 1 stretched in a first direction.
Figure 2B:
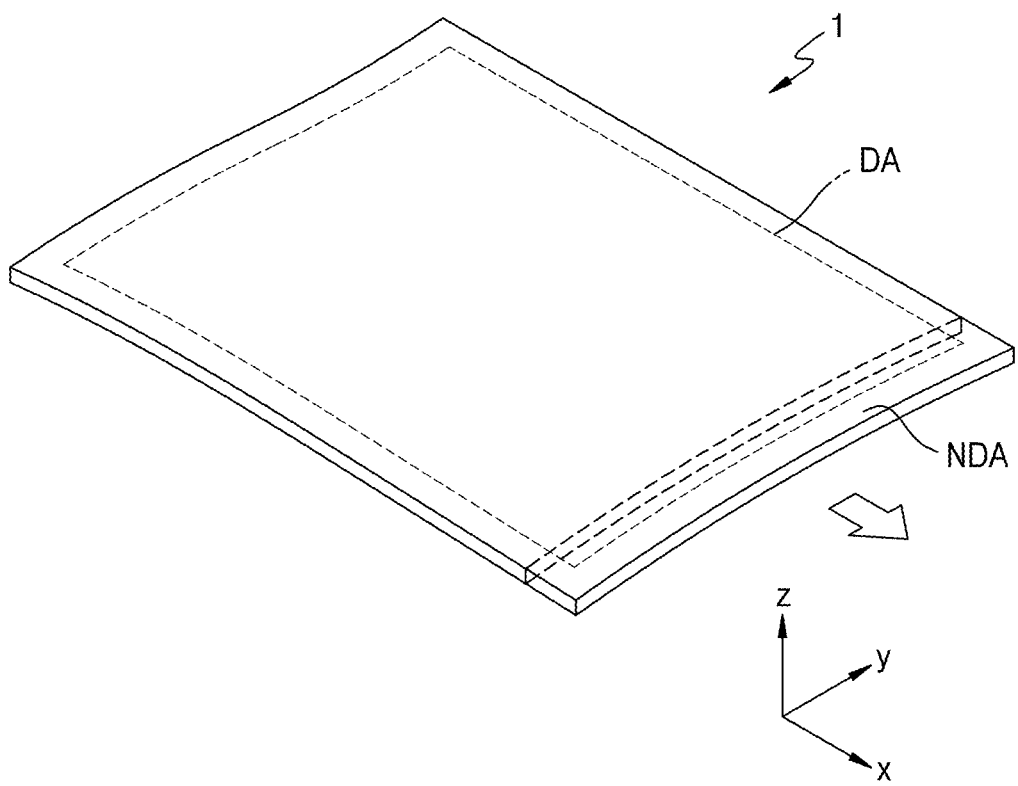
Figure 2C:
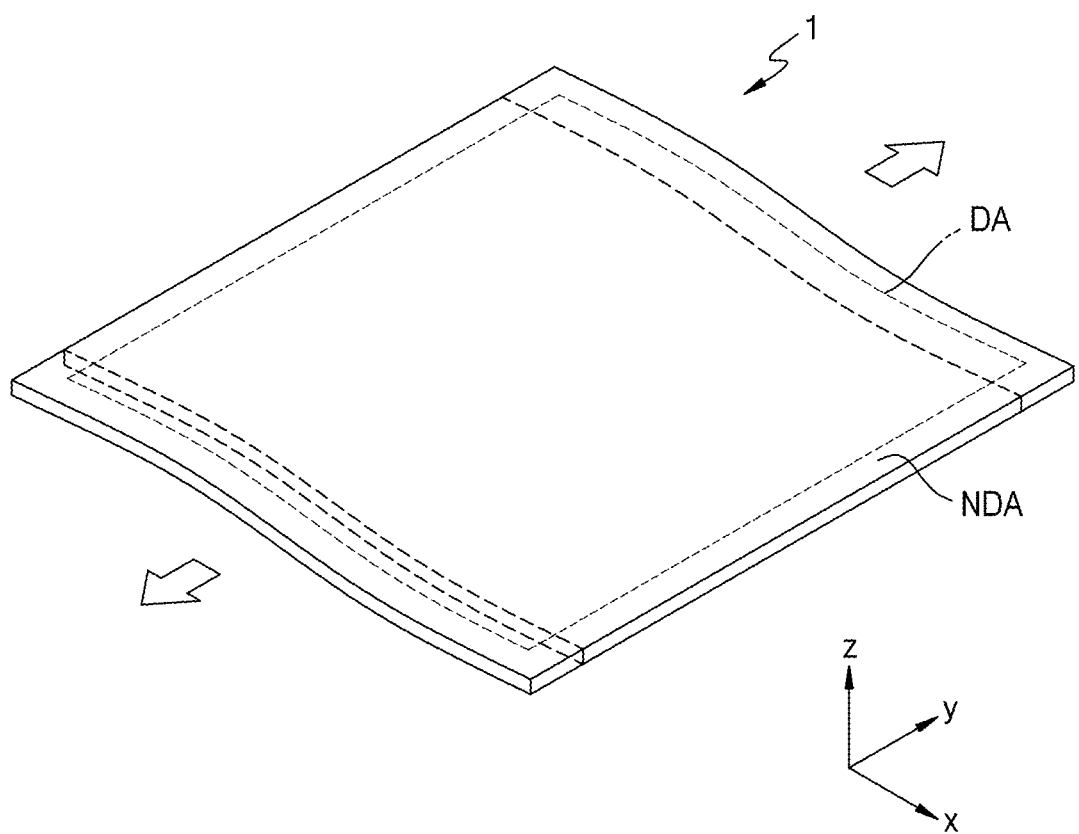
FIG. 2C is a perspective view of the display apparatus of FIG. 1 stretched in a second direction.
Figure 2D:
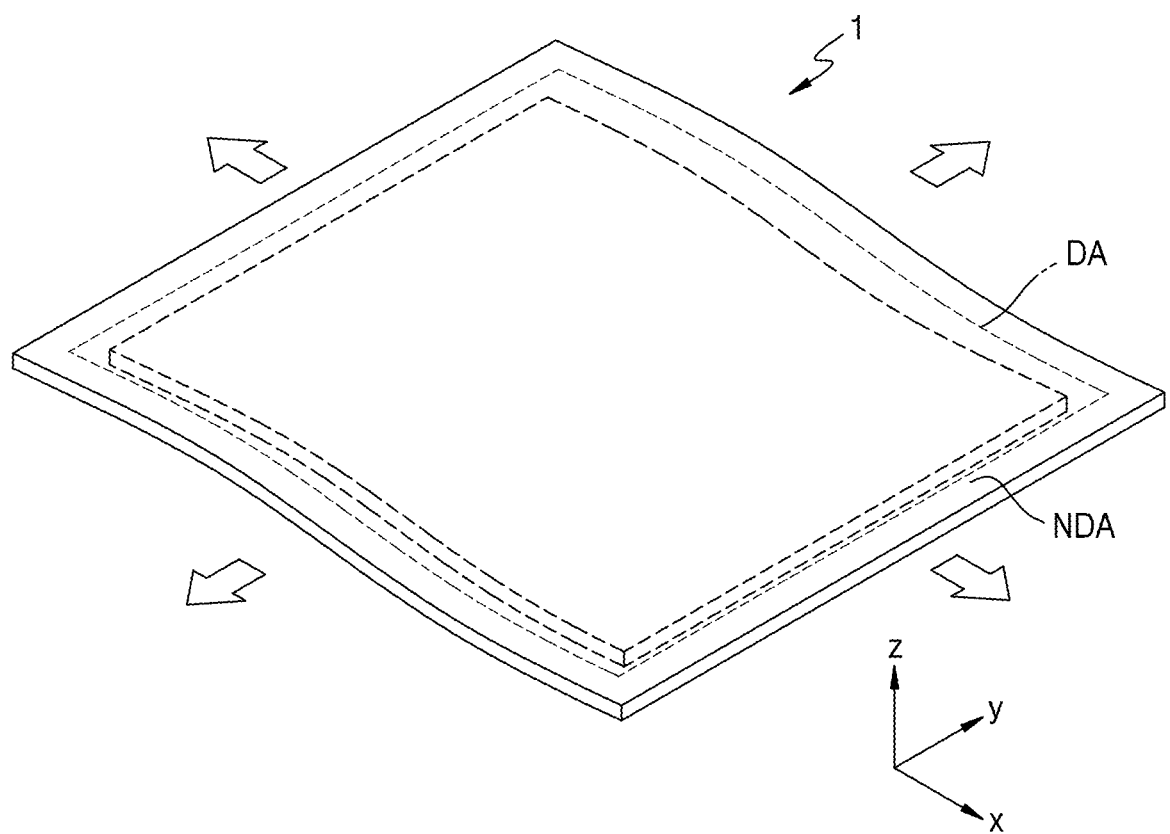
FIG. 2D is a perspective view of the display apparatus of FIG. 1 stretched in the first direction and the second direction.
Figure 2E:
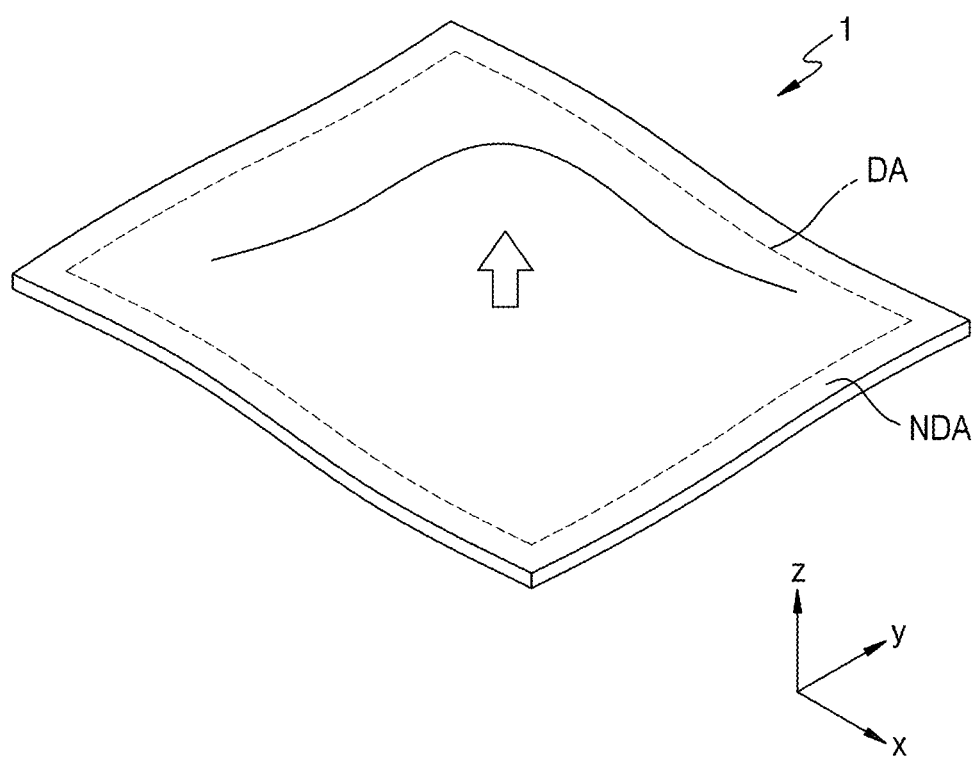
FIG. 2E is a perspective view of the display apparatus of FIG. 1 stretched in a third direction.

FIG. 1 is a schematic perspective view of an embodiment of a display apparatus 1. FIGS. 2A and 2B are perspective views of the display apparatus 1 of FIG. 1 stretched in a first direction. FIG. 2C is a perspective view of the display apparatus 1 of FIG. 1 stretched in a second direction. FIG. 2D is a perspective view of the display apparatus 1 of FIG. 1 stretched in the first direction and the second direction. FIG. 2E is a perspective view of the display apparatus 1 of FIG. 1 stretched in a third direction.

Referring to FIG. 1, the display apparatus 1 may include a display area DA and a non-display area NDA. The display area DA may include a plurality of pixels. The display apparatus 1 may display images by light emitted from the plurality of pixels. The non-display area NDA may be disposed outside the display area DA. The non-display area NDA may surround the display area DA entirely.

The display apparatus 1 may be stretched or shrunk in various directions. The display apparatus 1 may be stretched in the first direction (e.g., x direction and/or –x direction) according to external force exerted by an external object or a user. In an embodiment, as shown in FIGS. 2A and 2B, the display area DA and/or the non-display area NDA of the display apparatus 1 may be stretched in the first direction (e.g., x direction and/or –x direction). In an embodiment, as shown in FIG. 2A, the display area DA and/or the non-display area NDA may be stretched in the x direction and the –x direction, or be stretched in the x direction with one side of the apparatus 1 fixed as shown in FIG. 2B.

The display apparatus 1 may be stretched in the second direction (e.g., y direction and/or –y direction) according to external force exerted by an external object or a user. In an embodiment, as shown in FIG. 2C, the display area DA and/or the non-display area NDA of the display apparatus 1 may be stretched in the y direction and/or –y direction. In another embodiment, the display area DA and/or the non-display area NDA of the display apparatus 1 may be stretched in the y direction or –y direction with one side of the display apparatus 1 fixed.

The display apparatus 1 may be stretched in a plurality of directions, e.g., the first direction (e.g., x direction and/or –x direction) and the second direction (e.g., y direction and/or –y direction) according to external force exerted by an external object or a portion of a person's body. As shown in FIG. 2D, the display area DA and/or the non-display area NDA of the display apparatus 1 may be stretched in ±x directions and ±y directions.

The display apparatus 1 may be stretched in the third direction (e.g., z direction and/or –z direction) according to external force exerted by an external object or a portion of a person's body. In an embodiment, it is shown in FIG. 2E that a portion of the display apparatus 1, e.g., a portion of the display area DA, protrudes in the z direction. In another embodiment, a portion of the display apparatus 1, e.g., a portion of the display area DA, protrudes in the z direction (or is depressed in the –z direction).

Although it is shown in FIGS. 2A to 2E that the display apparatus 1 is stretched in the first direction, the second direction, and/or the third direction, the disclosure is not limited thereto. In another embodiment, the display apparatus 1 may be transformed into various irregular shapes, such as being bent or twisted along two or more axes.

Figure 3:
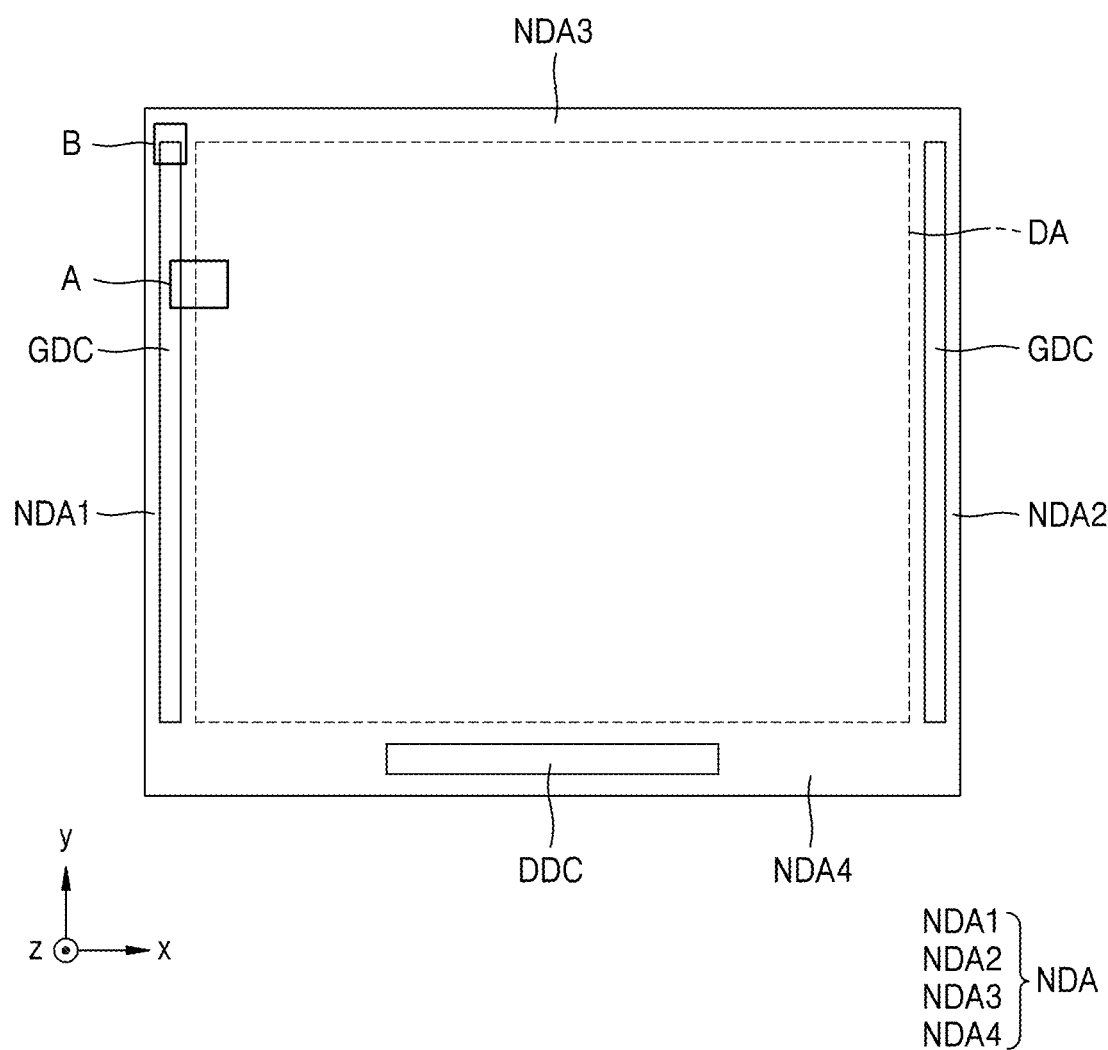
FIG. 3 is a schematic plan view of an embodiment of a display apparatus.

FIG. 3 is a schematic plan view of an embodiment of the display apparatus 1.

A plurality of pixels may be arranged in the display area DA of the display apparatus 1. Each pixel may include sub-pixels which emit light of different colors. A light-emitting element corresponding to each sub-pixel may be disposed in the display area DA. A circuit may be disposed in the non-display area NDA around the display area DA, where the circuit provides electrical signals to light-emitting elements arranged in the display area DA and transistors electrically connected to the light-emitting elements. Gate driving circuits GDC may be respectively arranged in a first non-display area NDA1 and a second non-display area NDA2 respectively arranged on two opposite sides with the display area DA therebetween. The gate driving circuit GDC may include drivers which provide electrical signals to a gate electrode of each of transistors electrically connected to the light-emitting elements. Although it is shown in FIG. 3 that the gate driving circuits GDC are respectively arranged in the first non-display area NDA1 and the second non-display area NDA2, the disclosure is not limited thereto. In another embodiment, the gate driving circuit GDC may be disposed in one of the first non-display area NDA1 and the second non-display area NDA2.

A data driving circuit DDC may be disposed in a third non-display area NDA3 and/or a fourth non-display area NDA4 extending to the first non-display area NDA1 and the second non-display area NDA2. In an embodiment, it is shown in FIG. 3 that the data driving circuit DDC is disposed in the fourth non-display area NDA4. In another embodiment, the data driving circuits DDC may be respectively arranged in the third non-display area NDA3 and the fourth non-display area NDA4.

Although it is shown in FIG. 3 that the data driving circuit DDC is disposed in the fourth non-display area NDA4 of the display apparatus 1, the disclosure is not limited thereto. In another embodiment, the display apparatus 1 may further include a flexible circuit board (not shown) electrically connected thereto through a terminal portion (not shown)

disposed in the fourth non-display area NDA4. The data driving circuit DDC may be disposed in the flexible circuit board.

In an embodiment, an elongation rate of the non-display area NDA may be equal to or less than an elongation rate of the display area DA. In an embodiment, the elongation rate of the non-display area NDA may be different for each region. In an embodiment, although the first non-display area NDA1, the second non-display area NDA2, and the third non-display area NDA3 may have substantially the same elongation rate, the elongation rate of the fourth non-display area NDA4 may be less than the elongation rate of each of the first non-display area NDA1, the second non-display area NDA2, and the third non-display area NDA3.

Figure 4:
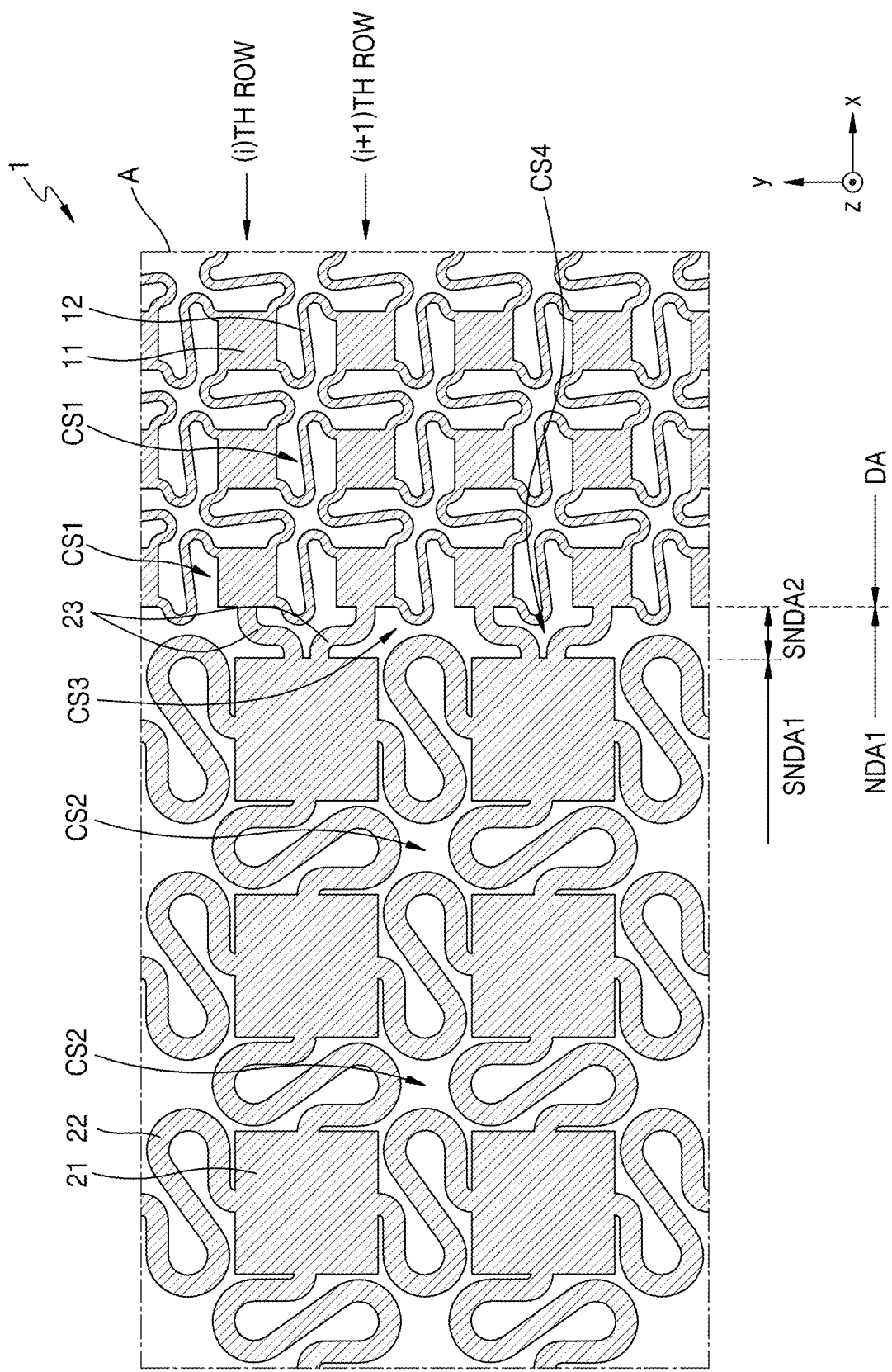
FIG. 4 is a view of an embodiment of a portion of the display apparatus and an enlarged plan view of a region A of FIG. 3.

FIG. 4 is a view of an embodiment of a portion of the display apparatus 1 and an enlarged plan view of a region A of FIG. 3.

Referring to FIG. 4, the display apparatus 1 may include main island portions 11 and main bridge portions 12 extending to adjacent main island portions 11, where the main island portions 11 are spaced apart from each other in the first direction (e.g., x direction or −x direction) and the second direction (e.g., y direction or −y direction) in the display area DA.

The main bridge portions 12 may be spaced apart from each other by a first opening CS1 disposed between the main bridge portions 12. The main bridge portion 12 may have a serpentine shape. In an embodiment, as shown in FIG. 4, the main bridge portion 12 may have an approximate 'alphabet S' shape.

Each main island portion 11 may be extended to a plurality of main bridge portions 12. In an embodiment, each main island portion 11 may be extended to four main bridge portions 12. Two main bridge portions 12 may be respectively arranged on two opposite sides of the main island portion 11 in the first direction (e.g., x direction or −x direction), and two remaining main bridge portions 12 may be respectively arranged on two opposite sides of the main island portion 11 in the second direction (e.g., y direction or −y direction). Four main bridge portions 12 may be respectively extended to four lateral sides of the main island portion 11. Each of four main bridge portions 12 may be adjacent to each of the corners of the main island portion 11.

The display apparatus 1 may include peripheral island portions 21 and peripheral bridge portions 22 extending to adjacent peripheral island portions 21, where the peripheral island portions 21 are spaced apart from each other in the first direction (e.g., x direction or −x direction) and the second direction (e.g., y direction or −y direction) in the non-display area, e.g., the first non-display area NDA1 shown in FIG. 4.

The peripheral bridge portions 22 may be spaced apart from each other by a second opening CS2 disposed between the peripheral bridge portions 22. The peripheral bridge portion 22 may have a serpentine shape. In an embodiment, as shown in FIG. 4, the peripheral bridge portion 22 may have an approximate 'alphabet S' shape. The size and/or width of the peripheral bridge portion 22 may be different from the size and/or width of the main bridge portion 12. In an embodiment, the size and/or width of the peripheral bridge portion 22 may be greater than the size and/or width of the main bridge portion 12. A curvature radius of a round portion of the peripheral bridge portion 22 may be different from a curvature radius of a round portion of the main bridge portion 12. In an embodiment, a curvature radius of a round portion of the peripheral bridge portion 22 may be greater than a curvature radius of a round portion of the main bridge portion 12.

Each peripheral island portion 21 may be extended to a plurality of peripheral bridge portions 22. The size and/or width of each peripheral island portion 21 may be different from the size and/or width of the main island portion 11. In an embodiment, the planar area of the peripheral island portion 21 may be greater than the planar area of the main island portion 11. Each peripheral island portion 21 may be extended to four peripheral bridge portions 22. Two peripheral bridge portions 22 may be respectively arranged on two opposite sides of the peripheral island portion 21 in the first direction (e.g., x direction or −x direction), and two remaining peripheral bridge portions 22 may be respectively arranged on two opposite sides of the peripheral island portion 21 in the second direction (e.g., y direction or −y direction). In an embodiment, four peripheral bridge portions 22 may be respectively extended to four lateral sides of the peripheral island portion 21. Each peripheral bridge portion 22 may be extended to the central portion of each lateral side of the peripheral island portion 21.

The peripheral island portions 21 in one of rows arranged in the first non-display area NDA1 may correspond to the main island portions 11 in a plurality of rows arranged in the display area DA. In an embodiment, the peripheral island portions 21 in one of rows arranged in the first non-display area NDA1 may correspond to the main island portions 11 disposed in an (i)-th row and the main island portions 11 disposed in an (i+1)-th row of the display area DA (here, i is a positive integer greater than 0). In another embodiment, the peripheral island portions 21 in one of rows may correspond to n rows of the main island portions 11 (here, n is a positive integer equal to or greater than 3).

The non-display area, e.g., the first non-display area NDA1 may include a first sub-non-display area SNDA1 and a second sub-non-display area SNDA2, where the peripheral island portions 21 and the peripheral bridge portions 22 are arranged in the first sub-non-display area SNDA1, and the second sub-non-display area SNDA2 is between the first sub-non-display area SNDA1 and the display area DA. Sub-bridge portions 23 may be disposed in the second sub-non-display area SNDA2, where the sub-bridge portions 23 extend to the display area DA and the first sub-non-display area SNDA1. One end of the sub-bridge portion 23 may extend to the peripheral island portion 21, and an opposite end of the sub-bridge portion 23 may extend to the main island portion 11. In an embodiment, one end of the sub-bridge portion 23 may extend to the central portion of one lateral side of the peripheral island portion 21, and an opposite end of the sub-bridge portion 23 may extend to the central portion of one lateral side of the main island portion 11.

The sub-bridge portion 23 may have a serpentine shape. In an embodiment, the shape of the sub-bridge portion 23 may be different from the shape of each of the main bridge portion 12 and the peripheral bridge portion 22. The width of the sub-bridge portion 23 may be different from the width of the main bridge portion 12 and the width of the peripheral bridge portion 22. The width of the sub-bridge portion 23 may be greater than the width of the main bridge portion 12 and less than the width of the peripheral bridge portion 22. A third opening CS3 and a fourth opening CS4 having different shapes may be alternately arranged between the sub-bridge portions 23 in the second direction (e.g., y direction or −y direction).

Figure 5:
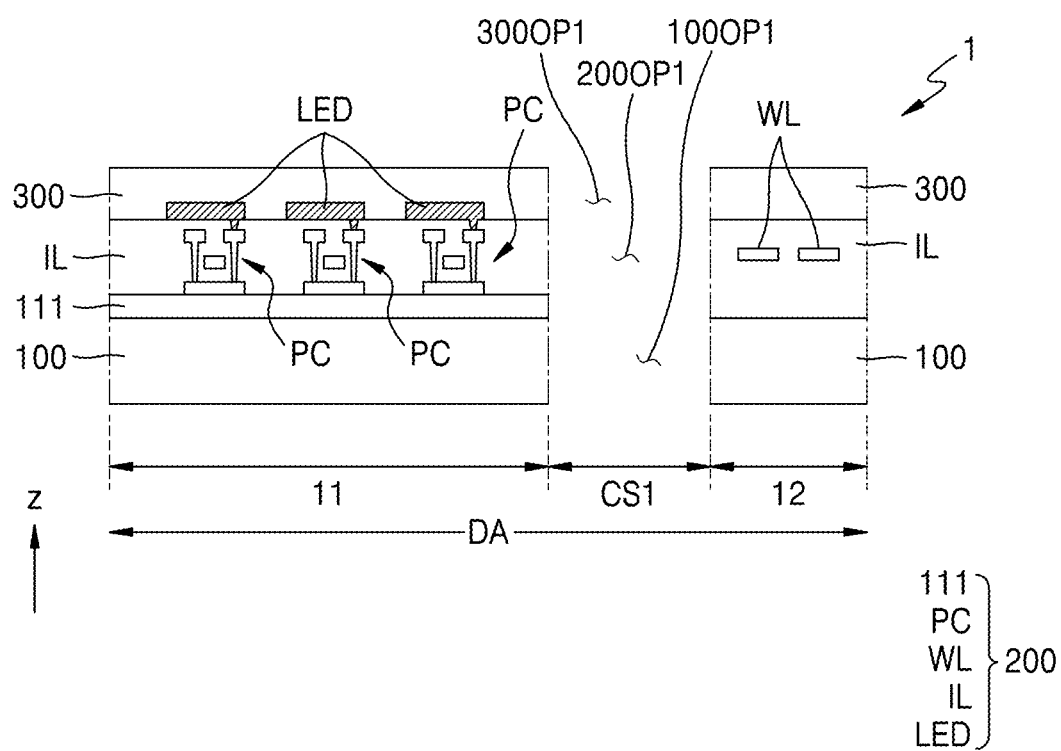
FIG. 5 is a schematic cross-sectional view of an embodiment of a main island portion and a main bridge portion disposed in a display area of a display apparatus.

FIG. 5 is a schematic cross-sectional view of an embodiment of the main island portion 11 and the main bridge portion 12 disposed in the display area DA of the display apparatus 1.

Referring to FIG. 5, the main island portion 11 and the main bridge portion 12 disposed in the display area DA may be spaced apart from each other with the first opening CS1 therebetween. The main island portion 11 may include light-emitting elements LED and a circuit, e.g., a pixel driving circuit PC which is connected to the light-emitting elements LED and drives the light-emitting elements LED. The main bridge portion 12 may include a wiring WL electrically connected to the pixel driving circuits PC respectively arranged in the main island portions 11 adjacent thereto.

The main island portion 11 is described. A buffer layer 111 may be disposed on a substrate 100, and the pixel driving circuit PC may be disposed on the buffer layer 111. An insulating layer IL may be disposed between the pixel driving circuit PC and the light-emitting element LED, where the insulating layer IL includes an inorganic insulating material and/or an organic insulating material. The light-emitting element LED may be disposed on the insulating layer IL and electrically connected to the pixel driving circuit PC. The light-emitting elements LED may emit light of different colors or emit light of the same color. In an embodiment, the light-emitting elements LED may respectively emit red light, green light, and blue light. In an embodiment, the light-emitting elements LED may emit white light. In another embodiment, the light-emitting elements LED may respectively emit red light, green light, blue light, and white light.

The substrate 100 may include polymer resin such as polyethersulfone, polyarylate, polyetherimide, polyethylene naphthalate, polyethylene terephthalate, polyphenylene sulfide, polyimide, polycarbonate, cellulose tri acetate, and cellulose acetate propionate. In an embodiment, the substrate 100 may include a single layer including the polymer resin. In another embodiment, the substrate 100 may have a multi-layered structure including a base layer and a barrier layer, where the base layer includes the above polymer resin and the barrier layer includes an inorganic insulating material. The substrate 100 including the polymer resin is flexible, rollable, or bendable.

In an embodiment, although it is shown in FIG. 5 that three pixel driving circuits PC are arranged in each of the main island portions 11 and three light-emitting elements LED are respectively connected to the pixel driving circuits PC, the disclosure is not limited thereto. In another embodiment, the number of pixel driving circuits PC and light-emitting elements LED disposed in the main island portion 11 may be one, two, or four or more.

An encapsulation layer 300 may be disposed on the light-emitting element LED and may protect the light-emitting element LED from external force and/or moisture transmission. The encapsulation layer 300 may include an inorganic encapsulation layer and/or an organic encapsulation layer. In an embodiment, the encapsulation layer 300 may include a structure in which an inorganic encapsulation layer including an inorganic insulating material, an organic encapsulation layer including an organic insulating material, and an inorganic encapsulation layer including an inorganic insulating material are stacked. In another embodiment, the encapsulation layer 300 may include an organic material such as resin. In an embodiment, the encapsulation layer 300 may include urethane epoxy acrylate. The encapsulation layer 300 may include a photosensitive material, e.g., a material such as a photoresist.

The main bridge portion 12 is described. The insulating layer IL including an organic insulating material may be disposed on the substrate 100. The main bridge portion 12 which is relatively much transformed when the display apparatus 1 is stretched may not include a layer including an inorganic insulating material that is prone to cracks unlike the main island portion 11.

In an embodiment, the substrate 100 corresponding to the main bridge portion 12 may have the same stack structure as the substrate 100 corresponding to the main island portion 11. In an embodiment, the substrate 100 corresponding to the main bridge portion 12 and the substrate 100 corresponding to the main island portion 11 may be polymer resin layers simultaneously formed during the same process. In another embodiment, the substrate 100 corresponding to the main bridge portion 12 may have a different stack structure from the substrate 100 corresponding to the main island portion 11. In an embodiment, the substrate 100 corresponding to the main island portion 11 may have a multi-structure including a base layer that includes a polymer resin and a barrier layer that includes an inorganic insulating material, and the substrate 100 corresponding to the main bridge portion 12 may have a structure of a polymer resin layer without a layer including an inorganic insulating material.

As described above, the wirings WL of the main bridge portion 12 may be signal lines (e.g., a gate line, a data line, or the like) for providing electrical signals or a voltage line (e.g., a driving voltage line, an initialization voltage line, or the like) for providing voltages to a transistor included in the pixel driving circuit PC of the main island portion 11. The encapsulation layer 300 may be disposed also in the main bridge portion 12. In another embodiment, there may not be the encapsulation layer 300 in the main bridge portion 12.

Referring to FIGS. 4A to 4C and FIG. 5, the substrate 100 corresponding to the main island portion 11 may be connected to the substrate 100 corresponding to the main bridge portion 12. In other words, the plan views shown above in FIGS. 4A to 4C may be substantially the same as the plan view of the substrate 100 in FIG. 5. In other words, the substrate 100 may include a region corresponding to the main island portion 11 and a region corresponding to the main bridge portion 12, and an opening 100OP1 of the same shape as that of the first opening CS1 may be defined in the substrate 100.

Similarly, the encapsulation layer 300 corresponding to the main island portion 11 may be connected to the encapsulation layer 300 corresponding to the main bridge portion 12. In an embodiment, the plan views shown above in FIGS. 4A to 4C may be substantially the same as the plan view of the encapsulation layer 300. In other words, the encapsulation layer 300 may include a region corresponding to the main island portion 11 and a region corresponding to the main bridge portion 12, and an opening 300OP1 of the same shape as that of the first opening CS1 may be defined in the encapsulation layer 300.

A circuit-light-emitting element layer 200 between the substrate 100 and the encapsulation layer 300 may include the buffer layer 111, the pixel driving circuit PC, the wiring WL, the insulating layer IL, and the light-emitting element LED. Similar to the substrate 100, the plan views shown above in FIGS. 4A to 4C may be substantially the same as the plan view of the circuit-light-emitting element layer 200. In other words, the circuit-light-emitting element layer 200 may define an opening 200OP1 of the same shape as that of the first opening CS1.

Figure 6A:
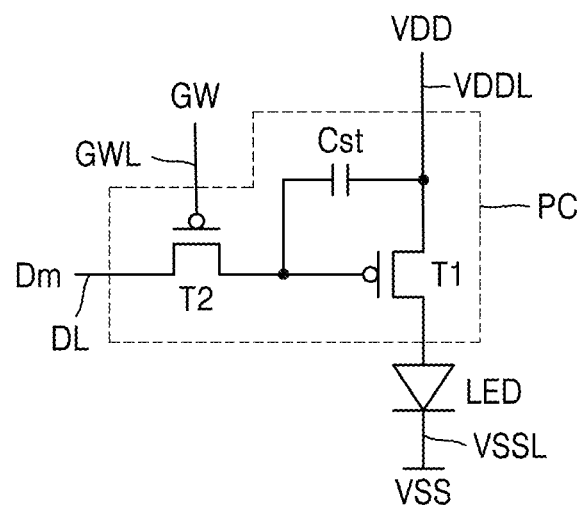
FIGS. 6A to 6C are equivalent circuit diagrams of an embodiment of a sub-pixel of a display apparatus.
Figure 6B:
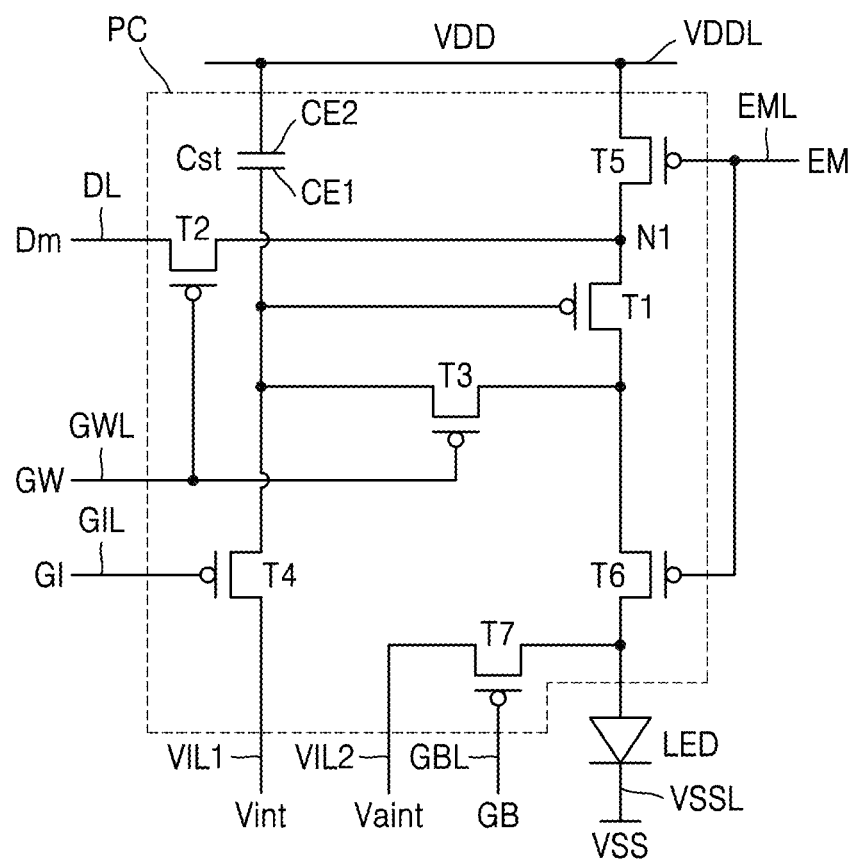
Figure 6C:
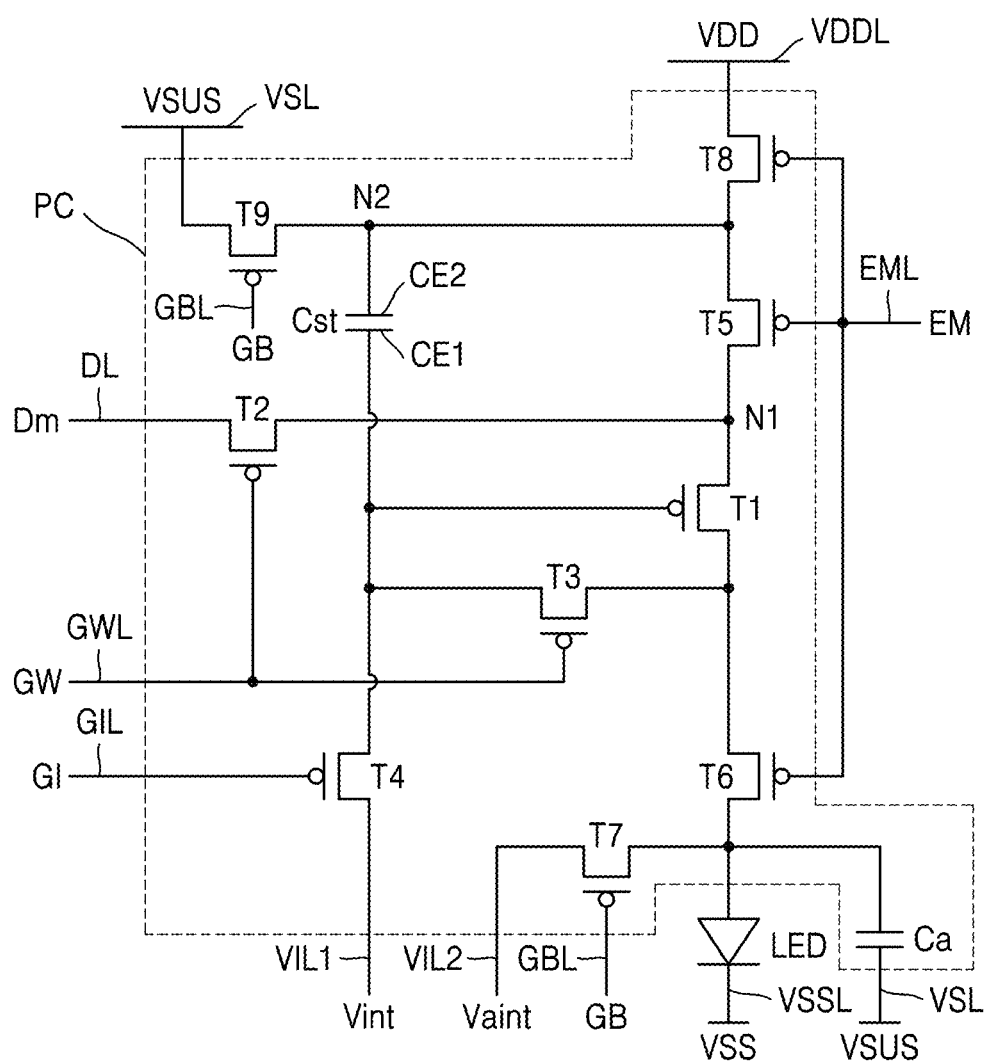

FIGS. 6A to 6C are equivalent circuit diagrams of an embodiment of a sub-pixel of the display apparatus 1.

Referring to FIG. 6A, the light-emitting element LED corresponding to a sub-pixel may be electrically connected to the pixel driving circuit PC, and the pixel driving circuit PC may include a first transistor T1, a second transistor T2, and a storage capacitor Cst. The pixel driving circuit PC may be electrically connected to the signal line and the voltage line. The signal line may include a gate line such as a scan signal line GWL, and a data line DL. The voltage line may include a first voltage line VDDL.

The second transistor T2 may be electrically connected to the scan signal line GWL and the data line DL. The scan signal line GWL may provide a scan signal GW to a gate electrode of the second transistor T2. The second transistor T2 may transfer a data signal Dm to the first transistor T1 according to a scan signal GW input from the scan signal line GWL, where the data signal Dm is input from the data line DL.

The storage capacitor Cst is electrically connected to the second transistor T2 and the first voltage line VDDL, and may store a voltage corresponding to a difference between a voltage transferred from the second transistor T2 and a first power voltage VDD supplied by the first voltage line VDDL.

The first transistor T1 serves as a driving transistor, and may control a driving current flowing through the light-emitting element LED. The first transistor T1 may be connected to the first voltage line VDDL and the storage capacitor Cst. The first transistor T1 may control the driving current flowing through the light-emitting element LED from the first voltage line VDDL in response to the voltage stored in the storage capacitor Cst. The light-emitting element LED may emit light having a preset brightness based on the driving current. A first electrode of the light-emitting element LED may be electrically connected to the first transistor T1, and a second electrode of the light-emitting element LED may be electrically connected to a second voltage line VSSL which supplies a second power voltage VSS.

Although it is shown in FIG. 6A that the pixel driving circuit PC includes two transistors and one storage capacitor, the pixel driving circuit PC may include three or more transistors in another embodiment.

Referring to FIG. 6B, the pixel driving circuit PC may include the first transistor T1, the second transistor T2, a third transistor T3, a fourth transistor T4, a fifth transistor T5, a sixth transistor T6, a seventh transistor T7, and the storage capacitor Cst.

The pixel driving circuit PC may be electrically connected to signal lines and voltage lines. The signal lines may include a gate line, such as the scan signal line GWL, a bypass control line GBL, and an emission control line EML, and the data line DL. The voltage lines may include first and second initialization voltage lines VIL1 and VIL2, and the first voltage line VDDL.

The first voltage line VDDL may transfer the first power voltage VDD to the first transistor T1. The first initialization voltage line VIL1 may transfer a first initialization voltage Vint to the pixel driving circuit PC, where the first initialization voltage Vint initializes the first transistor T1. The second initialization voltage line VIL2 may transfer a second initialization voltage Vaint to the pixel driving circuit PC, where the second initialization voltage Vaint initializes the first electrode of the light-emitting element LED.

The first transistor T1 may be electrically connected to the first voltage line VDDL through the fifth transistor T5 and electrically connected to the light-emitting element LED through the sixth transistor T6. The first transistor T1 serves as the driving transistor, and receives a data signal Dm and supplies the driving current to the light-emitting element LED according to a switching operation of the second transistor T2.

The second transistor T2 serves as a data-write transistor, and is electrically connected to the scan signal line GWL and the data line DL. The second transistor T2 is electrically connected to the first voltage line VDDL through the fifth transistor T5. The second transistor T2 performs a switching operation of being turned on according to a scan signal GW and transferring a data signal Dm to a first node N1, where the scan signal GW is transferred through the scan signal line GWL, and the data signal Dm is transferred through the data line DL.

The third transistor T3 is electrically connected to the scan signal line GWL and electrically connected to the light-emitting element LED through the sixth transistor T6. The third transistor T3 may be turned on and diode-connect the first transistor T1 according to a scan signal GW transferred through the scan signal line GWL.

The fourth transistor T4 serves as a first initialization transistor, and is electrically connected to the initialization control line GIL and the first initialization voltage line VIL1. The fourth transistor T4 is turned on according to an initialization control signal GI transferred through the initialization control line GIL, and transfers the first initialization voltage Vint from the first initialization voltage line VIL1 to the gate electrode of the first transistor T1, thereby initializing the voltage of the gate electrode of the first transistor T1. An initialization control signal GI may correspond to a scan signal of another pixel driving circuit disposed in the previous row of the relevant pixel driving circuit.

The fifth transistor T5 may serve as an operation control transistor and, and the sixth transistor T6 may serve as an emission control transistor. The fifth transistor T5 and the sixth transistor T6 are electrically connected to the emission control line EML and simultaneously turned on according to an emission control signal EM transferred through the emission control line EML to form a current path such that the driving current flows in a direction from the first voltage line VDDL to the light-emitting element LED.

The seventh transistor T7 serves as a second initialization transistor, and may be electrically connected to the bypass control line GBL, the second initialization voltage line VIL2, and the sixth transistor T6. The seventh transistor T7 is turned on according to a bypass control signal GB transferred through the bypass control line GBL, and may initialize the first electrode of the light-emitting element LED by transferring the second initialization voltage Vaint from the second initialization voltage line VIL2 to the first electrode of the light-emitting element LED.

The storage capacitor Cst includes a first electrode CE1 and a second electrode CE2. The first electrode CE1 is electrically connected to the gate electrode of the first transistor T1, and the second electrode CE2 is electrically connected to the first voltage line VDDL. The storage capacitor Cst may maintain a voltage applied to the gate electrode of the first transistor T1 by storing and maintaining a voltage corresponding to a difference between opposite ends of the first voltage line VDDL and the gate electrode of the first transistor T1.

Referring to FIG. 6C, the pixel driving circuit PC may include the first transistor T1, the second transistor T2, the third transistor T3, the fourth transistor T4, the fifth transistor T5, the sixth transistor T6, the seventh transistor T7, an eighth transistor T8, a ninth transistor T9, the storage capacitor Cst, and an auxiliary capacitor Ca.

The pixel driving circuit PC is electrically connected to signal lines and voltage lines. The signal lines may include a gate line, such as the scan signal line GWL, the bypass control line GBL, the initialization control line GIL, and the emission control line EML, and the data line DL. The voltage lines may include the first and second initialization voltage lines VIL1 and VIL2, a sustain voltage line VSL, and the first voltage line VDDL.

The first voltage line VDDL may transfer the first power voltage VDD to the first transistor T1. The first initialization voltage line VIL1 may transfer the first initialization voltage Vint to the pixel driving circuit PC, where the first initialization voltage Vint initializes the first transistor T1. The second initialization voltage line VIL2 may transfer the second initialization voltage Vaint to the pixel driving circuit PC, where the second initialization voltage Vaint initializes the first electrode of the light-emitting element LED. During an initialization period and a data-write period, the sustain voltage line VSL may provide a sustain voltage VSUS to a second node N2, e.g., the second electrode CE2 of the storage capacitor Cst.

The first transistor T1 may be electrically connected to the first voltage line VDDL through the fifth transistor T5 and the eighth transistor T8, and electrically connected to the light-emitting element LED through the sixth transistor T6. The first transistor T1 serves as the driving transistor, and may receive a data signal Dm and supply the driving current to the light-emitting element LED according to a switching operation of the second transistor T2.

The second transistor T2 is electrically connected to the scan signal line GWL and the data line DL and electrically connected to the first voltage line VDDL through the fifth transistor T5 and the eighth transistor T8. The second transistor T2 is turned on according to a scan signal GW transferred through the scan signal line GWL and performs a switching operation of transferring a data signal Dm to the first node N1, where the data signal Dm is transferred through the data line DL.

The third transistor T3 is electrically connected to the scan signal line GWL and electrically connected to the light-emitting element LED through the sixth transistor T6. The third transistor T3 is turned on according to a scan signal GW transferred through the scan signal line GWL, and may compensate for a threshold voltage of the first transistor T1 by diode-connecting the first transistor T1.

The fourth transistor T4 is electrically connected to the initialization control line GIL and the first initialization voltage line VIL1, turned on according to an initialization control signal GI transferred through the initialization control line GIL, and initializes the voltage of the gate electrode of the first transistor T1 by transferring the first initialization voltage Vint to the gate electrode of the first transistor T1. An initialization control signal GI may correspond to a scan signal of another pixel driving circuit disposed in the previous row of the relevant pixel driving circuit.

The fifth transistor T5, the sixth transistor T6, and the eighth transistor T8 are electrically connected to the emission control line EML, simultaneously turned on according to an emission control signal transferred through the emission control line EML, and form a current path such that the driving current flows in a direction from the first voltage line VDDL to the light-emitting element LED.

The seventh transistor T7 serves as the second initialization transistor, and may be electrically connected to the bypass control line GBL, the second initialization voltage line VIL2, and the sixth transistor T6. The seventh transistor T7 is turned on according to a bypass control signal GB transferred through the bypass control line GBL and transfers the second initialization voltage Vaint from the second initialization voltage line VIL2 to the first electrode of the light-emitting element LED to initialize the first electrode of the light-emitting element LED.

The ninth transistor T9 may be electrically connected to the bypass control line GBL, the second electrode CE2 of the storage capacitor Cst, and the sustain voltage line VSL. The ninth transistor T9 may be turned on according to a bypass control signal GB transferred through the bypass control line GBL and may transfer the sustain voltage VSUS to the second node, e.g., the second electrode CE2 of the storage capacitor Cst during an initialization period and a data-write period.

Each of the eighth transistor T8 and the ninth transistor T9 may be electrically connected to the second node N2, e.g., the second electrode CE2 of the storage capacitor Cst. In an embodiment, during the initialization period and the data-write period, the eighth transistor T8 may be turned off and the ninth transistor T9 may be turned on, and during an emission period, the eighth transistor T8 may be turned on and the ninth transistor T9 may be turned off. Because, during the initialization period and the data-write period, the sustain voltage VSUS is transferred to the second node N2, uniformity (e.g., long range uniformity ("LRU")) in the brightness of the display apparatus due to a voltage drop of the first voltage line VDDL may be improved.

The storage capacitor Cst includes the first electrode CE1 and the second electrode CE2. The first electrode CE1 is electrically connected to the gate electrode of the first transistor T1, and the second electrode CE2 is electrically connected to the eighth transistor T8 and the ninth transistor T9.

The auxiliary capacitor Ca may be electrically connected to the sixth transistor T6, the sustain voltage line VSL, and the first electrode of the light-emitting element LED. The auxiliary capacitor Ca may prevent black brightness from increasing when the sixth transistor T6 is turned off by storing and maintaining a voltage corresponding to a voltage difference between the first electrode of the light-emitting element LED and the sustain voltage line VSL while the seventh transistor T7 and the ninth transistor T9 are turned on.

Figure 7A:
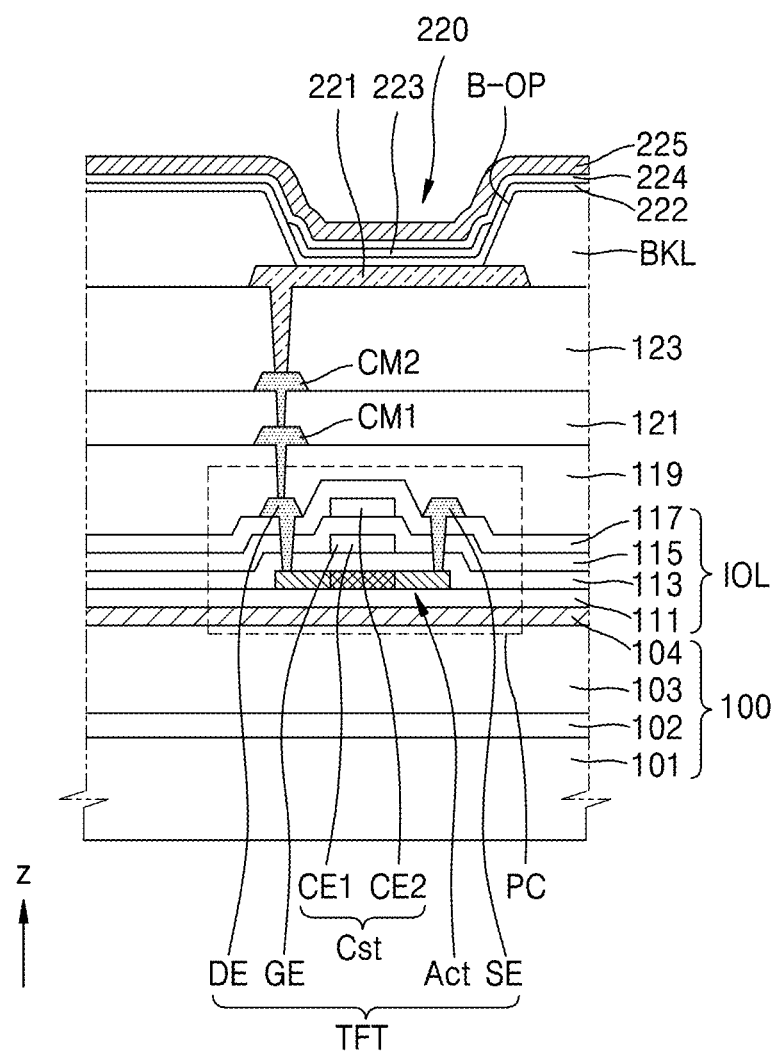
FIGS. 7A and 7B are schematic cross-sectional views of an embodiment of a main island portion of a display apparatus.
Figure 7B:
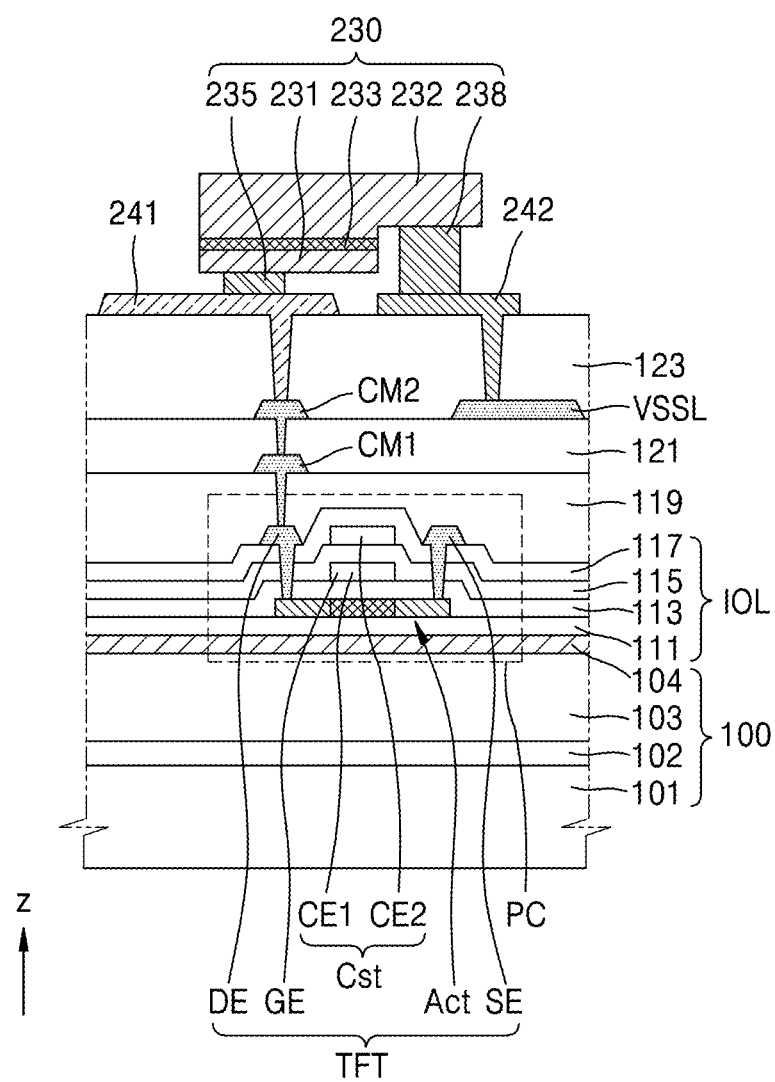

FIGS. 7A and 7B are schematic cross-sectional views of an embodiment of the main island portion of the display apparatus.

Referring to FIGS. 7A and 7B, the main island portion 11 (refer to FIG. 4) of the display apparatus in an embodiment may include the pixel driving circuit PC and the light-emitting element LED (refer to FIG. 6A). The light-emitting element LED (refer to FIG. 6A) may include an organic light-emitting diode 220 as shown in FIG. 7A or an inorganic light-emitting diode 230 as shown in FIG. 7B. The pixel driving circuit PC may be disposed between the substrate 100 and the light-emitting element LED (refer to FIG. 6A). The pixel driving circuit PC may include the transistor and the storage capacitor described above with reference to FIGS. 6A to 6C. In an embodiment, it is shown that the pixel driving circuit PC has the same structure as the pixel driving circuit PC described with reference to FIG. 6A, and a predetermined structure thereof is the same as described above.

First, referring to FIG. 7A, the substrate 100 corresponding to the main island portion 11 (refer to FIG. 4) may include a first sub-substrate 101, a first barrier layer 102, a second sub-substrate 103, and a second barrier layer 104. Each of the first sub-substrate 101 and the second sub-substrate 103 may include polymer resins such as polyethersulfone, polyarylate, polyether imide, polyethylene naphthalate, polyethylene terephthalate, polyphenylene sulfide, polyimide, polycarbonate, cellulose triacetate, cellulose acetate propionate, or the like. Each of the first barrier layer 102 and the second barrier layer 104 may include an inorganic insulating material such as silicon oxide, silicon nitride, and silicon oxynitride.

The buffer layer 111 may be disposed on the substrate 100, and the pixel driving circuit PC may be disposed on the buffer layer 111. The buffer layer 111 may include an inorganic insulating material such as silicon oxide, silicon nitride, and silicon oxynitride.

The pixel driving circuit PC may include a transistor TFT. The transistor TFT may include a semiconductor layer Act, a gate electrode GE, a source electrode SE, and a drain electrode DE. Although FIG. 7A shows a top-gate type transistor in which the gate electrode GE is disposed over the semiconductor layer Act with a gate insulating layer 113 therebetween, the transistor TFT may be a bottom-gate type transistor.

The semiconductor layer Act may include polycrystalline silicon. In an alternative embodiment, the semiconductor layer Act may include amorphous silicon, an oxide semiconductor, or an organic semiconductor. The gate electrode GE may include a low-resistance metal material. The gate electrode GE may include a conductive material including molybdenum (Mo), aluminum (Al), copper (Cu), and titanium (Ti) and have a single-layered structure or a multi-layered structure including the above materials.

The gate insulating layer 113 between the semiconductor layer Act and the gate electrode GE may include an inorganic insulating material such as silicon oxide, silicon nitride, and silicon oxynitride. The gate insulating layer 113 may include a single layer or a multi-layer including the above materials.

The source electrode SE and the drain electrode DE may be disposed in the same layer, e.g., a second inter-insulating layer 117 and may include the same material as each other. The source electrode SE and the drain electrode DE may each include a material having relatively high conductivity. The source electrode SE and the drain electrode DE may each include a conductive material including molybdenum (Mo), aluminum (Al), copper (Cu), and titanium (Ti) and include a single layer or a multi-layer including the above materials. In an embodiment, the source electrode SE and the drain electrode DE may be formed in a multi-layered structure of a titanium layer, an aluminum layer, and a titanium layer (Ti/Al/Ti). The second inter-insulating layer 117 may include an inorganic insulating material such as silicon oxide, nitrogen oxide, silicon oxynitride, aluminum oxide, and titanium oxide, and include a single layer or a multi-layer including the above materials.

The storage capacitor Cst may include the first electrode CE1 and the second electrode CE2 overlapping each other with the first inter-insulating layer 115 therebetween. The storage capacitor Cst may overlap the transistor TFT. With regard to this, it is shown in FIG. 7A that the gate electrode GE of the transistor TFT serves as the first electrode CE1 of the storage capacitor Cst. In another embodiment, the storage capacitor Cst may not overlap the transistor TFT. The storage capacitor Cst may be covered by the second inter-insulating layer 117. The second electrode CE2 of the storage capacitor Cst may include a conductive material including molybdenum (Mo), aluminum (Al), copper (Cu), titanium (Ti), or the like, and include a single layer or a multi-layer including the above materials. The first inter-insulating layer 115 may be disposed between the gate insulating layer 113 and the second inter-insulating layer 117. The first inter-insulating layer 115 may include an inorganic insulating material such as silicon oxide, nitrogen oxide, silicon oxynitride, aluminum oxide, and titanium oxide, and include a single layer or a multi-layer including the above materials.

The size or area of an inorganic insulating material layer IOL corresponding to the main island portion 11 (refer to FIG. 4) may be less than the size or area of the main island portion 11 (refer to FIG. 4). In other words, the size or area of the inorganic insulating material layer IOL disposed on the substrate 100 may be less than the size or area of the first sub-substrate 101, the first barrier layer 102, and/or the second sub-substrate 103 of the substrate 100. The inorganic insulating material layer IOL on the substrate 100 may include, e.g., the buffer layer 111, the gate insulating layer 113, the first inter-insulating layer 115, and the second inter-insulating layer 117.

A first organic insulating layer 119 may be disposed on the second inter-insulating layer 117, and a second organic insulating layer 121 may be disposed on the first organic insulating layer 119. Each of the first organic insulating layer 119 and the second organic insulating layer 121 may include an organic insulating material such as polyimide.

A first connection piece CM1 may be disposed on the first organic insulating layer 119, and a second connection piece CM2 may be disposed on the second organic insulating layer 121. The first connection piece CM1 and the second connection piece CM2 may electrically connect the transistor TFT to the light-emitting element LED (refer to FIG. 6A). Each of the first connection piece CM1 and the second connection piece CM2 may include a conductive material including molybdenum (Mo), aluminum (Al), copper (Cu), titanium (Ti), or the like, and include a single layer or a multi-layer including the above materials.

The second voltage line VSSL (refer to FIGS. 6A to 6C) may be disposed on the second organic insulating layer 121, and a third organic insulating layer 123 may be disposed on the second organic insulating layer 121. The third organic insulating layer 123 may include an organic insulating material such as polyimide. The second voltage line VSSL may include a conductive material including molybdenum (Mo), aluminum (Al), copper (Cu), titanium (Ti), or the like, and include a single layer or a multi-layer including the above materials.

In an embodiment, as shown in FIG. 7A, the light-emitting element LED (refer to FIG. 6A) in an embodiment may include the organic light-emitting diode 220 including an organic material. The organic light-emitting diode 220 may include a first electrode 221, a second electrode 225, and an emission layer 223, where the first electrode 221 is disposed on an insulating layer, the second electrode 225 faces the first electrode 221, and the emission layer 223 is disposed between the first electrode 221 and the second electrode 225. A first functional layer 222 may be disposed between the first electrode 221 and the emission layer 223, and a second functional layer 224 may be disposed between the emission layer 223 and the second electrode 225.

The edges of the first electrode 221 may be covered by a bank layer BKL including an insulating material. The bank layer BKL may define an opening B-OP overlapping the central portion of the first electrode 221.

The first electrode 221 may include a conductive oxide, such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the first electrode 221 may include a reflective layer including silver (Ag), magnesium (Mg), aluminum (Al), platinum (Pt), palladium (Pd), gold (Au), nickel (Ni), neodymium (Nd), and iridium (Ir), chromium (Cr), or any combinations thereof. In another embodiment, the first electrode 221 may further include a layer on/under the reflective layer, where the layer includes ITO, IZO, ZnO, AZO, or $In_2O_3$.

The emission layer 223 may include a polymer organic material or a low-molecular weight organic material emitting light having a preset color. The first functional layer 222 may include a hole transport layer ("HTL") and/or a hole injection layer ("HIL"). The second functional layer 224 may include an electron transport layer ("ETL") and/or an electron injection layer ("EIL").

The second electrode 225 may include a conductive material having a relatively low work function. In an embodiment, the second electrode 225 may include a (semi) transparent layer including silver (Ag), magnesium (Mg), aluminum (Al), platinum (Pt), palladium (Pd), gold (Au), nickel (Ni), neodymium (Nd), and iridium (Ir), chromium (Cr), lithium (Li), calcium (Ca), or any alloys thereof. In an alternative embodiment, the second electrode 225 may further include a layer on/under the (semi) transparent layer, where the layer includes ITO, IZO, ZnO, AZO, or $In_2O_3$.

Next, referring to FIG. 7B, the light-emitting element LED (refer to FIG. 6) in an embodiment may include the inorganic light-emitting diode 230 including an inorganic material. The inorganic light-emitting diode 230 may include a first semiconductor layer 231, a second semiconductor layer 232, an intermediate layer 233, a first electrode 235, and a second electrode 238, where the intermediate layer 233 is between the first semiconductor layer 231 and a second semiconductor layer 232, the first electrode 235 is electrically connected to the first semiconductor layer 231, and the second electrode 238 is electrically connected to the second semiconductor layer 232. The first electrode 235 and the second electrode 238 of the inorganic light-emitting diode 230 may be electrically and respectively connected to a first electrode pad 241 and a second electrode pad 242 each disposed in the same layer.

In an embodiment, the first semiconductor layer 231 may include a p-type semiconductor layer. The p-type semiconductor layer may include a semiconductor material with a composition formula of $In_xAl_yGa_{1-x-y}N$ ($0 \leq x \leq 1$, $0 \leq y \leq 1$, $0 \leq x+y \leq 1$), such as GaN, AlN, AlGaN, InGaN, InN, InAlGaN, AlInN, or the like, and may be doped with a p-type dopant such as Mg, Zn, Ca, Sr, Ba, or the like.

The second semiconductor layer 232 may include, e.g., an n-type semiconductor layer. The n-type semiconductor layer may include a semiconductor material with a composition formula of $In_xAl_yGa_{1-x-y}N$ ($0 \leq x \leq 1$, $0 \leq y \leq 1$, $0 \leq x+y \leq 1$), such as GaN, AlN, AlGaN, InGaN, InN, InAlGaN, AlInN, or the like, and may be doped with n-type dopants such as Si, Ge, Sn, or the like.

The intermediate layer 233 is a region where electrons and holes recombine. As the electrons and holes recombine, the intermediate layer 233 transitions to a lower energy level and may generate light having a corresponding wavelength. In an embodiment, the intermediate layer 233 may include a semiconductor material with a composition formula of $In_xAl_yGa_{1-x-y}N$ ($0 \leq x \leq 1$, $0 \leq y \leq 1$, $0 \leq x+y \leq 1$), and may be formed in a single quantum well structure or a multi quantum well structure ("MQW"). In addition, the intermediate layer 233 may include a quantum wire structure or a quantum dot structure.

Although it is shown in FIG. 7B that the first semiconductor layer 231 includes a p-type semiconductor layer, and the second semiconductor layer 232 includes an n-type semiconductor layer, the disclosure is not limited thereto. In another embodiment, the first semiconductor layer 231 may include an n-type semiconductor layer, and the second semiconductor layer 232 includes a p-type semiconductor layer.

The display apparatus 1 in the embodiments may be used in various electronic apparatuses capable of displaying images. Here, the electronic apparatuses denote apparatuses that use electricity and may display preset images.

FIGS. 8A to 8G are schematic perspective views of embodiments of an electronic apparatus including the display apparatus in an embodiment, respectively.

Figure 8A:
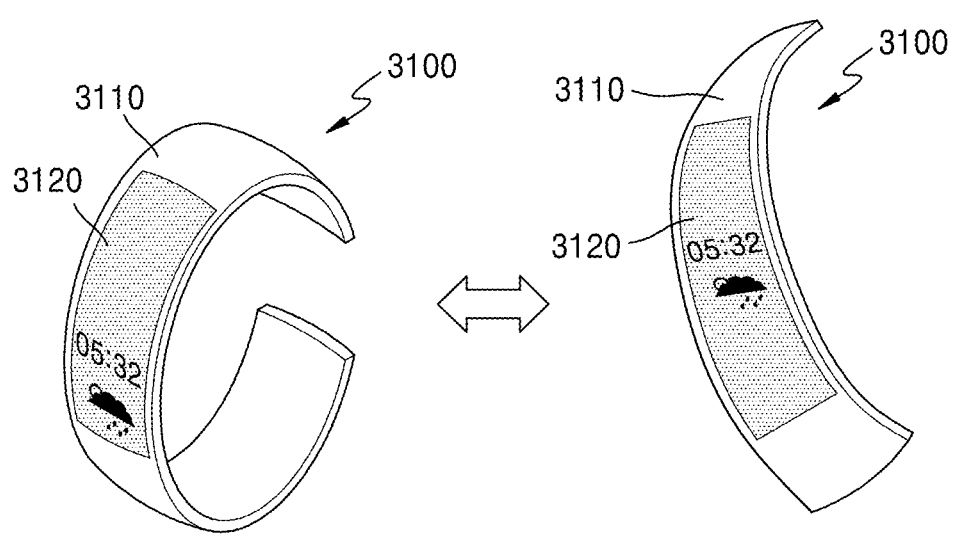
FIGS. 8A to 8G are schematic perspective views of embodiments of an electronic apparatus including the display apparatus.

Referring to FIG. 8A, the display apparatus in an embodiment may be utilized in a wearable electronic apparatus 3100 that may be worn on a portion of a user's body. The wearable electronic apparatus 3100 may include a body portion 3110 and a display 3120 provided to the body portion 3110. The display apparatus in embodiments may be used as the display 3120 of the wearable electronic apparatus 3100. As shown in FIG. 8A, the wearable electronic apparatus 3100 is transformable. In an embodiment, the wearable electronic apparatus 3100 may be used as a smartwatch or a smartphone depending on a user's selection.

Figure 8B:
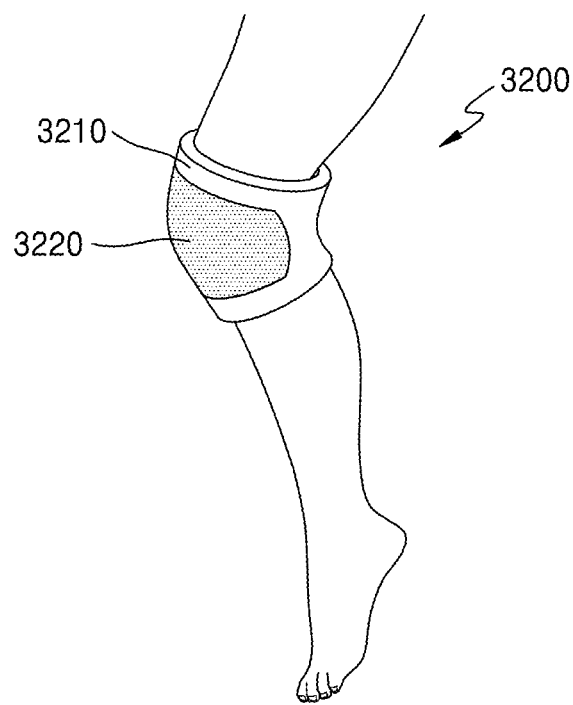

FIG. 8B shows a medical electronic apparatus 3200. In an embodiment, the medical electronic apparatus 3200 may include a body portion 3210 and an emission portion 3220. The display apparatus in embodiments may be used as the emission portion 3220 of the medical electronic apparatus 3200. The emission portion 3220 may emit light in a preset wavelength band (e.g., an infrared ray, a visible ray, or the like) to a patient's body. In an embodiment, the body portion 3210 may include a stretchable fiber material and may have a structure that may be worn on the body of the user who uses the emission portion.

Figure 8C:
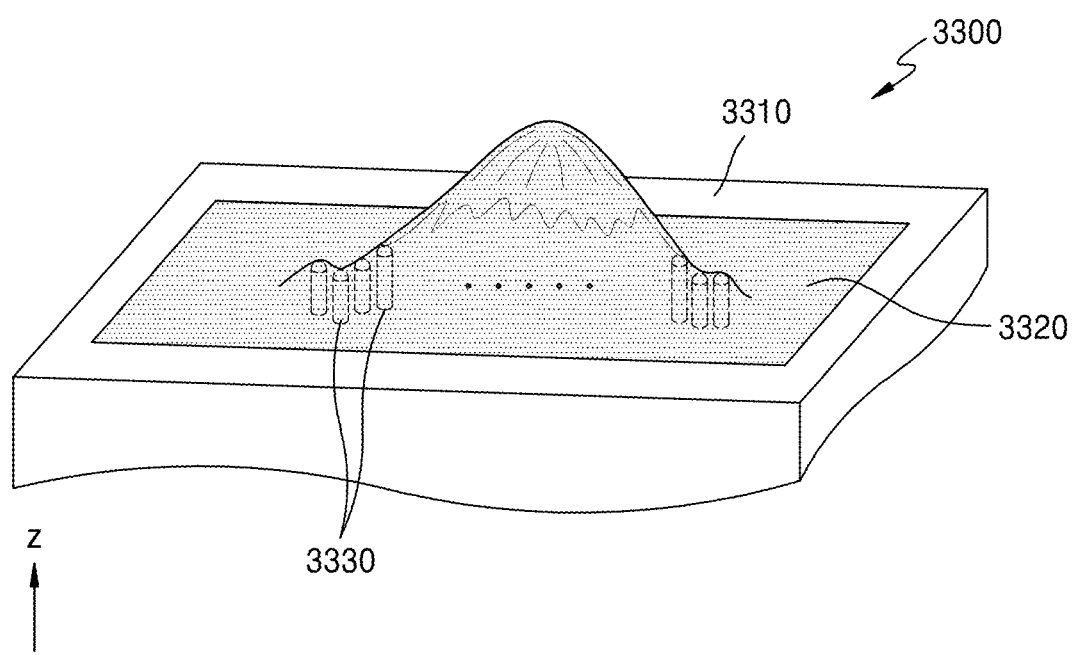

FIG. 8C shows an educational electronic apparatus 3300. In an embodiment, the educational electronic apparatus 3300 may include a display 3320 provided inside a frame 3310. The display 3320 may use the display apparatus. Images such as sea with waves, a mountain covered with snow, or a volcano with flowing lava may be provided through the display 3320, and in this case, the display 3320 may extend in the height direction (e.g., a z direction) to reflect the height of waves, mountains, or volcanoes. In an embodiment, because a portion of the display 3320 may show the movements of lava three dimensionally by sequentially changing its height in a direction in which the lava flows. The educational electronic apparatus 3300 may include a plurality of pins 3330 (or stroke portions) disposed on the backside of the display 3320 such that the display 3320 extends in a height direction. While the pins 3330 move in a third direction (e.g., z direction or −z direction), an image displayed on the display 3320 may be implemented to have a three-dimensional height. Although FIG. 8C illustrates the educational electronic apparatus 3300, its usage is not limited as long as it provides preset image information.

Although, as shown in FIGS. 8A to 8C, an electronic apparatus whose shape is variable is described, the disclosure is not limited thereto. As in embodiments described below, the display apparatus in embodiments may be used in an electronic apparatus in which a portion (e.g., a screen) capable of displaying images is fixed.

Figure 8D:
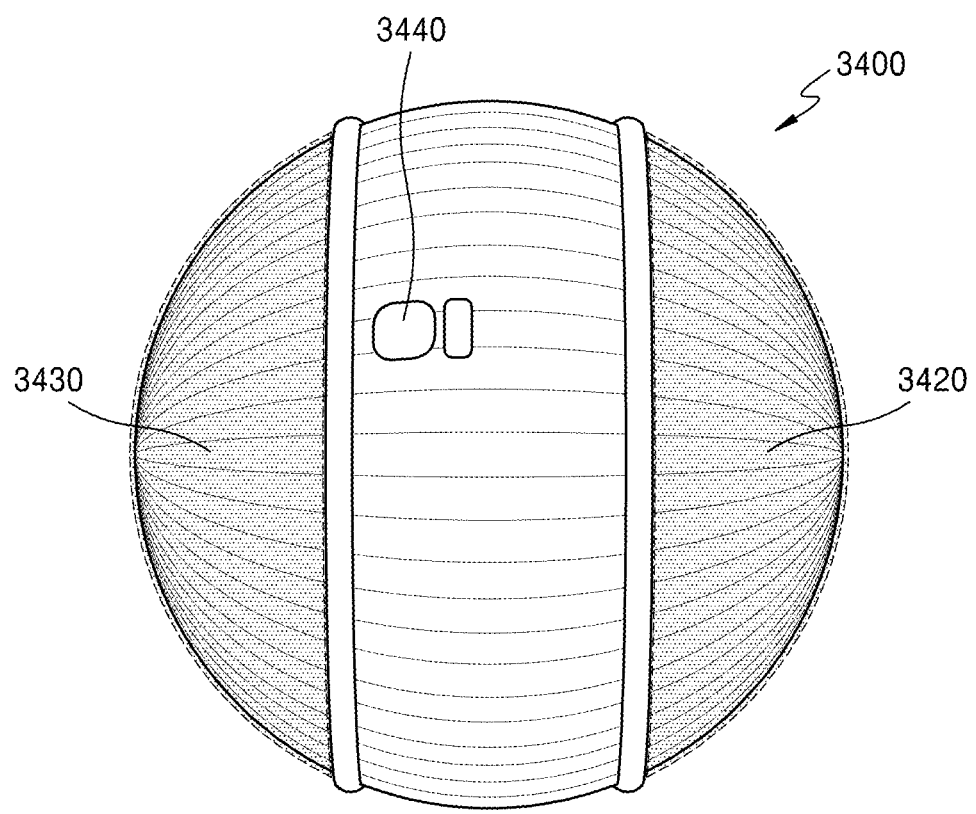

FIG. 8D shows a robot 3400 as an electronic apparatus. The robot 3400 may move or recognize an object by a camera portion 3440 and display preset images to a user through displays 3420 and 3430. In an embodiment, because the display apparatuses in an embodiment may be stretched in various directions as described above, the display apparatuses may be assembled to a body frame having a hemispherical shape, and thus, the robot 3400 may include the displays 3420 and 3430 having a hemispherical shape.

Figure 8E:
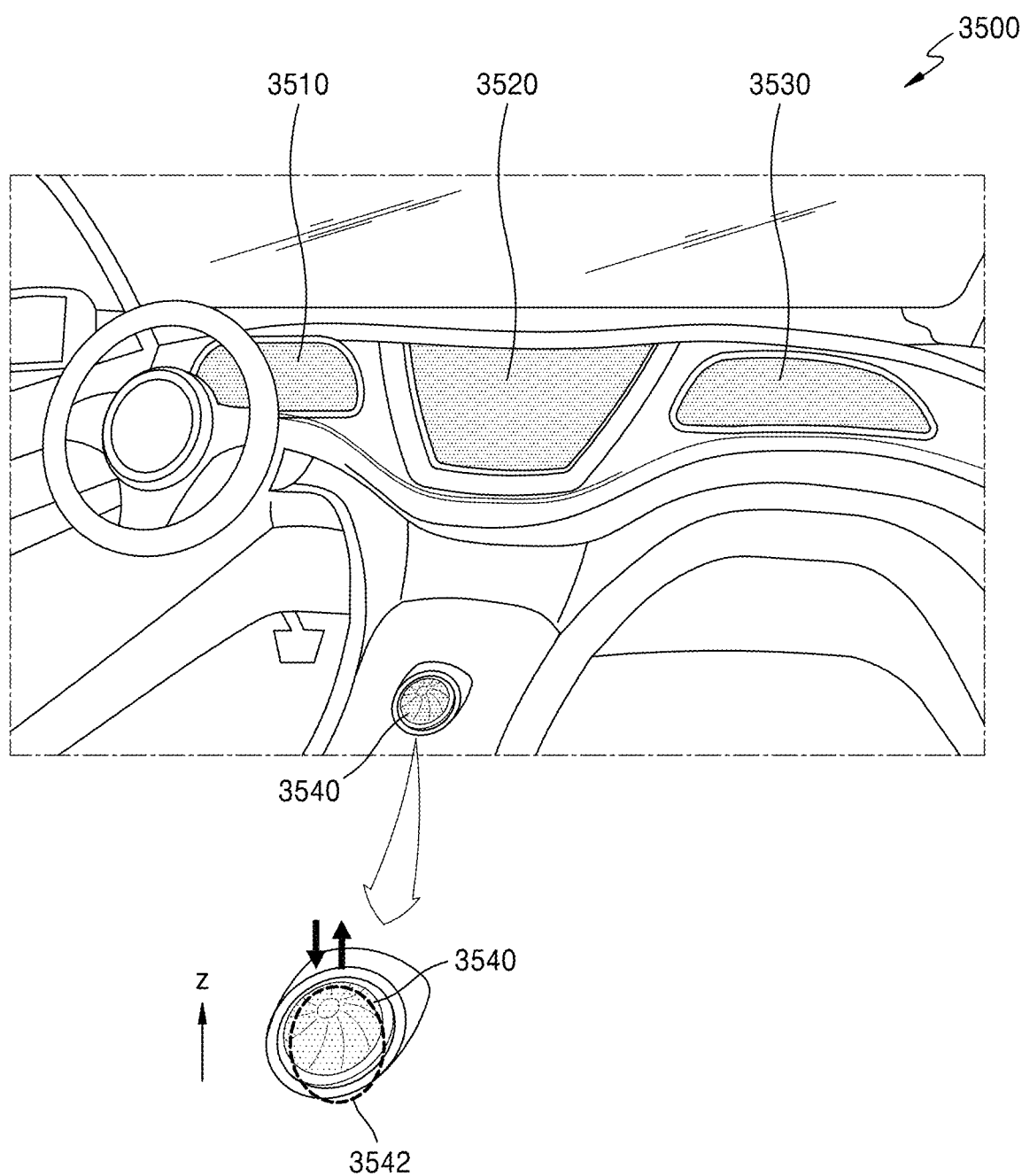

FIG. 8E shows a vehicle display apparatus 3500 in an embodiment of an electronic apparatus. The vehicle display apparatus 3500 may include a cluster 3510, a center information display ("CID") 3520, and/or a passenger display 3530. Because the display apparatus in an embodiment may be stretched in various directions, the display apparatus may be used as the cluster 3510, the CID 3520, and/or the passenger display (or a co-driver display) 3530 regardless of the shape of an internal frame of the vehicle.

Although it is shown in FIG. 8E that the cluster 3510 and the CID 3520, and/or the co-driver display 3530 are separated from each other, the disclosure is not limited thereto. In another embodiment, two or more of the cluster 3510, the CID 3520, and/or the co-driver display 3530 may be unitary.

In an embodiment, the vehicle display apparatus 3500 may include a button 3540 that may display preset images. Referring to FIG. 8E, the button 3540 of a hemispherical shape may include an object 3542 that provides feeling of using a button while moving in the z direction or the -z direction, and a display apparatus disposed on the object 3542. In an embodiment, in the case where the object 3542 has a surface rounded three-dimensionally, the display apparatus may also have a surface rounded three-dimensionally.

Figure 8F:
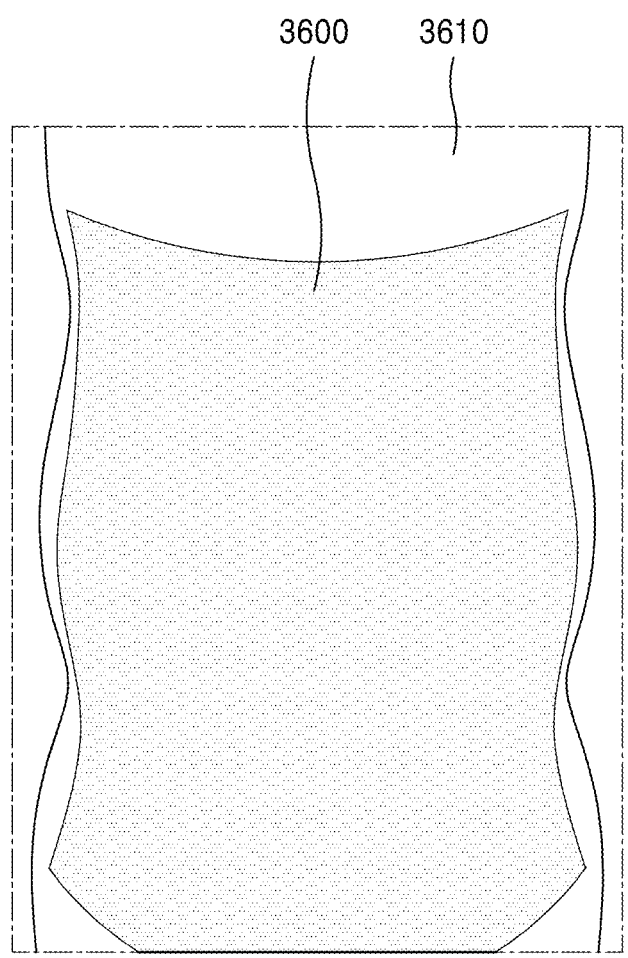

FIG. 8F shows an electronic apparatus in an embodiment is an electronic apparatus 3600 for advertising or exhibition. In an embodiment, the electronic apparatus 3600 for advertising or exhibition may be installed at a structure 3610 such as a wall or pillar. In the case where the structure 3610 includes an uneven surface as shown in FIG. 8F, the electronic apparatus 3600 for advertising or exhibition may be also disposed along the uneven surface of the structure 3610. In an embodiment, the electronic apparatus 3600 for advertising or exhibition may be installed at the structure 3610 using a heat shrink film or the like.

Figure 8G:
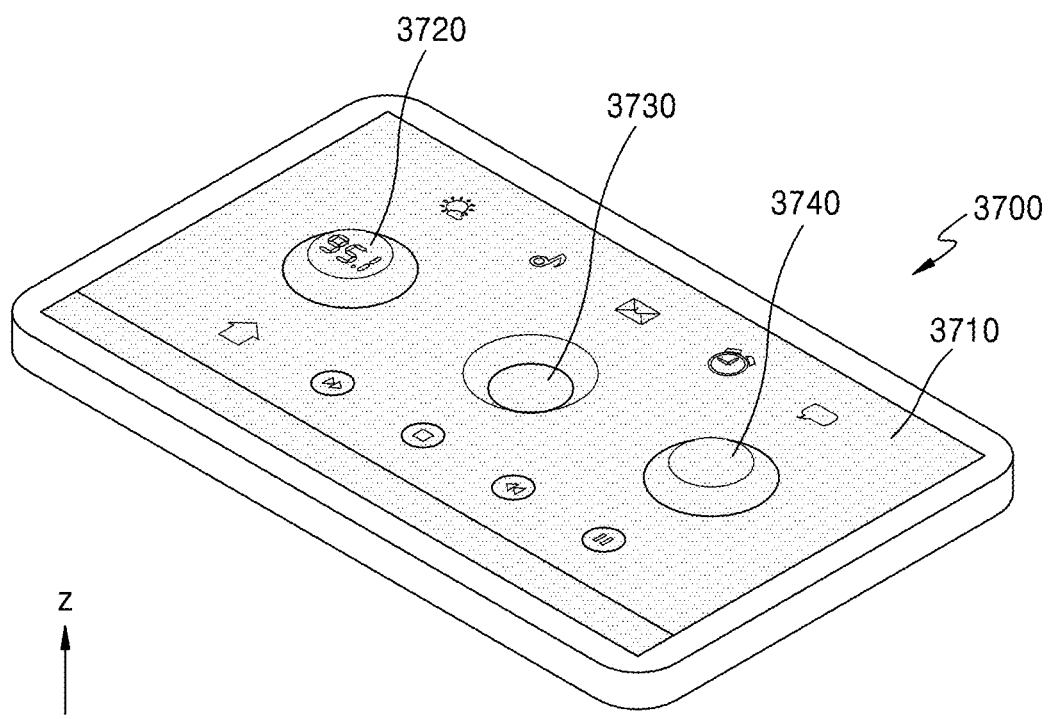

FIG. 8G shows that an electronic apparatus in an embodiment is a controller 3700. The controller 3700 may include an image type button. In an embodiment, the controller 3700 may include first to third button regions 3720, 3730, and 3740 in which a partial region of a display 3710 protrudes in the z direction or -z direction (or is depressed in the z direction). In an embodiment, the first and third button regions 3720 and 3740 may protrude in the z direction, and the second button region 3730 may protrude in the -z direction (be depressed in the z direction).

Figure 9:
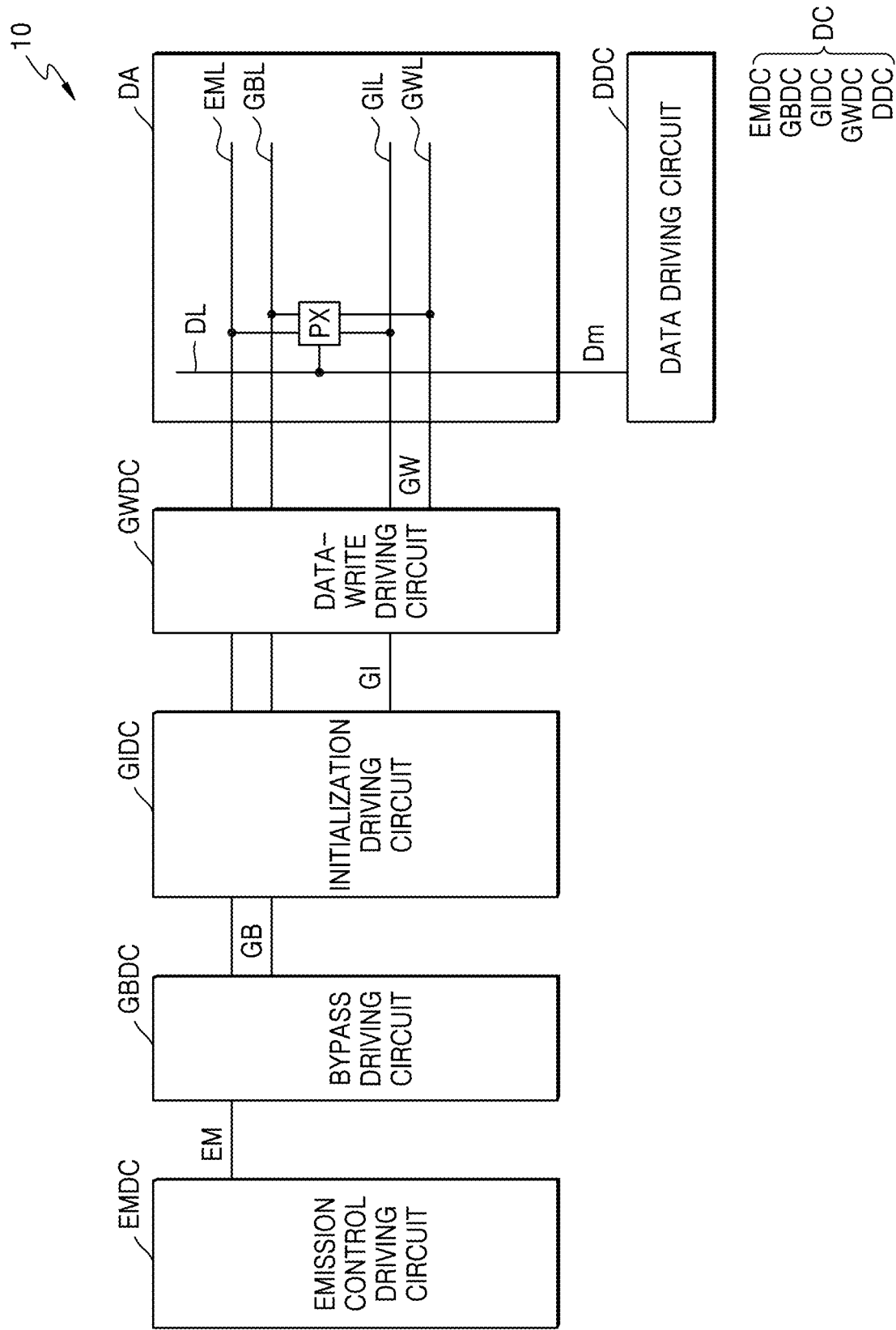
FIG. 9 is a schematic configuration view of an embodiment of a display apparatus.

FIG. 9 is a schematic configuration view of an embodiment of a display apparatus.

Referring to FIG. 9, a plurality of pixels PX and signal lines may be located in the display area DA, where the signal lines may apply electrical signals to the plurality of pixels PX. The signal lines which apply electrical signals to each of the plurality of pixels PX may include a plurality of data lines DL, a plurality of emission control lines EML, a plurality of scan signal lines GWL, a plurality of initialization control lines GIL, and a plurality of bypass control lines GBL.

A driving circuit DC of a display apparatus 10 may be disposed outside the display area DA, where the driving circuit DC supplies signals for driving the pixels PX. The driving circuit DC may include the data driving circuit DDC and the gate driving circuit GDC (refer to FIG. 3). The gate driving circuit GDC (refer to FIG. 3) may include an emission control driving circuit EMDC, a bypass driving circuit GBDC, an initialization driving circuit GIDC, and a data-write driving circuit GWDC. The data driving circuit DDC may be adjacent to the lower lateral side of the display area DA to be connected to the data lines DL, and may output a data signal Dm to the data lines DL.

The emission control driving circuit EMDC (or a first gate driving circuit), the bypass driving circuit GBDC (or a second gate driving circuit), the initialization driving circuit GIDC (or a third gate driving circuit), and the data-write driving circuit GWDC (or a fourth gate driving circuit) may be adjacent to the left lateral side or right lateral side of the display area DA. The emission control driving circuit EMDC may be connected to the emission control lines EML and may output an emission control signal EM to the emission control lines EML. The bypass driving circuit GBDC may be connected to the bypass control lines GBL and may output a bypass control signal GB to the bypass control lines GBL. The initialization driving circuit GIDC may be connected to the initialization control lines GIL and may output an initialization control signal GI to the initialization control lines GIL. The data-write driving circuit GWDC may be connected to the scan signal lines GWL and may output a scan signal.

Figure 10:
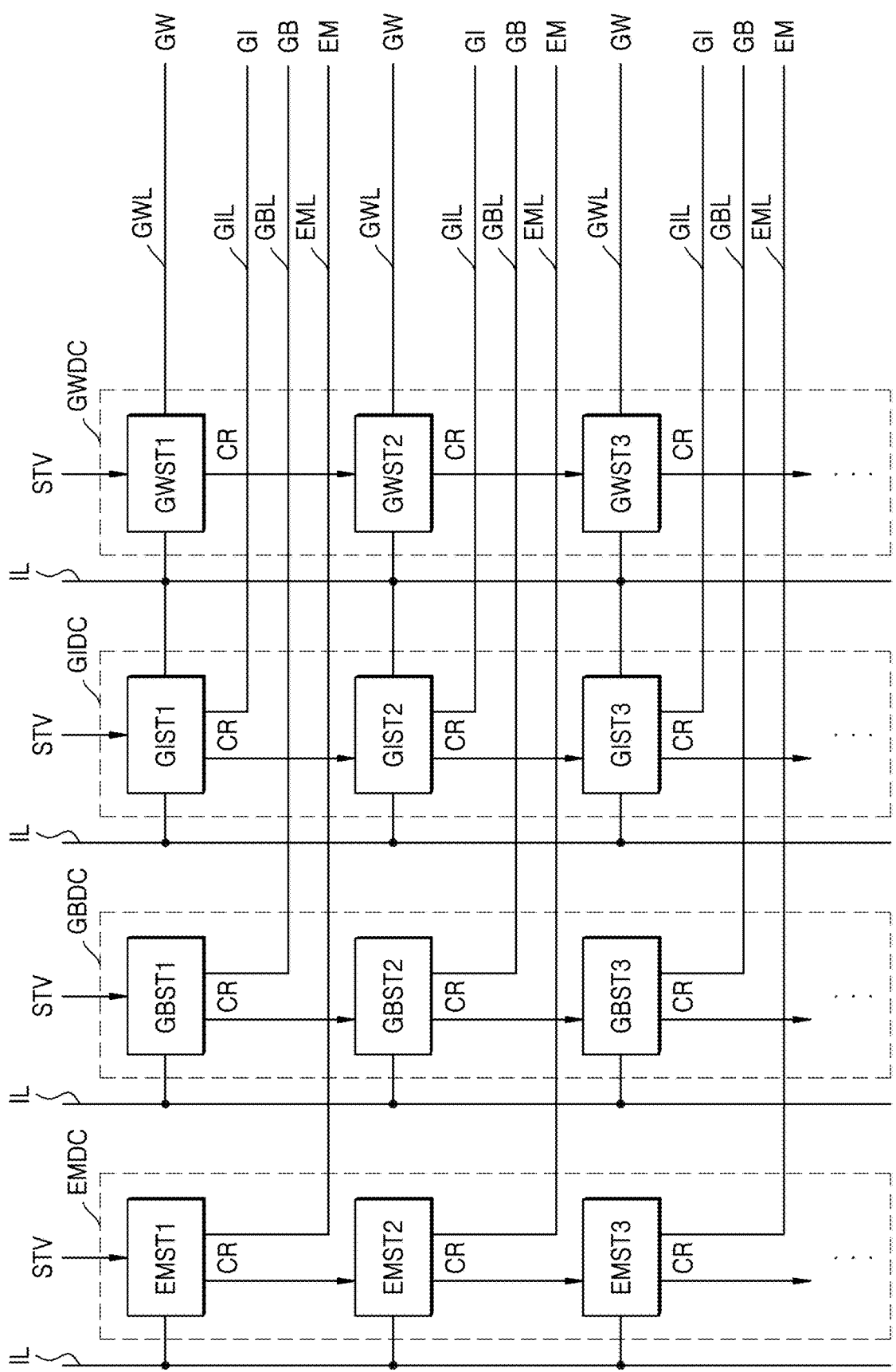
FIG. 10 is a schematic view of an embodiment of a gate driving circuit of a display apparatus.

FIG. 10 is a schematic view of an embodiment of a gate driving circuit. FIG. 10 is a schematic configuration view of the emission control driving circuit EMDC, the bypass driving circuit GBDC, the initialization driving circuit GIDC, and the data-write driving circuit GWDC.

Referring to FIG. 10, the emission control driving circuit EMDC may be implemented as a shift register including a plurality of emission control stages EMST1, EMST2, EMST3, . . . . Each of the emission control stages EMST1, EMST2, EMST3, . . . may include a sub-driving circuit. Each of the emission control stages EMST1, EMST2, EMST3, . . . may be connected to an emission control line EML corresponding thereto, and may output an emission control signal EM to the emission control line EML corresponding thereto. The first emission control stage EMST1 may output an emission control signal EM in response to an external start signal STV, and each of the remaining emission control stages EMST2, EMST3, . . . other than the first emission control stage EMST1 may receive, as a start signal, a carry signal CR output from the previous stage. Each of the emission control stages EMST1, EMST2, EMST3, . . . may be connected to a plurality of input lines IL arranged outside the emission control stages EMST1, EMST2, EMST3, . . . .

The bypass driving circuit GBDC may be implemented as a shift register including a plurality of bypass stages GBST1, GBST2, and GBST3, . . . . Each of the bypass stages GBST1, GBST2, and GBST3, . . . may be a sub-driving circuit. Each of the bypass stages GBST1, GBST2, and GBST3, . . . may be connected to a bypass control line GBL corresponding thereto, and may output a bypass control signal GB to the bypass control line GBL corresponding thereto. The first bypass stage GBST1 may output a bypass control signal GB in response to an external start signal STV, and each of the remaining bypass stages GBST2, GBST3 other than the first bypass stage GBST1 may receive, as a start signal, a carry signal CR output from the previous stage. Each of the bypass stages GBST1, GBST2, and GBST3, . . . may be connected to a plurality of input lines IL arranged outside the bypass stages GBST1, GBST2, and GBST3, . . . .

The initialization driving circuit GIDC may be implemented as a shift register including a plurality of initialization stages GIST1, GIST2, GIST3, . . . . Each of the initialization stages GIST1, GIST2, GIST3, . . . may be a sub-driving circuit. Each of the initialization stages GIST1, GIST2, GIST3, . . . may be connected to an initialization control line GIL, and may output an initialization control signal GI to an initialization control line GIL corresponding thereto. The first initialization stage GIST1 may output an initialization control signal GI in response to an external start signal STV, and each of the remaining stages GIST2, GIST3, . . . other than the first initialization stage GIST1 may receive, as a start signal, a carry signal CR output from the previous stage. Each of the initialization stages GIST1, GIST2, GIST3, . . . may be connected to a plurality of input lines IL arranged outside the emission control stages EMST1, EMST2, EMST3, . . . .

The data-write driving circuit GWDC may be implemented as a shift register including a plurality of data-write stages GWST1, GWST2, GWST3, . . . . Each of the data-write stages GWST1, GWST2, GWST3, . . . may be a sub-driving circuit. Each of the data-write stages GWST1, GWST2, GWST3, . . . may be connected to a scan signal line GWL corresponding thereto, and may output a scan signal GW to the scan signal line GWL corresponding thereto. The first data-write stage GWST1 may output a scan signal GW in response to an external start signal STV, and each of the remaining data-write stages GWST2, GWST3, . . . other than the first data-write stage GWST1 may receive, as a start signal, a carry signal CR output from the previous stage. Each of the data-write stages GWST1, GWST2, GWST3, . . . may be connected to a plurality of input lines IL arranged outside the data-write stages GWST1, GWST2, GWST3, . . . .

The plurality of input lines IL may be signal lines including a plurality of voltage lines and a plurality of clock lines. For convenience of illustration, FIG. 10 shows only one input line. The plurality of input lines IL may include a gate-high voltage line VGH (refer to FIG. 13), a gate-low voltage line VGL (refer to FIG. 13), a start signal line FLM (refer to FIG. 13), a first clock line CLK1 (refer to FIG. 13), a second clock line CLK2 (refer to FIG. 13), a carry line CRL, and a reset signal line ESR (refer to FIG. 13).

Figure 11A:
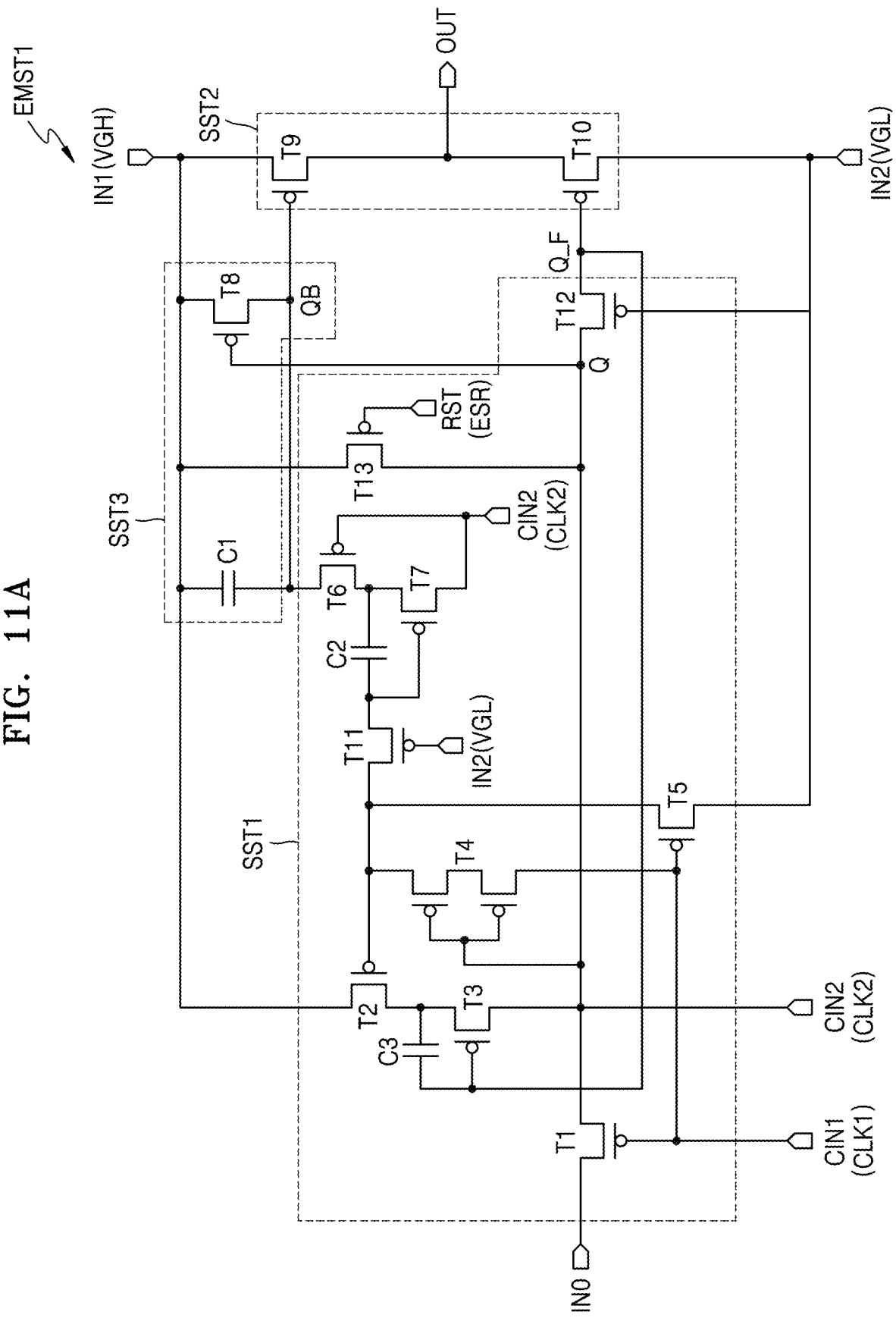
FIG. 11A is a circuit diagram of an embodiment of a first emission control stage included in the gate driving circuit of FIG. 10.
Figure 11B:
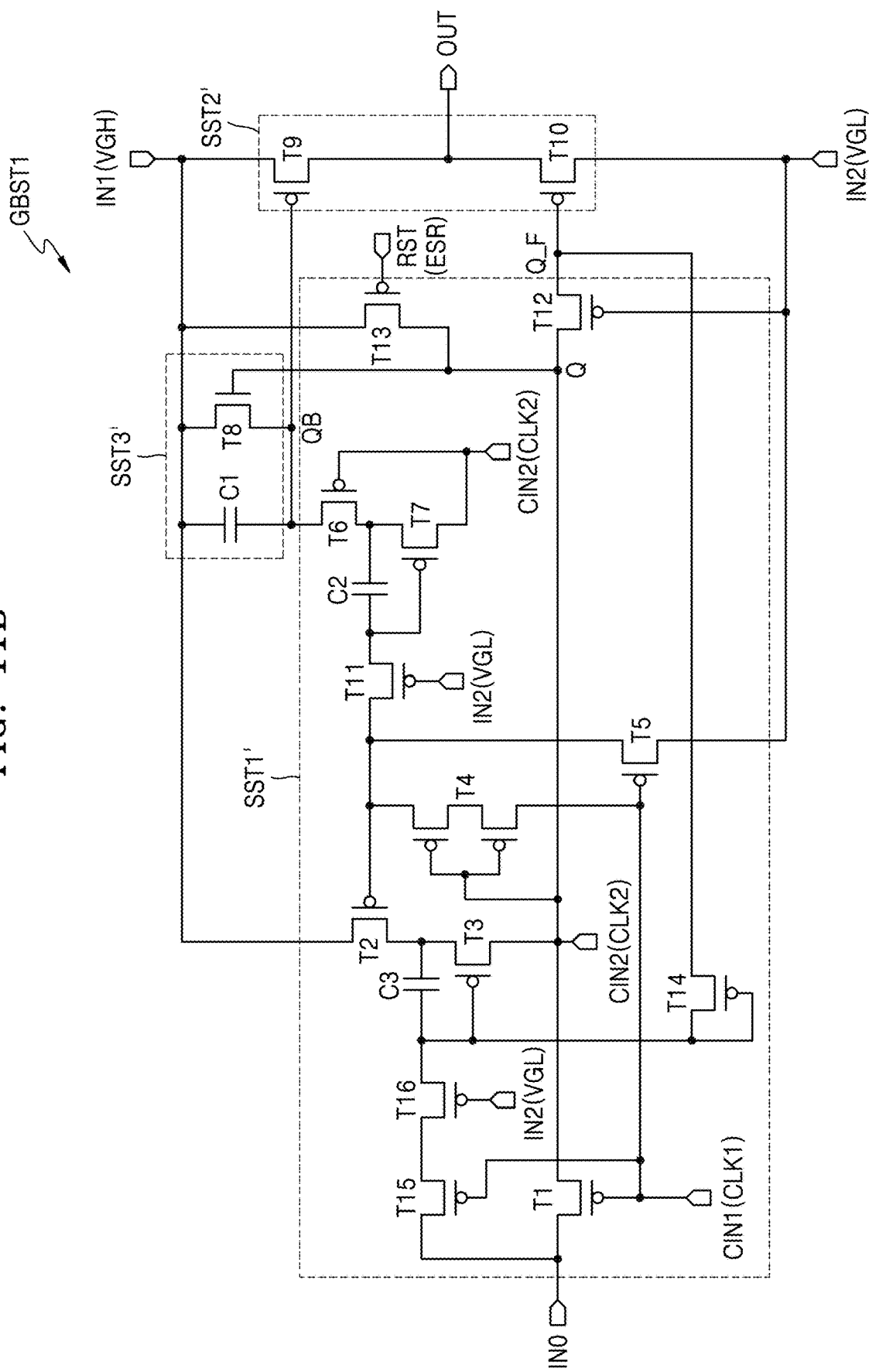
FIG. 11B is a circuit diagram of an embodiment of a first bypass stage included in the gate driving circuit of FIG. 10.
Figure 11C:
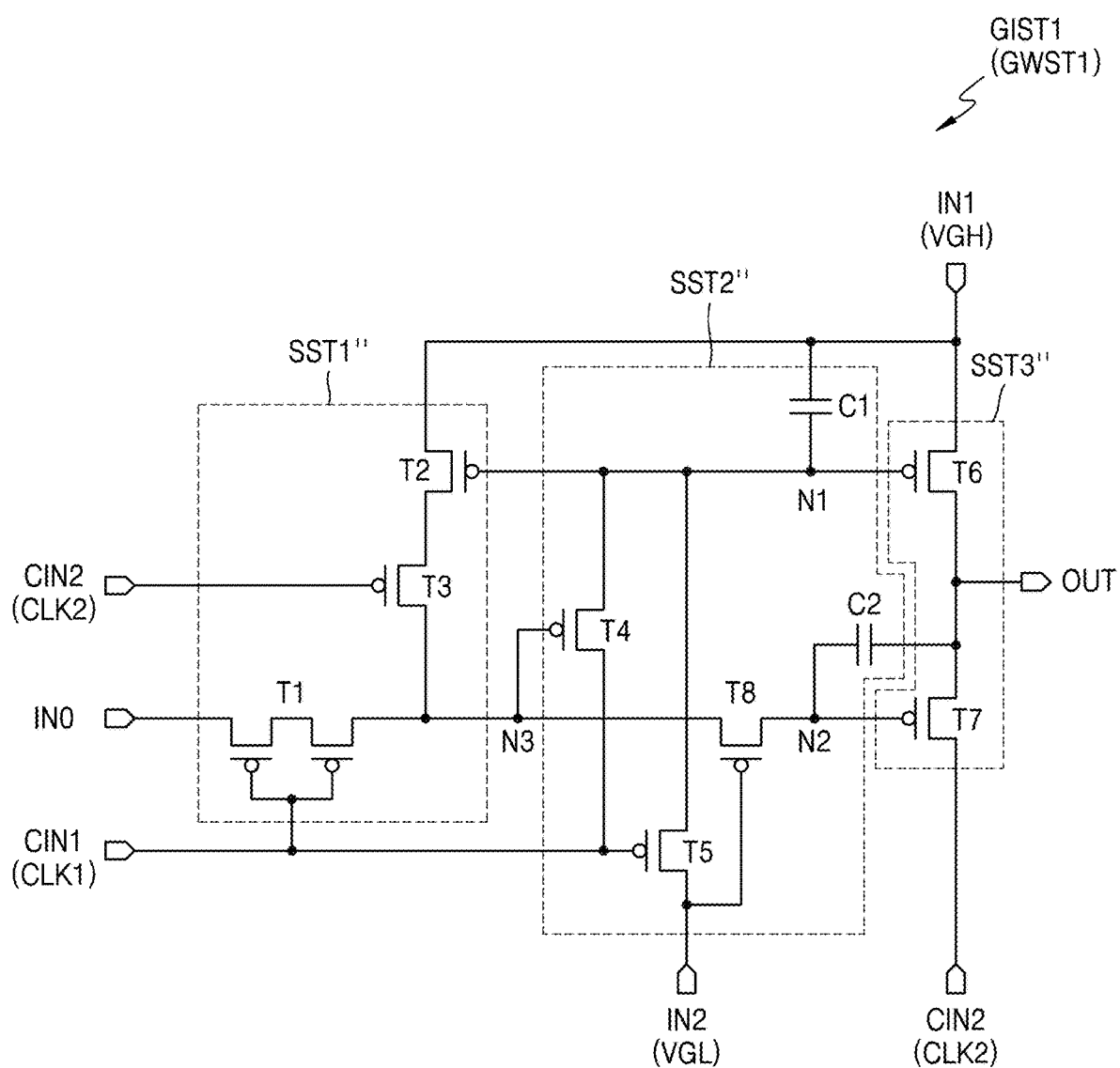
FIG. 11C is a circuit diagram of an embodiment of a first initialization stage included in the gate driving circuit of FIG. 10.

FIG. 11A is a circuit diagram of a first emission control stage included in the gate driving circuit of FIG. 10 in an embodiment, FIG. 11B is a circuit diagram of a first bypass stage included in the gate driving circuit of FIG. 10 in an embodiment, and FIG. 11C is a circuit diagram of a first initialization stage included in the gate driving circuit of FIG. 10.

First, referring to FIG. 11A, the first emission control stage EMST1 may include an input terminal IN0, a first power input terminal IN1, a second power input terminal IN2, a first clock input terminal CIN1, a second clock input terminal CIN2, a reset terminal RST, and an output terminal OUT. An inner circuit configuration of the first emission control stage EMST1 may be substantially the same as those of the other emission control stages.

Figure 13:
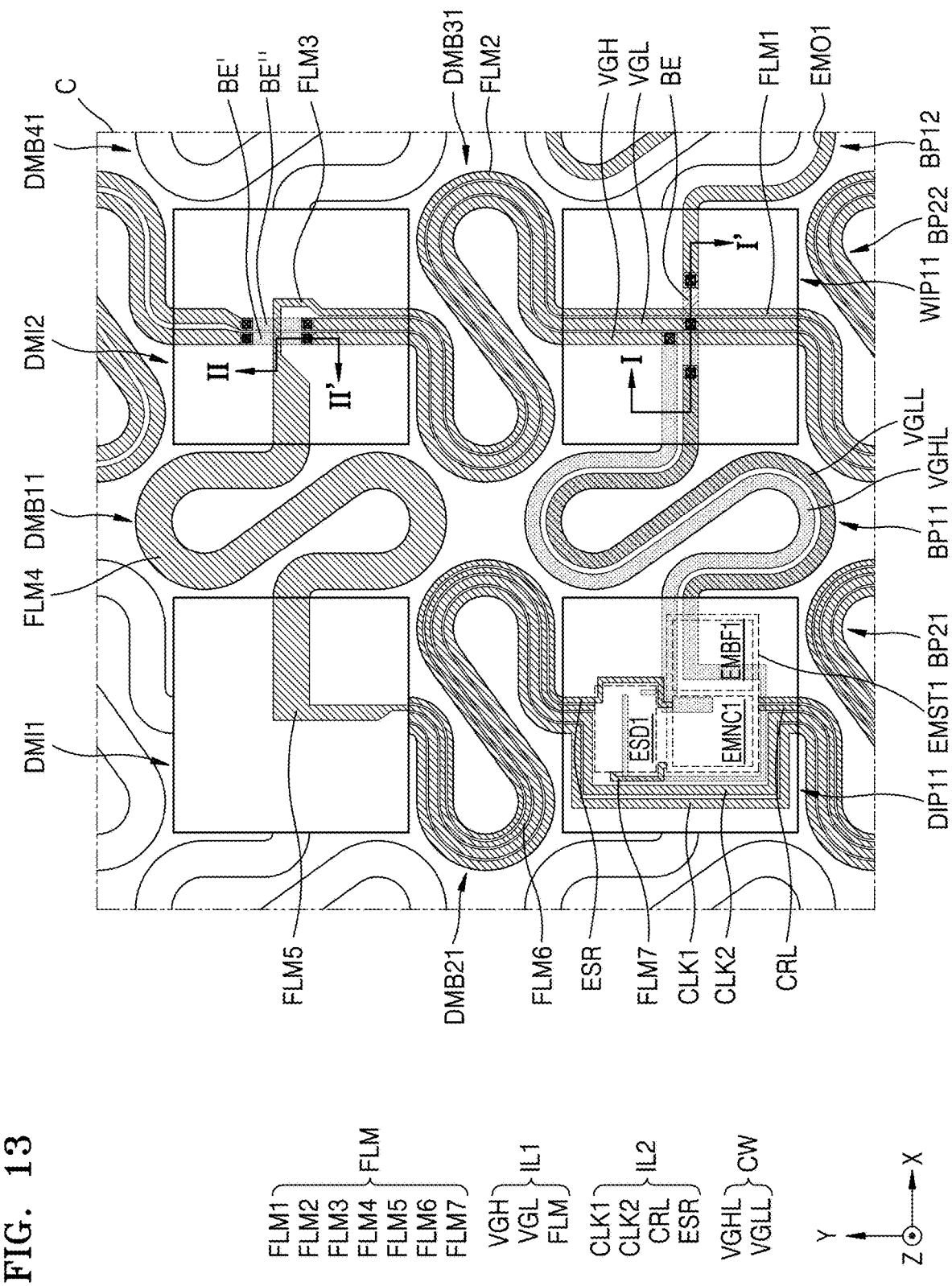
FIG. 13 is a schematic enlarged plan view of an embodiment of a portion of the display apparatus and an enlarged view of a region C of FIG. 12.

The first power input terminal IN1 may be connected to the gate-high voltage line VGH (refer to FIG. 13), the second power input terminal IN2 may be connected to the gate-low voltage line VGL (refer to FIG. 13), and the reset terminal RST may be connected to the reset signal line ESR (refer to FIG. 13). In addition, the first clock input terminal CIN1 may be connected to the first clock line CLK1, and the second clock input terminal CIN2 may be connected to the second clock line CLK2. The input terminal IN0 may be connected to the start signal line FLM (refer to FIG. 13), and another emission control stages other than the first emission control stage EMST1 may be connected to the carry line CRL (refer to FIG. 13) connected to an output terminal OUT of the previous stage.

The first emission control stage EMST1 may include a node controller SST1, an output portion SST2 (or buffer), and a node sustain portion SST3.

First, the output portion SST2 may be connected to the first power input terminal IN1 and the second power input terminal IN2. The output portion SST2 may output a gate power voltage as a first gate signal to the output terminal OUT based on a voltage of a second control node Q_F and a voltage of a first control node QB.

The output portion SST2 may include the ninth transistor T9 (or a pull-up transistor) and a tenth transistor T10 (or a pull-down transistor). The ninth transistor T9 may include a first electrode, a second electrode, and a gate electrode, where the first electrode is connected to the first power input terminal, the second electrode is connected to the output terminal OUT, and the gate electrode is connected to the first control node QB.

The tenth transistor T10 may include a first electrode, a second electrode, and a gate electrode, where the first electrode is connected to the output terminal OUT, the second electrode is connected to the second power input terminal IN2, and the gate electrode is connected to the second control node Q_F.

The node controller SST1 may be connected to the input terminal IN0, the first power input terminal IN1, the second power input terminal IN2, the first clock input terminal CIN1, and the second clock input terminal CIN2. The node controller SST1 may control the voltage of the first control node QB and the voltage of the second control node Q_F by a start signal (or a previous gate signal) provided through the input terminal IN0 and a gate-high voltage transferred from the gate-high voltage line VGH.

The node controller SST1 may include the first, second, third, fourth, fifth, sixth, seventh, eleventh, twelfth, and thirteenth transistors T1, T2, T3, T4, T5, T6, T7, T11, T12, and T13, a second capacitor C2, and a third capacitor C3.

The first transistor T1 may include a first electrode, a second electrode, and a gate electrode, where the first electrode is connected to the input terminal IN0, the second electrode is connected to a third control node Q (or a first electrode of the twelfth transistor T12), and the gate electrode is connected to the first clock input terminal CIN1. The second transistor T2 may include a first electrode, a second electrode, and a gate electrode, where the first electrode is connected to the first power input terminal IN1, the second electrode is connected to a first electrode of the third transistor T3, and the gate electrode is connected to a first electrode of the eleventh transistor T11.

The third transistor T3 may include a first electrode, a second electrode, and a gate electrode, where the first electrode is connected to a second electrode of the second transistor T2, the second electrode of the third transistor T3 is connected to the second clock input terminal CIN2, and the gate electrode is connected to the second control node Q_F. The third capacitor C3 may be formed between the second electrode of the second transistor T2 and the second control node Q_F, and may include a first electrode and a second electrode, where the first electrode of the third capacitor C3 is connected to the second electrode of the second transistor T2, and the second electrode of the third capacitor C3 is connected to the second control node Q_F.

The fourth transistor T4 is provided as a pair of transistors and connected in series between the gate electrode of the second transistor T2 and the first clock input terminal CIN1 and may include a gate electrode connected to the third control node Q. The fifth transistor T5 may include a first electrode, a second electrode, and a gate electrode, where the first electrode is connected to the gate electrode of the second transistor T2, the second electrode is connected to the second power input terminal IN2, and the gate electrode is connected to the first clock input terminal CIN1.

The sixth transistor T6 may include a first electrode, a second electrode, and a gate electrode, where the first electrode is connected to the first control node QB, the second electrode is connected to a first electrode of the seventh transistor T7, and the gate electrode is connected to the second clock input terminal CIN2. The seventh transistor T7 may include a first electrode, a second electrode, and a gate electrode, where the first electrode is connected to the second electrode of the sixth transistor T6, the second electrode of the seventh transistor T7 is connected to the second clock input terminal CIN2, and the gate electrode is connected to a second electrode of the eleventh transistor T11.

The second capacitor C2 is formed between a second electrode of the eleventh transistor T11 and the second electrode of the sixth transistor T6, and may include a first electrode and a second electrode, where the first electrode of the second capacitor C2 is connected to the second electrode of the eleventh transistor T11, and the second electrode of the second capacitor C2 is connected to the second electrode of the sixth transistor T6. The eleventh transistor T11 may include a first electrode, a second electrode, and a gate electrode, where the first electrode of the eleventh transistor T11 is connected to the gate electrode of the second transistor T2, and the second electrode of the eleventh transistor T11 is connected to the first electrode of the second capacitor C2, and the gate electrode of the eleventh transistor T11 is connected to the second power input terminal IN2.

The twelfth transistor T12 may include a first electrode, a second electrode, and a gate electrode, where the first electrode of the twelfth transistor T12 is connected to the third control node Q (or the second electrode of the first transistor T1), the second electrode of the twelfth transistor T12 is connected to the second control node Q_F, and the gate electrode of the twelfth transistor T12 is connected to the second power input terminal IN2. The thirteenth transistor T13 may include a first electrode, a second electrode, and a gate electrode, where the first electrode of the thirteenth transistor T13 is connected to the first power input terminal IN1, the second electrode of the thirteenth transistor T13 is connected to the third control node Q (or the second electrode of the first transistor T1), and the gate electrode of the thirteenth transistor T13 is connected to the reset terminal RST. Here, the reset terminal RST may be connected to the reset signal line ESR (refer to FIG. 13). In the case where the display apparatus is turned on or turned off, a reset signal of a relatively low level is applied to the reset terminal RST, the thirteenth transistor T13 is turned on in response to a reset signal of a logic relatively low level and may perform a reset operation such that a voltage of the second electrode (and the third control node Q) of the first transistor T1 has a relatively high level.

The node sustain portion SST3 may sustain a constant voltage of the first control node QB in response to the voltage of the third control node Q. The node sustain portion SST3 may include the first capacitor C1 and the eighth transistor T8.

The first capacitor C1 is formed between the first power input terminal IN1 and the first control node QB and may include a first electrode and a second electrode, where the first electrode is connected to the first power input terminal IN1, and the second electrode is connected to the first control node QB. The first capacitor C1 may keep a voltage difference between the first power input terminal IN1 and the first control node QB constant.

The eighth transistor T8 may include a first electrode, a second electrode, and a gate electrode, where the first electrode is connected to the first power input terminal IN1, the second electrode is connected to the first control node QB, and the gate electrode is connected to the third control node Q. The eighth transistor T8 may maintain the voltage of the first control node QB constant in response to the voltage of the third control node Q. In an embodiment, in the case where the voltage of the third control node Q has a relatively low level, the eighth transistor T8 may maintain the voltage of the first control node QB at a relatively high level using a gate-high voltage.

Each of the first to thirteenth transistors T1, T2, T3, T4, T5, T6, T7, T8, T9, T10, T11, T12, and T13 may be a p-type transistor. Although it is shown in FIG. 11A that the first to twelfth transistors T1, T2, T3, T4, T5, T6, T7, T8, T9, T10, T11, and T12 are single-gate transistors, the disclosure is not limited thereto. In an embodiment, to improve reliability, at least one of the first to twelfth transistors T1, T2, T3, T4, T5, T6, T7, T8, T9, T10, T11, and T12 may be implemented as a dual-gate transistor.

An emission control signal EM (refer to FIG. 10) output from the first emission control stage EMST1 having the above construction may be transferred to the emission control line EML (refer to FIG. 10) corresponding thereto through an emission control output line corresponding thereto. In addition, a signal output from the first emission control stage EMST1 may be transferred to the second emission control stage EMST2 (refer to FIG. 10) disposed in the next stage of the first emission control stage EMST1 through the carry line CRL (refer to FIG. 13).

Next, referring to FIG. 11B, the first bypass stage GBST1 may include the input terminal IN0, the first power input terminal IN1, the second power input terminal IN2, the first clock input terminal CIN1, the second clock input terminal CIN2, the reset terminal RST, and the output terminal OUT. An inner circuit configuration of the first bypass stage GBST1 may be substantially the same as those of another bypass stages.

The first power input terminal IN1 may be connected to the gate-high voltage line VGH (refer to FIG. 13), the second power input terminal IN2 may be connected to the gate-low voltage line VGL (refer to FIG. 13), and the reset terminal RST may be connected to the reset signal line ESR (refer to FIG. 13). In addition, the first clock input terminal CIN1 may be connected to the first clock line CLK1, and the second clock input terminal CIN2 may be connected to the second clock line CLK2. The input terminal IN0 may be connected to the start signal line FLM (refer to FIG. 13), and the other bypass stages other than the first bypass stage GBST1 may be connected to the carry line CRL (refer to FIG. 13) connected to the output terminal OUT of the previous stage.

The first bypass stage GBST1 may include a node controller SST1', an output portion SST2' (or buffer), and a node sustain portion SST3'. The first bypass stage GBST1 may be substantially equal or similar to the first emission control stage EMST1 except for fourteenth to sixteenth transistors T14, T15, and T16. Accordingly, repeated descriptions are omitted.

The first bypass stage GBST1 may further include the fourteenth to sixteenth transistors T14, T15, and T16.

The fourteenth transistor T14 may include a first electrode, a second electrode, and a gate electrode, where the first electrode of the fourteenth transistor T14 is connected to the gate electrode of the third transistor T3, the second electrode of the fourteenth transistor T14 is connected to the second control node Q_F, and the gate electrode of the fourteenth transistor T14 is connected to the gate electrode of the third transistor T3. That is, the fourteenth transistor T14 may be diode-connected between the gate electrode of the third transistor T3 and the second control node Q_F. After a predetermined time point, the fourteenth transistor T14 may maintain the voltage of the second control node Q_F constant regardless of a voltage change of the gate electrode of the third transistor T3.

The fifteenth transistor T15 may include a first electrode, a second electrode, and a gate electrode, where the first electrode of the fifteenth transistor T15 is connected to the input terminal IN0, the second electrode of the fifteenth transistor T15 is connected to a first electrode of the sixteenth transistor T16, and the gate electrode of the fifteenth transistor T15 is connected to the first clock input terminal CIN1. The fifteenth transistor T15 is initialize the gate electrode of the third transistor T3 by a start signal (or a previous compensation gate signal) provided to the input terminal IN0 in response to a first clock signal provided through the first clock input terminal CIN1.

The sixteenth transistor T16 may include a first electrode, a second electrode, and a gate electrode, where the first electrode of the sixteenth transistor T16 is connected to the second electrode of the fifteenth transistor T15, the second electrode of the sixteenth transistor T16 is connected to the gate electrode of the third transistor T3, and the gate electrode of the sixteenth transistor T16 is connected to the second power input terminal IN2. The sixteenth transistor T16 may reduce or distribute a bias voltage applied to the fifteenth transistor T15 between the input terminal IN0 and the gate electrode of the third transistor T3.

A bypass control signal GB (refer to FIG. 10) output from the first bypass stage GBST1 having the above configuration may be transferred to the bypass control line GBL (refer to FIG. 10) corresponding thereto through the output line corresponding thereto. In addition, a signal output from the first bypass stage GBST1 may be transferred to the second bypass stage GBST2 (refer to FIG. 10) disposed in the next stage of the first bypass stage GBST1 through the carry line CRL (refer to FIG. 15).

Next, referring to FIG. 11C, the first initialization stage GIST1 may include the input terminal IN0, the first power input terminal IN1, the second power input terminal IN2, the first clock input terminal CIN1, the second clock input terminal CIN2, and the output terminal OUT. An inner circuit configuration of the first initialization stage GIST1 may be the same as an inner circuit configuration of the first data-write stage GWST1. In addition, the inner circuit configuration of the first initialization stage GIST1 may be substantially the same as other initialization stages, and the inner circuit configuration of the first data-write stage GWST1 may be substantially the same as other data-write stages.

The first power input terminal IN1 may be connected to the gate-high voltage line VGH (refer to FIG. 13), and the second power input terminal IN2 may be connected to the gate-low voltage line VGL (refer to FIG. 13). In addition, the first clock input terminal CIN1 may be connected to the first clock line CLK1, and the second clock input terminal CIN2 may be connected to the second clock line CLK2. The input terminal IN0 may be connected to the start signal line FLM (refer to FIG. 13), and the other initialization stages other than the first initialization stage GIST1 may be connected to the carry line CRL (refer to FIG. 13) connected to the output terminal OUT of the previous stage.

The first initialization stage GIST1 may include a first node controller SST1", a second node controller SST2", and an output portion SST3".

The output portion SST3" may control a voltage supplied to the output terminal OUT according to voltages of the first node N1 and the second node N2. For this purpose, the output portion SST3" may include the sixth transistor T6 and the seventh transistor T7. The output portion SST3 may operate as a buffer. The sixth transistor T6 and the seventh transistor T7 included in the output portion SST3" may be connected in parallel to each other as shown.

The sixth transistor T6 may be connected between the first power input terminal IN1 connected to the gate-high voltage line VGH, and the output terminal OUT. The sixth transistor T6 may control connection between the first power input terminal IN1 and the output terminal OUT according to a voltage applied to the first node N1. The sixth transistor T6 may include a first electrode, a second electrode, and a gate electrode, where the first electrode of the sixth transistor T6 is connected to the first power input terminal IN1, the second electrode is connected to the output terminal OUT, and the gate electrode is connected to the first node N1.

The seventh transistor T7 may be connected between the output terminal OUT and the second clock input terminal CIN2 connected to the second clock line CLK2. The seventh transistor T7 may control connection between the output terminal OUT and the second clock input terminal CIN2 according to a voltage applied to the second node N2. The seventh transistor T7 may include a first electrode, a second electrode, and a gate electrode, where the first electrode of the seventh transistor T7 is connected to the output terminal OUT, the second electrode of the seventh transistor T7 is connected to the second clock input terminal CIN2, and the gate electrode of the seventh transistor T7 is connected to the second node N2.

The first node controller SST1" may control the voltage of the third node N3 according to signals supplied to the input terminal IN0, the first clock input terminal CIN1, and the second clock input terminal CIN2. For this purpose, the first node controller SST1" may include the first transistor T1, the second transistor T2, and the third transistor T3.

The first transistor T1 may be connected between the input terminal IN0 to which a start signal (or a previous gate signal 0 is applied, and the third node N3. The first transistor T1 may control connection between the input terminal IN0 and the third node N3 through a first clock signal supplied to the first clock input terminal CIN1. The first transistor T1 may be provided to have a dual-gate structure to prevent a leakage current. The first transistor T1 may be provided as a pair of transistors and connected in series between the input terminal IN0 and the third node N3, and may include a gate connected to the first clock input terminal CIN1.

The second transistor T2 and the third transistor T3 may be connected in series between the third node N3 and the first power input terminal IN1. The third transistor T3 may be connected between the second transistor T2 and the third node N3. The third transistor T3 may control connection between the second transistor T2 and the third node N3 according to a second clock signal supplied to the second clock input terminal CIN2. The third transistor T3 may include a first electrode, a second electrode, and a gate electrode, where the first electrode of the third transistor T3 is connected to the second electrode of the second transistor T2, the second electrode of the third transistor T3 is connected to the third node N3, and the gate electrode of the third transistor T3 is connected to the second clock input terminal CIN2.

The second transistor T2 may be connected between the third transistor T3 and the first power input terminal IN1. The second transistor T2 may control connection between the third transistor T3 and the first power input terminal IN1 according to the voltage of the first node N1. The second transistor T2 may include a first electrode, a second electrode, and a gate electrode, where the first electrode of the second transistor T2 is connected to the first power input terminal IN1, the second electrode of the second transistor T2 is connected to the first electrode of the third transistor T3, and the gate electrode of the second transistor T2 is connected to the first node N1.

The second node controller SST2" may control the voltage of the first node N1 according to the voltages of the first clock input terminal CIN1 and the third node N3. For this purpose, the second node controller SST2" may include the eighth transistor T8, the fourth transistor T4, the fifth transistor T5, the first capacitor C1, and the second capacitor C2.

The first capacitor C1 may be connected between the first node N1 and the first power input terminal IN1. The first capacitor C1 may be charged with a voltage applied to the first node N1. The first capacitor C1 may include a first electrode and a second electrode, where the first electrode is connected to the first node N1, and the second electrode is connected to the first power input terminal IN1. The first electrode of the first capacitor C1 may be connected to the gate electrode of the second transistor T2 and the gate electrode of the sixth transistor T6.

The second capacitor C2 may be connected between the second node N2 and the output terminal OUT. The second capacitor C2 is charged with a voltage corresponding to a turned-on or turned-off of the seventh transistor T7. The second capacitor C2 may include a first electrode and a second electrode, where the first electrode is connected to the second node N2, and the second electrode is connected to the output terminal OUT. The first electrode of the second capacitor C2 may be electrically connected to the second electrode of the eighth transistor T8.

The fourth transistor T4 may be connected between the first node N1 and the first clock input terminal CIN1. The fourth transistor T4 may control connection between the first node N1 and the first clock input terminal CIN1 according to the voltage of the third node N3. The fourth transistor T4 may include a first electrode and a second electrode, where the first electrode of the fourth transistor T4 is connected to the first clock input terminal CIN1, the second electrode of the fourth transistor T4 is connected to the first node N1, and the gate electrode of the fourth transistor T4 is connected to the third node N3.

The fifth transistor T5 may be disposed between the first node N1 and the second power input terminal IN2 connected to the gate low voltage line VGL. The fifth transistor T5 may control connection between the first node N1 and the second power input terminal IN2 according to a first clock signal of the first clock input terminal CIN1. The fifth transistor T5 may include a first electrode and a second electrode, where the first electrode of the fifth transistor T5 is connected to the first node N1, the second electrode of the fifth transistor T5 is connected to the second power input terminal IN2, and the gate electrode of the fifth transistor T5 is connected to the first clock input terminal CIN1.

The eighth transistor T8 may be disposed between the third node N3 and the second node N2. The eighth transistor T8 may maintain electrical connection between the third node N3 and the second node N2 while maintaining a turned-on state. In addition, the eighth transistor T8 may limit a voltage drop width of the third node N3 according to the voltage of the second node N2. The eighth transistor T8 may include a first electrode and a second electrode, where the first electrode of the eighth transistor T8 is connected to the third node N3, the second electrode of the eighth transistor T8 is connected to the second node N2, and the gate electrode of the eighth transistor T8 is connected to the second power input terminal IN2.

An initialization control signal GI (refer to FIG. 10) output from the first initialization stage GIST1 having the above configuration may be transferred to the initialization control line GIL (refer to FIG. 10) corresponding thereto through the initialization output line corresponding thereto. In addition, a signal output from the first initialization stage GIST1 may be transferred to the second initialization stage GIST2 (refer to FIG. 10) disposed on the next stage of the first initialization stage GIST1 through the carry line CRL (refer to FIG. 16).

Figure 11D:
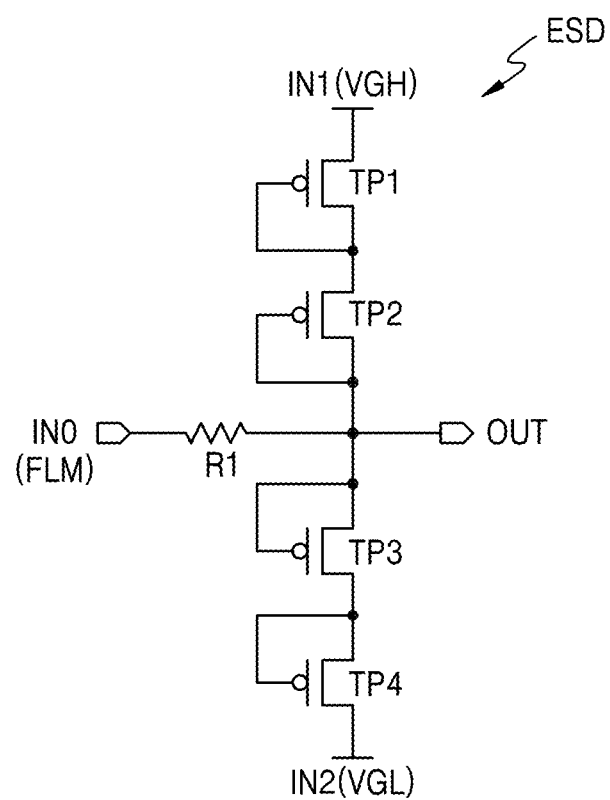
FIG. 11D is a circuit diagram of an embodiment of an electrostatic discharge prevention circuit included in a display apparatus.

FIG. 11D is a circuit diagram of an embodiment of an electrostatic discharge prevention circuit included in a display apparatus.

The display apparatus in an embodiment may include an electrostatic discharge prevention circuit ESD. The electrostatic discharge prevention circuit ESD may be disposed on the front end of the gate driving circuit GDC (refer to FIG. 3) in the non-display area NDA (refer to FIG. 3). The electrostatic discharge prevention circuit ESD may discharge static electricity introduced from the outside and protect an inner circuit from static electricity. In an embodiment, the electrostatic discharge prevention circuit ESD may protect the gate driving circuit GDC and pixels PX.

Referring to FIG. 11D, the electrostatic discharge prevention circuit ESD may include an input terminal IN0, the first power input terminal IN1, the second power input terminal IN2, and the output terminal OUT. The input terminal IN0 may be connected to the start signal line FLM, the first power input terminal IN1 may be connected to the gate-high voltage line VGH, and the second power input terminal IN2 may be connected to the gate-low voltage line VGL. That is, the electrostatic discharge prevention circuit ESD may be electrically connected to the start signal line FLM to discharge static electricity introduced through the start signal line FLM.

The electrostatic discharge prevention circuit ESD may include a first protection transistor TP1, a second protection transistor TP2, a third protection transistor TP3, and a fourth protection transistor TP4. Each of the first protection transistor TP1, the second protection transistor TP2, the third protection transistor TP3, and the fourth protection transistor TP4 may include a gate electrode, a first electrode, and a second electrode. In this case, the gate electrode of each of the first to fourth protection transistors TP1, TP2, TP3, and TP4 may be connected to the first electrode. Accordingly, each of the first to fourth protection transistors TP1, TP2, TP3, and TP4 may be provided as a transistor that is diode-connected in a reverse direction.

The first electrode of the first protection transistor TP1 may be connected to the gate-high voltage line VGH, and the second electrode of the second protection transistor TP2 may be connected to the start signal line FLM. Due to static electricity, in the case where a voltage greater than a first power voltage of the gate-high voltage line VGH is applied to the start signal line FLM, the first protection transistor TP1 and the second protection transistor TP2 may be turned on. In this case, a current (e.g., a current due to static electricity) may flow from the start signal line FLM to the gate-high voltage line VGH, and the voltage at the start signal line FLM may be reduced. That is, the first protection transistor TP1 and the second protection transistor TP2 may drop a voltage greater than the first power voltage.

The first electrode of the third protection transistor TP3 may be connected to the start signal line FLM, and the second electrode of the fourth protection transistor TP4 may be electrically connected to the gate-low voltage line VGL. Due to static electricity, in the case where a voltage less than a second power voltage of the gate-low voltage line VGL is applied to the start signal line FLM, the third protection transistor TP3 and the fourth protection transistor TP4 may be turned on. In this case, a current may flow from the gate-low voltage line VGL to the start signal line FLM, and the voltage at the start signal line FLM may increase. That is, the third protection transistor TP3 and the fourth protection transistor TP4 may increase a voltage lower than the second power voltage.

The voltage at the start signal line FLM may be maintained at a voltage between the first power voltage and the second power voltage by the first to fourth protection transistors TP1, TP2, TP3, and TP4, and the inner circuit may be protected from static electricity.

A first resistor R1 may be electrically connected between the input terminal IN0 and the protection transistor. The first resistor R1 may have a resistance value greater than the start signal line FLM. In an embodiment, the first resistor R1 may have a narrower width than the start signal line FLM, have a zigzag shape, or include a material having a relatively low electrical conductivity. In this case, in the case where a surge voltage having a relatively high voltage level is applied to the start signal line FLM, the first resistor R1 may consume the energy of the surge voltage in the form of heat and prevent the protection transistor from being damaged by the surge voltage.

Figure 12:
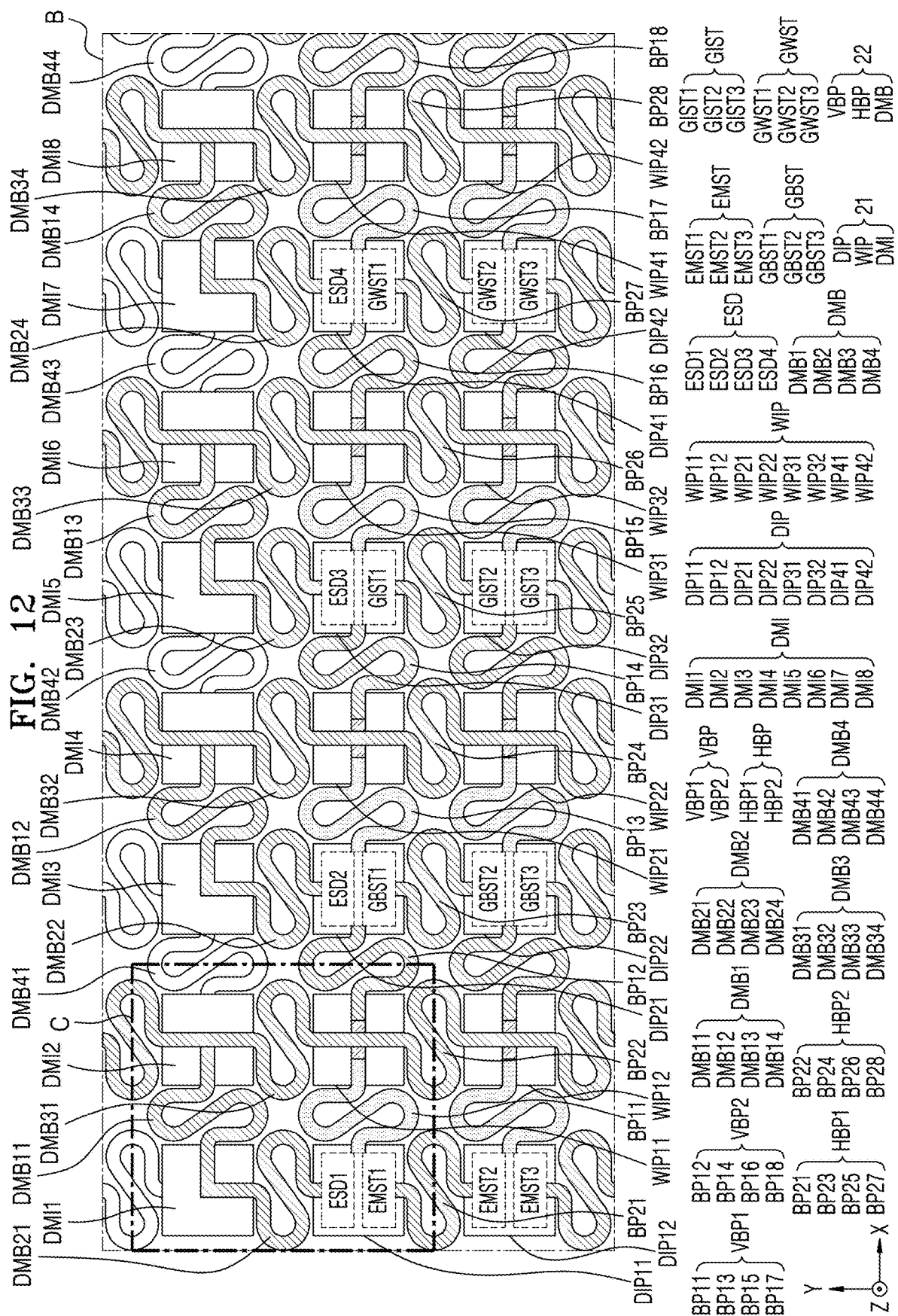
FIG. 12 is a schematic enlarged plan view of an embodiment of a portion of the display apparatus and an enlarged view of a region B of FIG. 3.

FIG. 12 is a schematic enlarged plan view of an embodiment of a portion of the display apparatus in an embodiment and an enlarged view of a region B of FIG. 3.

Referring to FIG. 12, the plurality of peripheral island portions 21 and the plurality of peripheral bridge portions 22 may be disposed in the non-display area NDA (refer to FIG. 3). The plurality of peripheral island portions 21 may be spaced apart from each other, and the peripheral bridge portion 22 may connect adjacent peripheral island portions 21 to each other. In the specification, when adjacent peripheral island portions 21 are connected to each other by the peripheral bridge portion 22, it means that the peripheral bridge portion 22 extends between the adjacent peripheral island portions 21, and the peripheral island portions 21 and the plurality of peripheral bridge portions 22 are integrally provided.

The peripheral island portion 21 may include a driver island portion DIP in which a driver stage may be disposed, and a wiring island portion WIP in which input lines may be disposed. Specifically, at least one driver stage may be disposed in the driver island portion DIP, and some of the input lines may be disposed in the wiring island portion WIP, where the input lines apply a signal or a voltage to the driver stage. However, all of the input lines which transfer a signal or a voltage to the drive stage are not disposed in the wiring island portion WIP. Some of the input lines may be disposed in the wiring island portion WIP, and the rest of the input lines may be also disposed in the driver island portion DIP. Hereinafter, some of the plurality of input lines arranged in the wiring island portion WIP may be denoted by first input lines IL1 (refer to FIG. 13), and the rest of the plurality of input lines arranged in the driver island portion DIP may be denoted by second input lines IL2 (refer to FIG. 13).

The driver island portion DIP and the wiring island portion WIP may be alternately arranged in a first row in the first direction (e.g., x direction), and in a second row parallel to the first row, the driver island portion DIP and the wiring island portion WIP may be disposed in the same manner as in the first row. That is, the driver island portion DIP may be successively arranged in a first column in the second direction (e.g., y direction), and the wiring island portion WIP may be successively arranged in a second column parallel to the first column. Because the plurality of wiring island portions WIP are successively arranged in the second direction, the plurality of first input lines IL1 (refer to FIG. 12) may extend in the second direction (e.g., y direction). Likewise, because the plurality of driver island portions DIP are successively arranged in the second direction, the plurality of second input lines IL2 (refer to FIG. 12) may extend in the second direction (e.g., y direction).

In an embodiment, the driver island portion DIP may include a first-1 driver island portion DIP11, a first-2 driver island portion DIP12, a second-1 driver island portion DIP21, a second-2 driver island portion DIP22, a third-1 driver island portion DIP31, a third-2 driver island portion DIP32, a fourth-1 driver island portion DIP41, and a fourth-2 driver island portion DIP42. The wiring island portion WIP may include a first-1 wiring island portion WIP11, a first-2 wiring island portion WIP12, a second-1 wiring island portion WIP21, a second-2 wiring island portion WIP22, a third-1 wiring island portion WIP31, a third-2 wiring island portion WIP32, a fourth-1 wiring island portion WIP41, and a fourth-2 wiring island portion WIP42.

In addition, the peripheral island portion 21 may further include a dummy island portion DMI in addition to the driver island portion DIP and the wiring island portion WIP. The dummy island portion DMI may be disposed in the non-display area NDA and be a peripheral island portion 21 disposed in a region except the gate driving circuit GDC (refer to FIG. 3) and the data driving circuit DDC (refer to FIG. 3). In an embodiment, the dummy island portion DMI may be disposed outside the driver island portion DIP and the wiring island portion WIP.

In an embodiment, the dummy island portion DMI may be disposed at the front end of the driver island portion DIP and the wiring island portion WIP. In an embodiment, a first dummy island portion DMI1 may be disposed over the first-1 driver island portion DIP11 in which the emission control stage EMST is disposed, and a second dummy island portion DMI2 may be disposed over the first-1 wiring island portion WIP11 in which the input lines of the emission control stage EMST are arranged. Likewise, a third dummy island portion DIM3 may be disposed over the second-1 driver island portion DIP21 in which the bypass stage GBST is disposed, and a fourth dummy island portion DIM4 may be disposed over the second-1 wiring island portion WIP21. A fifth dummy island portion DMI5 may be disposed over the third-1 driver island portion DIP31 in which the initialization stage GIST is disposed, and a sixth dummy island portion DMI6 may be disposed over the third-1 wiring island portion WIP31. A seventh dummy island portion DMI7 may be disposed over the fourth-1 driver island portion DIP41 in which the data-write stage GWST is disposed, and an eighth dummy island portion DMI8 may be disposed over the fourth-1 wiring island portion WIP41.

The peripheral bridge portion 22 is a portion connecting adjacent peripheral island portions 21 to form an elongated structure, and may have a serpentine shape. A plurality of output lines which transfer output signals of a driver and a plurality of connection lines connected to an input line and transfer input signals may be arranged in the peripheral bridge portion 22.

The peripheral bridge portion 22 may include a vertical bridge portion VBP and a horizontal bridge portion HBP. Specifically, the vertical bridge portion VBP is the peripheral bridge portion 22 connecting the driver island portion DIP to the wiring island portion WIP, and may have an 'S' shape in the first direction (e.g., x direction). The horizontal bridge portion HBP is the peripheral bridge portion 22 connecting the driver island portions DIP adjacent to each other or connecting the wiring island portions WIP adjacent to each other, and may have an 'S' shape in the second direction (e.g., y direction). That is, the horizontal bridge portion HBP may have a shape that is rotated by 90° from the shape of the vertical bridge portion VBP.

The vertical bridge portion VBP may include a first vertical bridge portion VBP1 and a second vertical bridge portion VBP2. The first vertical bridge portion VBP1 may be the peripheral bridge portion 22 disposed between a predetermined driver island portion DIP and the wiring island portion WIP in which input lines are arranged, where the input lines apply signals to the relevant driver island portion DIP. The second vertical bridge portion VBP2 may be disposed between a predetermined driver island portion DIP and the wiring island portion WIP in which input lines are arranged, where the input lines apply signals to another driver island portion DIP that is not the relevant driver island portion DIP. In other words, the first vertical bridge portion VBP1 may be the peripheral bridge portion 22 disposed between a predetermined driver island portion DIP and the wiring island portion WIP associated with the relevant driver island portion DIP, and the second vertical bridge portion VBP2 may be the peripheral bridge portion 22 disposed between a predetermined driver island portion DIP and the wiring island portion WIP not associated with the relevant driver island portion DIP.

Accordingly, all of the output lines of the driver and the connection lines of the input lines may be disposed in the first vertical bridge portion VBP1, while only the output lines of the driver may be disposed in the second vertical bridge portion VBP2. The first vertical bridge portion VBP1 and the second vertical bridge portion VBP2 may be alternately arranged in the first direction. In an embodiment, the first vertical bridge portion VBP1 may include a first-1 bridge portion BP11, a first-3 bridge portion BP13, a first-5 bridge portion BP15, and a first-7 bridge portion BP17. The second vertical bridge portion VBP2 may include a first-2 bridge portion BP12, a first-4 bridge portion BP14, a first-6 bridge portion BP16, and a first-8 bridge portion BP18.

The horizontal bridge portion HBP may include a first horizontal bridge portion HBP1 and a second horizontal bridge portion HBP2. The first horizontal bridge portion HBP1 may be the peripheral bridge portion 22 connecting the driver island portions DIP adjacent to each other. The second horizontal bridge portion HBP2 may be the peripheral bridge portion 22 connecting the wiring island portions WIP adjacent to each other. Accordingly, the first horizontal bridge portion HBP1 and the second horizontal bridge portion HBP2 may be alternately arranged in the first direction (e.g., x direction).

In an embodiment, the first horizontal bridge portion HBP1 may include a second-1 bridge portion BP21, a second-3 bridge portion BP23, a second-5 bridge portion BP25, and a second-7 bridge portion BP27. The second horizontal bridge portion HBP2 may include a second-2 bridge portion BP22, a second-4 bridge portion BP24, a second-6 bridge portion BP26, and a second-8 bridge portion BP28.

In addition, the peripheral bridge portion 22 may further include a dummy bridge portion DMB in addition to the vertical bridge portion VBP and the horizontal bridge portion HBP. The dummy bridge portion DMB may connect the dummy island portions DMI adjacent to each other, connect the dummy island portion DMI and the driver island portion DIP adjacent to each other, or connect the dummy island portion DMI and the wiring island portion WIP adjacent to each other.

Specifically, the dummy bridge portion DMB may include a first dummy bridge portion DMB1 and a fourth dummy bridge portion DMB4 connecting the dummy island portions DMI adjacent to each other, may include a second dummy bridge portion DMB2 connecting the dummy island portion DMI and the driver island portion DIP adjacent to each other, and may include a third dummy bridge portion DMB3 connecting the dummy island portion DMI and the wiring island portion WIP adjacent to each other.

In an embodiment, the first dummy bridge portion DMB1 may be disposed at the front end of the first vertical bridge portion VBP1 and may have the same shape as that of the first vertical bridge portion VBP1. In an embodiment, the first dummy bridge portion DMB1 may include a first-1 dummy bridge portion DMB11 connecting the first dummy island portion DMI1 and the second dummy island portion DMI2, a first-2 dummy bridge portion DMB12 connecting the third dummy island portion DMI3 and the fourth dummy island portion DMI4, a first-3 dummy bridge portion DMB13 connecting the fifth dummy island portion DMI5 and the sixth dummy island portion DMI6, and a first-4 dummy bridge portion DMB14 connecting the seventh dummy island portion DMI7 and the eighth dummy island portion DMI8.

In an embodiment, the fourth dummy bridge portion DMB4 may be disposed at the front end of the second vertical bridge portion VBP2 and may have the same shape as that of the second vertical bridge portion VBP2. In an embodiment, the fourth dummy bridge portion DMB4 may include a fourth-1 dummy bridge portion DMB41 connecting the second dummy island portion DMI2 and the third dummy island portion DMI3, a fourth-2 dummy bridge portion DMB42 connecting the fourth dummy island portion DMI4 and the fifth dummy island portion DMI5, a fourth-3 dummy bridge portion DMB43 connecting the sixth dummy island portion DMI6 and the seventh dummy island portion DMI7, and a fourth-4 dummy bridge portion DMB44 connected to the eighth dummy island portion DMI8.

In an embodiment, the second dummy bridge portion DMB2 may be disposed at the front end of the first horizontal bridge portion HBP1 and may have the same shape as that of the first horizontal bridge portion HBP1. In an embodiment, the second dummy bridge portion DMB2 may include a second-1 dummy bridge portion DMB21 connecting the first dummy island portion DMI1 and the first-1 driver island portion DIP11, a second-2 dummy bridge portion DMB22 connecting the third dummy island portion DMI3 and the second-1 driver island portion DIP21, a second-3 dummy bridge portion DMB23 connecting the fifth dummy island portion DMI5 and the third-1 driver island portion DIP31, and a second-4 dummy bridge portion DMB24 connecting the seventh dummy island portion DMI7 and the fourth-1 driver island portion DIP41.

In an embodiment, the third dummy bridge portion DMB3 may be disposed at the front end of the second horizontal bridge portion HBP2 and may have the same shape as that of the second horizontal bridge portion HBP2. In an embodiment, the third dummy bridge portion DMB3 may include a third-1 dummy bridge portion DMB31 connecting the second dummy island portion DMI2 and the first-1 wiring island portion WIP11, a third-2 dummy bridge portion DMB32 connecting the fourth dummy island portion DMI4 and the second-1 wiring island portion WIP21, a third-3 dummy bridge portion DMB33 connecting the sixth dummy island portion DMI6 and the third-1 wiring island portion WIP31, and a third-4 dummy bridge portion DMB34 connecting the eighth dummy island portion DMI8 and the fourth-1 wiring island portion WIP41.

The gate driving circuits GDC (refer to FIG. 3) disposed in the driver island portion DIP may be disposed, from the outer portion to the display area DA (refer to FIG. 3), in the order of the emission control driving circuit EMDC (refer to FIG. 10), the bypass driving circuit GBDC (refer to FIG. 10), the initialization driving circuit GIDC (refer to FIG. 10), and the data-write driving circuit GWDC (refer to FIG. 10). In addition, in the case where the size and/or width of the peripheral island portion 21 is greater than the size and/or width of the main island portion 21 (refer to FIG. 4) as shown in FIG. 12, two driver stages may be disposed in the driver island portion DIP.

In an embodiment, the second emission control stage EMST2 and the third emission control stage EMST3 may be disposed in the first-2 driver island portion DIP12, and the second bypass stage GBST2 and the third bypass stage GBST3 may be disposed in the second-2 driver island portion DIP22. The second initialization stage GIST2 and the third initialization stage GIST3 may be disposed in the third-2 driver island portion DIP32, and the second data-write stage GWST2 and the third data-write stage GWST3 may be disposed in the fourth-2 driver island portion DIP42. Likewise, two driver stages may be disposed in the driver island portion DIP disposed at the rear end of each of the first-2 driver island portion DIP12, the second-2 driver island portion DIP22, the third-2 driver island portion DIP32, and the fourth-2 driver island portion DIP42.

However, one driver stage may be disposed in the first-1 driver island portion DIP11, the second-1 driver island portion DIP21, the third-1 driver island portion DIP31, the fourth-1 driver island portion DIP41 disposed at the forefront of the driver island portion DIP. The electrostatic discharge prevention circuit ESD may be additionally disposed in the driver island portion DIP disposed at the forefront.

In an embodiment, a first electrostatic discharge prevention circuit ESD and the first emission control stage EMST1 may be disposed in the first-1 driver island portion DIP11, and a second electrostatic discharge prevention circuit ESD2 and the first bypass control stage GBST1 may be disposed in the second-1 driver island portion DIP21. A third electrostatic discharge prevention circuit ESD3 and the first initialization stage GIST1 may be disposed in the third-1 driver island portion DIP31, and a fourth electrostatic discharge prevention circuit ESD4 and the first data-write stage GWST1 may be disposed in the fourth-1 driver island portion DIP41.

As described above, the input lines which apply signals or voltages to each driver stage may include the first input lines IL1 (refer to FIG. 12) disposed in the wiring island portion WIP and the second input lines IL2 (refer to FIG. 12) disposed in the driver island portion DIP. The first input lines IL1 (refer to FIG. 12) may be disposed in the wiring island portion WIP and may extend by being disposed also in the second horizontal bridge portion HBP2. The second input lines IL2 (refer to FIG. 12) may be disposed in the driver island portion DIP and may extend by being disposed also in the first horizontal bridge portion HBP1.

In an embodiment, some of the input lines which supply signals or voltages to the emission control stage EMST may extend from the first-1 wiring island portion WIP11 to the first-2 wiring island portion WIP12 through the second-2 bridge portion BP22, and the remaining input lines may extend from the first-1 driver island portion DIP11 to the first-2 driver island portion DIP12 through the second-1 bridge portion BP21. Likewise, some of the input lines which supply signals or voltages to the bypass stage GBST may extend from the second-1 wiring island portion WIP21 to the second-2 wiring island portion WIP22 through the second-4 bridge portion BP24, and the remaining input lines may extend from the second-1 driver island portion DIP21 to the first-2 driver island portion DIP12 through the second-3 bridge portion BP23. Some of the input lines which supply signals or voltages to the initialization stage GIST may extend from the third-1 wiring island portion WIP31 to the third-2 wiring island portion WIP32 through the second-6 bridge portion BP26, and the remaining input lines may extend from the third-1 driver island portion DIP31 to the third-2 driver island portion DIP32 through the second-5 bridge portion BP25. Some of the input lines which supply signals or voltages to the data-write stage GWST may extend from the fourth-1 wiring island portion WIP41 to the fourth-2 wiring island portion WIP42 through the second-8 bridge portion BP28, and the remaining input lines may extend from the fourth-1 driver island portion DIP41 to the fourth-2 driver island portion DIP42 through the second-7 bridge portion BP27.

In this case, some of the first input lines IL1 (refer to FIG. 13) may extend also to the dummy island portion DMI. In an embodiment, some of the first input lines IL1 (refer to FIG. 13) disposed in the first-1 wiring island portion WIP11 may extend also to the second dummy island portion DMI2 and extend up to the first dummy island portion DMI1. This is described below in detail with reference to FIGS. 13 and 15.

The output line which transfers output signals of each driver stage may extend toward the display area DA (refer to FIG. 3) in the first direction (e.g., x direction). Accordingly, the output line may be disposed in the same row as the driver island portion DIP in which the driver stage connected thereto is disposed, and extend through the plurality of vertical bridge portions VBP that are more adjacent to the display area DA (refer to FIG. 3) than the relevant driver island portion DIP.

In an embodiment, the emission control output line of the first emission control stage EMST1 may be disposed in the same row as the first-1 driver island portion DIP11, and may extend through the first-1 bridge portion BP11, the first-2 bridge portion BP12, the first-3 bridge portion BP13, the first-4 bridge portion BP14, the first-5 bridge portion BP15, the first-6 bridge portion BP16, the first-7 bridge portion BP17, and the first-8 bridge portion BP18 that are more adjacent to the display area DA (refer to FIG. 3) than the first-1 driver island portion DIP11. Likewise, the bypass output line of the first bypass stage GBST1 may be disposed in the same row as the second-1 driver island portion DIP21, and may extend through the first-3 bridge portion BP13, the first-4 bridge portion BP14, the first-5 bridge portion BP15, the first-6 bridge portion BP16, the first-7 bridge portion BP17, and the first-8 bridge portion BP18 that are more adjacent to the display area DA (refer to FIG. 3) than the second-1 driver island portion DIP21. The initialization output line of the first initialization stage GIST1 may be disposed in the same row as the third-1 driver island portion DIP31, and may extend through the first-5 bridge portion BP15, the first-6 bridge portion BP16, the first-7 bridge portion BP17, and the first-8 bridge portion BP18 that are more adjacent to the display area DA (refer to FIG. 3) than the third-1 driver island portion DIP31. The data-write output line of the first data-write stage GWST1 may be disposed in the same row as the fourth-1 driver island portion DIP41, and may extend through the first-7 bridge portion BP17 and the first-8 bridge portion BP18 that are more adjacent to the display area DA (refer to FIG. 3) than the fourth-1 driver island portion DIP41.

Figure 14:
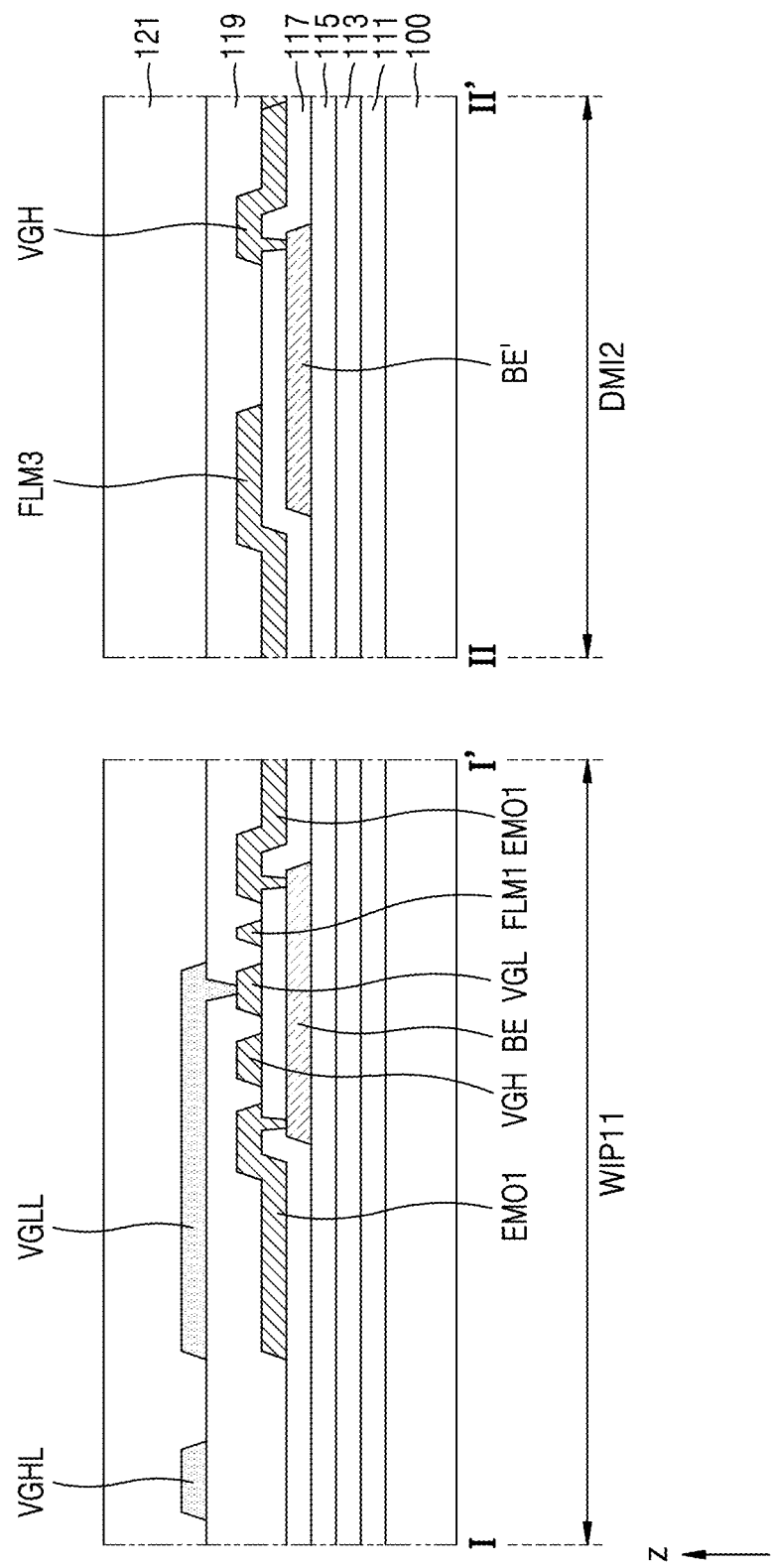
FIG. 14 is a cross-sectional view of an embodiment of a portion of the display apparatus taken along line I-I' of FIG. 13.

FIG. 13 is a schematic enlarged plan view of an embodiment of a portion of a display apparatus in an embodiment and an enlarged view of a region C of FIG. 12. FIG. 14 is a cross-sectional view of an embodiment of a portion of the display apparatus, taken along line I-I' of FIG. 13.

First, referring to FIG. 13, the first electrostatic discharge prevention circuit ESD1 and the first emission control stage EMST1 may be arranged in the first-1 driver island portion DIP11. The first emission control stage EMST1 may include a first emission node controller EMNC1 and a first emission buffer transistor EMBF1, and other emission control stages EMST (refer to FIG. 12) may have substantially the same configuration. The first emission node controller EMNC1 may include a plurality of transistors and a plurality of capacitors, and may control the voltage of a node using start signals or the like provided through an input terminal. The first emission buffer transistor EMBF1 may be a transistor disposed to isolate a signal source from a circuit driven by the signal source.

The first emission control stage EMST1 may have substantially the same circuit configuration as the first emission control stage EMST1 (refer to FIG. 11A) shown in FIG. 11A. In addition, the first electrostatic discharge prevention circuit ESD1 may have substantially the same circuit configuration as the electrostatic discharge prevention circuit ESD shown in FIG. 11D.

An output signal of the first emission control stage EMST1 may apply an emission control signal EM (refer to FIG. 1) to the display area DA (refer to FIG. 3) through a first emission control output line EMO1. Specifically, an emission control signal EM (refer to FIG. 10) output from the first emission control stage EMST1 may be transferred to the first emission control output line EMO1 first, then supplied to a pixel in the display area DA (refer to FIG. 3) through the emission control line EML (refer to FIG. 10) connected to the first emission control output line EMO1. One output line may be disposed per stage, and in the case of the first-2 driver island portion DIP12 (refer to FIG. 12) in which two emission control stages EMST (refer to FIG. 12) are arranged, two emission control output lines may be disposed.

The first emission control output line EMO1 may extend through the first-1 bridge portion BP11, the first-1 wiring island portion WIP11, and the first-2 bridge portion BP12. In addition, though not shown in FIG. 13, the first emission control output line EMO1 may extend toward the display area through the bypass driving circuit GBDC (refer to FIG. 10), the initialization driving circuit GIDC (refer to FIG. 10), and the data-write driving circuit GWDC (refer to FIG. 10).

The first emission control output line EMO1 may be substantially the same layer as the source electrode SE (refer to FIG. 7A) of the main island portion 11 (refer to FIG. 4). Likewise, the plurality of first input lines IL1 described below may be disposed on substantially the same layer as the source electrode SE (refer to FIG. 7A). Accordingly, to avoid overlapping between the first emission control output lines EMO1 and the plurality of first input lines IL1, the first emission control output lines EMO1 may extend through a bridge electrode BE in a region overlapping the plurality of first input lines IL1. Referring to FIG. 14, the bridge electrode BE is disposed below the first input lines IL1 and the first emission control output line EMO1, and at least one insulating layer may be disposed between the first emission control output line EMO1 and the bridge electrode BE. In an embodiment, the bridge electrode BE may be disposed in the same layer as the second electrode CE2 (refer to FIG. 7A) of the main island portion 11 (refer to FIG. 4) or the gate electrode GE (refer to FIG. 7A). In this case, two opposite ends of the bridge electrode BE may be connected to the first emission control output line EMO1 through contact holes.

Referring to FIG. 13, the input lines which applies signals or voltages to the driver stage may be disposed in the non-display area NDA (refer to FIG. 3). The input lines may include the first input lines IL1 disposed in the wiring island portion WIP (refer to FIG. 12) and the second input lines IL2 disposed in the driver island portion DIP (refer to FIG. 12). Specifically, among the input lines desired for the first emission control stage EMST1, the first input lines IL1 may be disposed in the first-1 wiring island portion WIP11, and the second input lines IL2 may be disposed in the first-1 driver island portion DIP11. Each of the first input lines IL1 and the second input lines IL2 may extend in the second direction (e.g., y direction). Accordingly, the first input lines IL1 may extend toward the first-2 wiring island portion WIP12 disposed at the lower end thereof through the second-2 bridge portion BP22, and the second input lines IL2 may extend toward the first-2 driver island portion DIP12 disposed at the lower end thereof through the second-1 bridge portion BP21. In this case, the first input lines IL1 in the first-1 wiring island portion WIP11, which is the foremost end among the wiring island portion WIP (refer to FIG. 12), may extend in the second direction (e.g., y direction) to the second dummy island portion DMI2 through the third-1 dummy bridge portion BP31.

In an embodiment, the first input lines IL1 may include the gate-high voltage line VGH, the gate-low voltage line VGL, and the start signal line FLM. The gate-high voltage line VGH and the gate-low voltage line VGL are wirings which apply a driving voltage to the emission control stage EMST. The gate-high voltage line VGH may apply a gate-off voltage, and the gate-low voltage line VGL may apply a gate-on voltage. The start signal line FLM may be a wiring which applies a start signal to the first emission control stage EMST1.

In an embodiment, the second input lines IL2 may include the first clock line CLK1, the second clock line CLK2, the carry line CRL, and the reset signal line ESR. The first clock line CLK1 and the second clock line CLK2 are wirings which respectively transfer a first clock signal and a second clock signal. Each of the first clock signal and the second clock signal may be a square signal in which a logic-high level and a logic-low level are repeated. The carry line CRL may be a wiring which transfers a carry signal. A carry signal may be a start signal of a next stage. In an embodiment, the remaining emission control stages EMST (refer to FIG. 12) other than the first emission control stage EMST1 may receive, as a start signal, a carry signal output from the previous stage. The reset signal line ESR is a wiring which transfers a reset signal, and the reset signal may be a signal activated as a relatively low level when the display apparatus is powered on or reset.

Because the second input lines IL2 may be adjacent to the emission control stage EMST in the first-1 driver island portion DIP11, the second input lines IL2 may easily transfer signals. In contrast, because the first input lines IL1 are arranged in the first-1 wiring island portion WIP11 apart from the first-1 driver island portion DIP11, a connection wiring CW may be additionally desired. The connection wiring CW may include a high-voltage connection line VGHL connected to the gate-high voltage line VGH and a low-voltage connection line VGLL connected to the gate-low voltage line VGL among the first input lines IL1.

The high-voltage connection line VGHL may be connected to the gate-high voltage line VGH, and the low-voltage connection line VGLL may be connected to the gate-low voltage line VGL in the first-1 wiring island portion WIP11. Referring to FIG. 14, the high-voltage connection line VGHL and the low-voltage connection line VGLL may be disposed on substantially the same layer as the first connection piece CM1 (refer to FIG. 7A) in the main island portion 11 (refer to FIG. 4). Each of the high-voltage connection line VGHL and the low-voltage connection line VGLL may be connected to the gate-high voltage line VGH or the gate-low voltage line VGL through a contact hole. The first emission control output line EMO1 and the connection wiring CW disposed in the first-1 bridge portion BP11 are disposed in different layers to maximally secure the width of the wiring.

The high-voltage connection line VGHL may extend in the first direction (e.g., x direction) crossing the gate-high voltage line VGH in the first-1 wiring island portion WIP11. The high-voltage connection line VGHL may extend from the first-1 wiring island portion WIP11 to the first-1 bridge portion BP11, and the high-voltage connection line VGHL disposed in the first-1 bridge portion BP11 may has a serpentine shape or an 'S' shape. In addition, the high-voltage connection line VGHL may extend from the first-1 bridge portion BP11 to the first-1 driver island portion DIP11. The high-voltage connection line VGHL disposed in the first-1 driver island portion DIP11 may be branched and electrically connected to the first electrostatic discharge prevention circuit ESD1 and the first emission control stage EMST1, respectively.

Likewise, the low-voltage connection line VGLL has a similar structure to the high-voltage connection line VGHL and may extend from the first-1 wiring island portion WIP11 to the first-1 driver island portion DIP11 through the first-1 bridge portion BP11. The low-voltage connection line VGLL disposed in the first-1 bridge portion BP11 may overlap the first emission control output line EMO1.

Among the first input lines IL1, the start signal line FLM does not need to transfer signals to an n-th emission control stage disposed at the rear end, but needs to transfer signals to the first emission control stage EMST1 disposed at the forefront end. However, like the gate-high voltage line VGH and the gate-low voltage line VGL, the start signal line FLM is disposed in the first-1 wiring island portion WIP11, the start signal line FLM needs to extend to the first-1 driver island portion DIP11.

Accordingly, in an embodiment, the start signal line FLM may extend from the first-1 wiring island portion WIP11 to the first-1 driver island portion DIP11 through the second dummy island portion DMI2 and the first dummy island portion DMI1. Specifically, the start signal line FLM may include a first portion FLM1, a second portion FLM2, a third portion FLM3, a fourth portion FLM4, a fifth portion FLM5, a sixth portion FLM6, and a seventh portion FLM7.

The first portion FLM1 of the start signal line FLM may be a region of the start signal line FLM disposed in the first-1 wiring island portion WIP11. Like the gate-high voltage line VGH and the gate-low voltage line VGL, the first portion FLM1 may extend in the second direction (e.g., y direction) in the first-1 wiring island portion WIP11. In addition, the first portion FLM1 may be a portion extending from the wiring island portion WIP (refer to FIG. 12) disposed at the rear end of the first-1 wiring island portion WIP11 and the second-2 bridge portion BP22.

The second portion FLM2 of the start signal line FLM may be a region of the start signal line FLM disposed in the third-1 dummy bridge portion DMB31. The second portion FLM2 may have a serpentine shape or an 'S' shape. However, because the second portion FLM2 is disposed in the third-1 dummy bridge portion DMB31 having the same shape as that of the horizontal bridge portion HBP (refer to FIG. 12), the second portion FLM2 may have an S shape that is rotated by 90° and laid down. That is, the second portion FLM2 may have an S shape in the second direction (e.g., y direction).

The third portion FLM3 of the start signal line FLM may be a region of the start signal line FLM disposed in the second dummy island portion DMI2. The gate-high voltage line VGH and the gate-low voltage line VGL may extend in the second direction (e.g., y direction) from the lower end of the second dummy island portion DMI2 to the upper end of the second dummy island portion DMI2. In contrast, the third portion FLM3 of the start signal line FLM may extend in the second direction (e.g., y direction) together with the gate-high voltage line VGH and the gate-low voltage line VGL, and then extend in the first direction (e.g., x direction) crossing the gate-high voltage line VGH and the gate-low voltage line VGL. In other words, the third portion FLM3 may bend from a portion extending in the second direction (e.g., y direction) in the second dummy island portion DMI2, and extend toward the first dummy island portion DMI1 in the first direction (e.g., x direction). In this case, the bent portion of the third portion FLM3 may be the central portion of the second dummy island portion DMI2.

As described above, all of the gate-high voltage line VGH, the gate-low voltage line VGL, and the start signal line FLM may be disposed on substantially the same layer as the source electrode SE (refer to FIG. 7A) of the main island portion 11 (refer to FIG. 4). In this case, in the case where the third portion FLM3 bends and extend in the first direction (e.g., x direction), a region in which the third portion FLM3 overlaps the gate-high voltage line VGH and the gate-low voltage line VGL may occur. Accordingly, each of the gate-high voltage line VGH and the gate-low voltage line VGL may extend using bridge electrodes BE' and BE" in a region that may overlap the third portion FLM3. Referring to FIG. 14, the bridge electrodes BE' and BE" are disposed below the gate-high voltage line VGH, the gate-low voltage line VGL, and the start signal line FLM. At least one insulating layer may be disposed between the start signal line FLM and the bridge electrodes BE' and BE". In an embodiment, the bridge electrodes BE' and BE" may be disposed in the same layer as the second electrode CE2 (refer to FIG. 7A) or the gate electrode GE (refer to FIG. 7A) in the main island portion 11 (refer to FIG. 4). In this case, two opposite ends of the bridge electrode BE' may be connected to the gate-high voltage line VGH through a contact hole, and two opposite ends of the bridge electrode BE" may be connected to the gate-low voltage line VGL through a contact hole.

The fourth portion FLM4 of the start signal line FLM may be a region of the start signal line FLM disposed in the first-1 dummy bridge portion DMB11. The fourth portion FLM4 may have a serpentine shape or an 'S' shape. Because the first-1 dummy bridge portion DMB11 has the same shape as that of the vertical bridge portion VBP (refer to FIG. 12), the fourth portion FLM4 may have an 'S' shape in the first direction (e.g., x direction). Because only the start signal line FLM is disposed on substantially the same layer as the source electrode SE (refer to FIG. 7A) in the first-1 dummy bridge portion DMB11, the fourth portion FLM4 may have a maximum width that may be secured in the first-1 dummy bridge portion DMB11.

The fifth portion FLM5 of the start signal line may be a region of the start signal line FLM disposed in the first dummy island portion DMI1. The fifth portion FLM5 may extend from the first-1 dummy bridge portion DMB11 in the first direction (e.g., x direction), and then extend in the crossing second direction (e.g., y direction). In other words, the fifth portion FLM5 may bend from a portion extending in the first direction (e.g., x direction) in the first dummy island portion DMI1, and extend toward the first-1 driver island portion DIP11 in the second direction (e.g., y direction). In this case, the bent portion of the fifth portion FLM5 may be the central portion of the first dummy island portion DMI1.

The sixth portion FLM6 of the start signal line FLM may be a region of the start signal line FLM disposed in the second-1 dummy bridge portion DMB21. The sixth portion FLM6 may have a serpentine shape or an 'S' shape. However, because the sixth portion FLM6 is disposed in the second-1 dummy bridge portion DMB21 having the same shape as that of the horizontal bridge portion HBP (refer to FIG. 12), the sixth portion FLM6 may have an 'S' shape that is rotated by 90° and laid down. That is, the sixth portion FLM6 may have an 'S' shape in the second direction (e.g., y direction).

The seventh portion FLM7 of the start signal line FLM may be a region of the start signal line FLM disposed in the first-1 driver island portion DIP11. The seventh portion FLM7 may include a portion extending from the second-1 dummy bridge portion DMB21 and connected to the electrostatic discharge prevention circuit ESD1, and a portion extending from the electrostatic discharge prevention circuit ESD1 and connected to the first emission control stage EMST1. In other words, the seventh portion FLM7 may be electrically connected to the first electrostatic discharge prevention circuit ESD1 and the first emission control stage EMST1 disposed in the first-1 driver island portion DIP11.

All of the first portion FLM1, the second portion FLM2, the third portion FLM3, the fourth portion FLM4, the fifth portion FLM5, the sixth portion FLM6, and the seventh portion FLM7 may be unitary. In addition, the first portion FLM1, the second portion FLM2, the third portion FLM3, the fourth portion FLM4, the fifth portion FLM5, the sixth portion FLM6, and the seventh portion FLM7 may be disposed on substantially the same layer as the source electrode SE (refer to FIG. 7A) of the main island portion 11 (refer to FIG. 4).

Through the above structure, the start signal line FLM may extend from the first-1 wiring island portion WIP11 and be electrically connected to the first electrostatic discharge prevention circuit ESD1 and the first emission control stage EMST1 disposed in the first-1 driver island portion DIP11 through the second dummy island portion DMI2 and the first dummy island portion DMI1 to transfer signals.

In addition, the above structure is not limited to the start signal line FLM, the first electrostatic discharge prevention circuit ESD1 and the first emission control stage EMST1 disposed in the first-1 driver island portion DIP11 and the first-1 wiring island portion WIP11. Referring to FIG. 12, the structure of the start signal line FLM is equally applicable to a start signal line connected to the second electrostatic discharge prevention circuit ESD2 and the first bypass stage GBST1, a start signal line connected to the third electrostatic discharge prevention circuit ESD3 and the first initialization stage GIST1, and a start signal line connected to the fourth electrostatic discharge prevention circuit ESD4 and the first data-write stage GWST1.

That is, the start signal line connected to the second electrostatic discharge prevention circuit ESD2 and the first bypass stage GBST1 may extend from the second-1 wiring island portion WIP21 to the second-1 driver island portion DIP21 through the fourth dummy island portion DMI4 and the third dummy island portion DMI5. Likewise, the start signal line connected to the third electrostatic discharge prevention circuit ESD3 and the first initialization stage GIST1 may extend from the third-1 wiring island portion WIP31 to the third-1 driver island portion DIP31 through the sixth dummy island portion DMI6 and the fifth dummy island portion DMI5. The start signal line connected to the fourth electrostatic discharge prevention circuit ESD4 and the first data-write stage GWST1 may extend from the fourth-1 wiring island portion WIP41 to the fourth-1 driver island portion DIP41 through the eighth dummy island portion DMI8 and the seventh dummy island portion DMI7.

The display apparatus in an embodiment may efficiently utilize the space of the non-display area NDA (refer to FIG. 3) while securing elongation through the structure of the start signal line FLM and the arrangement of the electrostatic discharge prevention circuit ESD (refer to FIG. 12).

Particularly, the start signal line FLM may extend from the wiring island portion WIP (refer to FIG. 12) disposed on the right side of each of the emission control driving circuit EMDC (refer to FIG. 10), the bypass driving circuit GBDC (refer to FIG. 10), the initialization driving circuit GIDC (refer to FIG. 10), and the data-write driving circuit GWDC (refer to FIG. 10), and be electrically connected to the electrostatic discharge prevention circuit ESD (refer to FIG. 12) and the foremost driver stage. The structure of the start signal line FLM may reduce the load of the start signal line FLM compared to the case where the start signal line FLM extends from the outermost portion of the display apparatus and branches to each foremost driver.

In addition, in the case where the start signal line FLM extends through the dummy island portion DMI (refer to FIG. 12), because the start signal line FLM does not overlap or is not adjacent to the high-voltage connection line VGHL and the low-voltage connection line VGLL, a noise or unnecessary signal overlapping due to the high-voltage connection line VGHL and the low-voltage connection line VGLL may be prevented. Accordingly, the display apparatus in an embodiment may implement images of more excellent quality.

Figure 15:
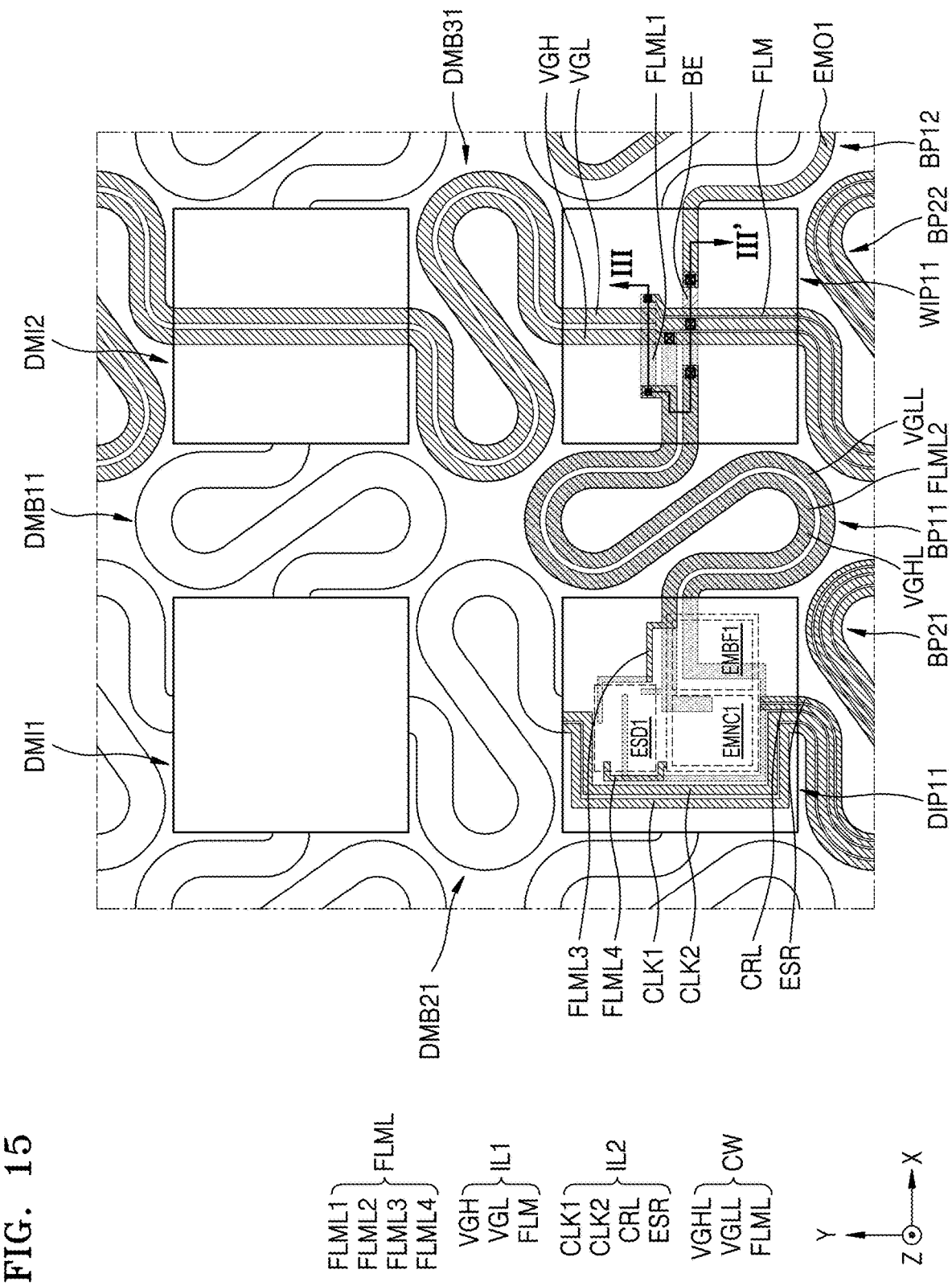
FIG. 15 is a schematic enlarged plan view of another embodiment of a portion of the display apparatus and an enlarged view of a region C of FIG. 12.
Figure 16:
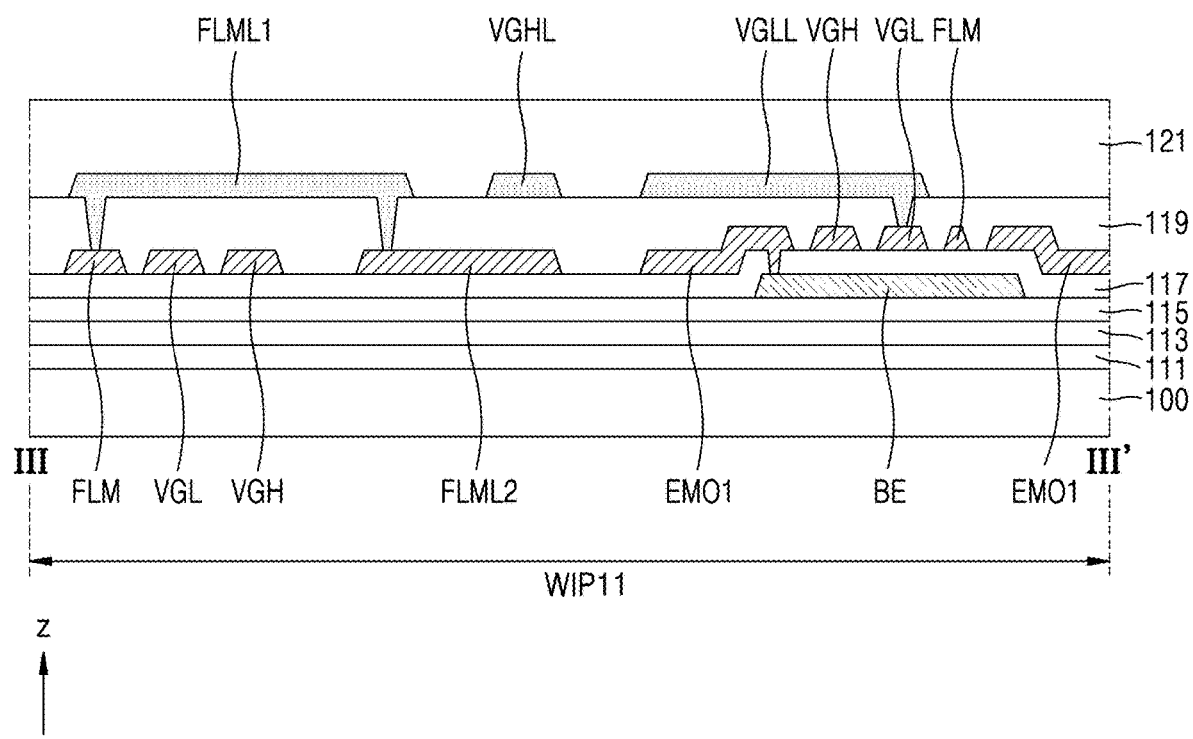
FIG. 16 is a cross-sectional view of another embodiment of a portion of the display apparatus taken along line III-III' of FIG. 15.

FIG. 15 is a schematic enlarged plan view of another embodiment of a portion of a display apparatus and an enlarged view of a region C of FIG. 12. FIG. 16 is a cross-sectional view of a portion of the display apparatus, taken along line III-III' of FIG. 15. Referring to FIGS. 15 and 16, the other characteristics except for the characteristic of the start signal line FLM and the connection wiring CW are the same as those described with reference to FIGS. 13 and 14. Same reference numerals among elements of FIGS. 15 and 16 are replaced with those previously described with reference to FIGS. 13 and 14, and differences are mainly described below.

First, referring to FIG. 15, the first input lines IL1 may include the gate-high voltage line VGH, the gate-low voltage line VGL, and the start signal line FLM, and the second input lines IL2 may include the first clock line CLK1, the second clock line CLK2, the carry line CRL, and the reset signal line ESR. Because the second input lines IL2 may be adjacent to the emission control stage EMST in the first-1 driver island portion DIP11, the second input lines IL2 may easily transfer signals. In contrast, because the first input lines IL1 are arranged in the first-1 wiring island portion WIP11 apart from the first-1 driver island portion DIP11, a connection wiring CW may be additionally desired. The connection wiring CW may include a high-voltage connection line VGHL connected to the gate-high voltage line VGH and a low-voltage connection line VGLL connected to the gate-low voltage line VGL, and a start signal connection line FLML connected to the start signal line FLM among the first input lines IL1.

The high-voltage connection line VGHL may be connected to the gate-high voltage line VGH, and the low-voltage connection line VGLL may be connected to the gate-low voltage line VGL in the first-1 wiring island portion WIP11. Referring to FIG. 16, the high-voltage connection line VGHL and the low-voltage connection line VGLL may be disposed on substantially the same layer as the first connection piece CM1 (refer to FIG. 7A) in the main island portion 11 (refer to FIG. 4). Each of the high-voltage connection line VGHL and the low-voltage connection line VGLL may be connected to the gate-high voltage line VGH or the gate-low voltage line VGL through a contact hole.

Each of the high-voltage connection line VGHL and the low-voltage connection line VGLL extends from the first-1 wiring island portion WIP11 and is disposed in the first-1 bridge portion BP11, and thus may have an 'S' shape. In addition, each of the high-voltage connection line VGHL and the low-voltage connection line VGLL may extend from the first-1 bridge portion BP11 and be disposed in the first-1 driver island portion DIP11. Each of the high-voltage connection line VGHL and the low-voltage connection line VGLL disposed in the first-1 driver island portion DIP11 may branch and be electrically connected to the first electrostatic discharge prevention circuit ESD1 and the first emission control stage EMST1.

Like the high-voltage connection line VGHL and the low-voltage connection line VGLL, the start signal connection line FLML may extend from the first-1 wiring island portion WIP11 to the first-1 driver island portion DIP11 through the first-1 bridge portion BP11. Specifically, the start signal connection line FLML may include a first portion FLML1 and a second portion FLML2.

The first portion FLML1 of the start signal connection line FLML may be a region of the start signal connection line FLML disposed in the first-1 wiring island portion WIP11. Particularly, the first portion FLML1 may be a portion that is directly connected to the start signal line FLM through a contact hole. The first portion FLML1 may be a portion extending in the first direction (e.g., x direction) crossing the start signal line FLM. Accordingly, the first portion FLML1 may have a region overlapping the gate-high voltage line VGH and the gate-low voltage line VGL. To prevent interferences between the gate-high voltage line VGH and the gate-low voltage line VGL and the first portion FLML1, the first portion FLML1 may be disposed in a different layer from the plurality of first input lines IL1.

Referring to FIG. 16, the start signal line FLM, the gate-high voltage line VGH, and the gate-low voltage line VGL may be disposed on substantially the same layer as the source electrode SE (refer to FIG. 7A) of the main island portion 11 (refer to FIG. 4). The first portion FLML1 may be disposed on substantially the same layer as the first connection piece CM1 (refer to FIG. 7A) in the main island portion 11 (refer to FIG. 4), and electrically connected to the start signal line FLM through a contact hole.

The second portion FLML2 of the start signal connection line FLML may be the remaining region of the start signal connection line FLML except for the first portion FLML1. Accordingly, the second portion FLML2 may be disposed in the first-1 wiring island portion WIP11, the first-1 bridge portion BP11, and the first-1 driver island portion DIP11. In this case, the second portion FLML2 may be disposed in a different layer from the first portion FLML1 and disposed on substantially the same layer as the start signal line FLM. That is, referring to FIG. 16, the second portion FLML2 may be disposed on substantially the same layer as the source electrode SE (refer to FIG. 7A) in the main island portion 11 (refer to FIG. 4), and electrically connected to the first portion FLM1 through a contact hole. The second portion FLML2 may be connected to the first portion FLML1 through a contact hole in the first-1 wiring island portion WIP11 and may extend toward the first-1 bridge portion BP11 in the first direction (e.g., x direction).

The second portion FLML2 disposed in the first-1 bridge portion BP11 may have a serpentine shape or an 'S' shape. Because the second portion FLML2 is disposed on substantially the same layer as the source electrode SE (refer to FIG. 7A), the second portion FLML2 may be disposed in the same layer as the first emission control output line EMO1 in the first-1 bridge portion BP11. Accordingly, because two wirings are disposed on substantially the same layer as the source electrode SE (refer to FIG. 7A) in the first-1 bridge portion BP11, the start signal connection line FLML and the first emission control output line EMO1 each may have a maximum width that may be secured by dividing the area.

Although the high-voltage connection line VGHL and the low-voltage connection line VGLL may be disposed in the first-1 bridge portion BP11, the high-voltage connection line VGHL and the low-voltage connection line VGLL may be disposed in a different layer from the first emission control output line EMO1 and the second portion FLML2. Accordingly, the second portion FLML2 may overlap the high-voltage connection line VGHL, and the first emission control output line EMO1 may overlap the low-voltage connection line VGLL.

The second portion FLML2 may extend from the first-1 bridge portion BP11 and be disposed in the first-1 driver island portion DIP11. The second portion FLML2 disposed in the first-1 driver island portion DIP11 may be branched and respectively connected to the first electrostatic discharge prevention circuit ESD1 and the first emission control stage EMST1.

Through the structure of the start signal connection line FLML, a signal of the start signal line FLM disposed in the first-1 wiring island portion WIP11 may be transferred to the first electrostatic discharge prevention circuit ESD1 and the first emission control stage EMST1 disposed in the first-1 driver island portion DIP11.

In addition, the structure of the start signal connection line FLML is not limited to the start signal line FLM, the first electrostatic discharge prevention circuit ESD1, and the first emission control stage EMST1 disposed in the first-1 driver island portion DIP11 and the first-1 wiring island portion WIP11. That is, the start signal line FLM disposed in the second-1 wiring island portion WIP21 (refer to FIG. 12) may also transfer a signal to the second electrostatic discharge prevention circuit ESD2 (refer to FIG. 12) and the first bypass stage GBST1 (refer to FIG. 12) disposed in the second-1 driver island portion DIP21 (refer to FIG. 12) through the start signal connection line FLML. Likewise, the start signal line FLM disposed in the third-1 wiring island portion WIP31 (refer to FIG. 12) may also transfer a signal to the third electrostatic discharge prevention circuit ESD3 (refer to FIG. 12) and the first initialization stage GIST1 (refer to FIG. 12) disposed in the third-1 driver island portion DIP31 (refer to FIG. 12) through the start signal connection line FLML. The start signal line FLM disposed in the fourth-1 wiring island portion WIP41 (refer to FIG. 12) may also transfer a signal to the fourth electrostatic discharge prevention circuit ESD4 (refer to FIG. 12) and the first data-write stage GWST1 (refer to FIG. 12) disposed in the fourth-1 driver island portion DIP41 (refer to FIG. 12) through the start signal connection line FLML.

The display apparatus in another embodiment may efficiently utilize the space of the non-display area NDA (refer to FIG. 3) while securing elongation through the structure of the start signal connection line FLML and the arrangement of the electrostatic discharge prevention circuit ESD (refer to FIG. 12).

Particularly, the start signal line FLM may extend from the wiring island portion WIP (refer to FIG. 12) disposed on the right side of each of the emission control driving circuit EMDC (refer to FIG. 10), the bypass driving circuit GBDC (refer to FIG. 10), the initialization driving circuit GIDC (refer to FIG. 10), and the data-write driving circuit GWDC (refer to FIG. 10), and be electrically connected to the electrostatic discharge prevention circuit ESD (refer to FIG. 12) and the foremost driver stage. The structure of the start signal line FLM may reduce the load of the start signal line FLM compared to the case where the start signal line FLM extends from the outermost portion of the display apparatus and branches to each foremost driver.

In addition, in the case where the start signal connection line FLML is used, a wiring which transfers a signal of the start signal line FLM may be directly connected from the first-1 wiring island portion WIP11 to the first-1 driver island portion DIP11 through the first-1 bridge portion BP11. In other words, because a wiring which transfers a signal of the start signal line FLM uses a minimum length, the load for transferring a signal of the start signal line FLM may be reduced even more. Accordingly, the display apparatus in another embodiment may implement high-quality images by remarkably reducing the load of the wiring.

In an embodiment, the display apparatus in which a damage due to concentration of stress may be prevented and which stretches in various directions may be provided. In addition, the display apparatus in an embodiment may implement excellent quality images by efficiently utilizing a space in the non-display area and reducing the load of the wirings. However, this effect is an example, and the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
a substrate including:
a driver island portion;
a wiring island portion spaced apart from the driver island portion in a first direction; and
a bridge portion which is extended to the driver island portion to the wiring island portion;
a gate driving circuit disposed in the driver island portion;
an electrostatic discharge prevention circuit disposed in the driver island portion; and
a plurality of first input lines arranged in the wiring island portion and extending in a second direction crossing the first direction, the plurality of first input lines including:
a start signal line electrically connected to the electrostatic discharge prevention circuit.

2. The display apparatus of claim 1, wherein the driver island portion and the wiring island portion are alternately arranged in the first direction, and each of the driver island portion and the wiring island portion is successively arranged in the second direction.

3. The display apparatus of claim 2, wherein the driver island portion is provided in plural,
driver island portions include a first driver island portion,
the electrostatic discharge prevention circuit is disposed in the first driver island portion disposed at a forefront end in the second direction among the driver island portions successively arranged in the second direction.

4. The display apparatus of claim 3, wherein the gate driving circuit includes a plurality of stages, wherein a first stage disposed at a forefront end among the plurality of stages is disposed in the first driver island portion.

5. The display apparatus of claim 4, wherein the start signal line is electrically connected to the first stage.

6. The display apparatus of claim 1, wherein the gate driving circuit includes at least one of an emission control driving circuit, a bypass driving circuit, an initialization driving circuit, and a data-write driving circuit.

7. The display apparatus of claim 1, wherein the plurality of first input lines further includes a gate-high voltage line and a gate-low voltage line.

8. The display apparatus of claim 7, further comprising:
a high-voltage connection line disposed in the bridge portion and connected to the gate-high voltage line; and
a low-voltage connection line disposed in the bridge portion and connected to the gate-low voltage line,
wherein the high-voltage connection line is connected to each of the electrostatic discharge prevention circuit and the gate driving circuit, and the low-voltage connection line is connected to each of the electrostatic discharge prevention circuit and the gate driving circuit.

9. The display apparatus of claim 7, further comprising a plurality of second input lines arranged in the driver island portion, wherein the plurality of second input lines include at least one of a clock line, a carry line, and a reset signal line.

10. The display apparatus of claim 7, further comprising:
in the second direction, a first dummy island portion disposed at a front end of the driver island portion; and
a second dummy island portion disposed at a front end of the wiring island portion.

11. The display apparatus of claim 10, wherein the gate-high voltage line and the gate-low voltage line extend along the second direction in the wiring island portion and the second dummy island portion.

12. The display apparatus of claim 10, wherein the start signal line extends from the wiring island portion to the driver island portion through the second dummy island portion and the first dummy island portion.

13. The display apparatus of claim 12, wherein the start signal line disposed in the second dummy island portion is bent from a portion extending in the second direction to extend toward the first dummy island portion in the first direction, and
the start signal line disposed in the first dummy island portion is bent from a portion extending in the first direction to extend toward the driver island portion in the second direction.

14. The display apparatus of claim 12, further comprising:
a first dummy bridge portion connecting the first dummy island portion to the second dummy island portion;
a second dummy bridge portion connecting the driver island portion to the first dummy island portion; and
a third dummy bridge portion connecting the wiring island portion to the second dummy island portion.

15. The display apparatus of claim 14, wherein the bridge portion, the first dummy bridge portion, the second dummy bridge portion, and the third dummy bridge portion have a serpentine shape.

16. The display apparatus of claim 14, wherein the start signal line is disposed in the first dummy bridge portion, the second dummy bridge portion, and the third dummy bridge portion.

17. The display apparatus of claim 12, further comprising:
a first bridge electrode disposed in the second dummy island portion and having two opposite ends connected to the gate-high voltage line; and
a second bridge electrode disposed in the second dummy island portion and having two opposite ends connected to the gate-low voltage line,
wherein each of the first bridge electrode and the second bridge electrode crosses the start signal line and is disposed in a layer different from a layer in which the start signal line is disposed.

18. The display apparatus of claim 7, further comprising a start signal connection line electrically connecting the start signal line to the electrostatic discharge prevention circuit, wherein the start signal connection line extends through the bridge portion.

19. The display apparatus of claim 18, wherein the start signal connection line includes:
a first portion disposed in the wiring island portion and crossing the gate-high voltage line and the gate-low voltage line; and
a second portion disposed in the bridge portion.

20. The display apparatus of claim 19, wherein the start signal line and the first portion are disposed in different layers from each other, and the start signal line and the second portion are disposed on substantially a same layer.

21. The display apparatus of claim 20, wherein the start signal line is electrically connected to the first portion through a first contact hole, and the first portion is electrically connected to the second portion through a second contact hole.

22. The display apparatus of claim 18, further comprising an output line disposed in the bridge portion and connected to the gate driving circuit, wherein the output line and the start signal connection line are disposed on substantially a same layer in the bridge portion.

* * * * *